(12) United States Patent
Zhang et al.

(10) Patent No.: US 10,339,359 B2
(45) Date of Patent: Jul. 2, 2019

(54) DISPLAY PANEL AND DISPLAY DEVICE

(71) Applicant: Shanghai Tianma Micro-Electronics Co., Ltd., Shanghai (CN)

(72) Inventors: Qing Zhang, Shanghai (CN); Yang Zeng, Shanghai (CN); Lihua Wang, Shanghai (CN); Kang Yang, Shanghai (CN); Hong Ding, Shanghai (CN); Lingxiao Du, Shanghai (CN); Liang Xie, Shanghai (CN); Huiping Chai, Shanghai (CN); Qijun Yao, Shanghai (CN)

(73) Assignee: Shanghai Tianma Micro-Electronics Co., Ltd., Shanghai (CN)

(*) Notice: Subject to any disclaimer, the term of this patent is extended or adjusted under 35 U.S.C. 154(b) by 177 days.

(21) Appl. No.: 15/691,239

(22) Filed: Aug. 30, 2017

(65) Prior Publication Data
US 2017/0372113 A1    Dec. 28, 2017

(30) Foreign Application Priority Data

Apr. 27, 2017    (CN) .......................... 2017 1 0289239

(51) Int. Cl.
*G02B 5/30*    (2006.01)
*G06K 9/00*    (2006.01)
(Continued)

(52) U.S. Cl.
CPC .......... *G06K 9/0004* (2013.01); *G02B 5/3025* (2013.01); *G02B 5/3033* (2013.01);
(Continued)

(58) Field of Classification Search
CPC .. G06K 9/0004; G06K 9/2027; G06K 9/2036; H01L 27/3234; H01L 27/3244;
(Continued)

(56) References Cited

U.S. PATENT DOCUMENTS

| 8,749,529 B2 * | 6/2014 | Powell .................. G06F 3/0412 345/173 |
| 2013/0120760 A1 * | 5/2013 | Raguin .................. G01B 11/24 356/612 |

(Continued)

FOREIGN PATENT DOCUMENTS

CN    106339682 A    1/2017

*Primary Examiner* — Utpal D Shah
(74) *Attorney, Agent, or Firm* — Anova Law Group, PLLC

(57) ABSTRACT

A display panel and a display device thereof are provided. The display panel comprises a display module comprising a first substrate and a first polarizer, wherein a light-exiting surface of the display module is arranged on an outer side of the first polarizer; a fingerprint recognition module disposed on an outer side of the first substrate and comprising a fingerprint recognition layer and a second polarizer disposed on an inner side of the fingerprint recognition layer; and a light source disposed on an inner side of the first polarizer. The fingerprint recognition layer recognizes fingerprint based on fingerprint signal light. The first polarizer is engaged with the second polarizer, such that the fingerprint signal light is transmitted through the first polarizer and the second polarizer without a light intensity loss, and the second polarizer reduces the light intensity of fingerprint noise light.

20 Claims, 46 Drawing Sheets

(51) Int. Cl.
- *G06K 9/20* (2006.01)
- *H01L 27/32* (2006.01)
- *G09G 3/3225* (2016.01)
- *G09G 3/34* (2006.01)
- *H01L 51/00* (2006.01)
- *H01L 51/52* (2006.01)
- *G09G 3/3233* (2016.01)
- *G02B 27/28* (2006.01)

(52) U.S. Cl.
CPC ......... *G06K 9/2027* (2013.01); *G06K 9/2036* (2013.01); *G09G 3/3225* (2013.01); *G09G 3/3233* (2013.01); *G09G 3/3406* (2013.01); *H01L 27/3234* (2013.01); *H01L 27/3244* (2013.01); *H01L 27/3246* (2013.01); *H01L 51/0097* (2013.01); *H01L 51/5253* (2013.01); *H01L 51/5268* (2013.01); *H01L 51/5281* (2013.01); *G02B 27/281* (2013.01); *G09G 2300/0861* (2013.01); *G09G 2310/0251* (2013.01); *G09G 2310/0262* (2013.01); *G09G 2354/00* (2013.01); *H01L 2251/5315* (2013.01); *H01L 2251/5338* (2013.01)

(58) Field of Classification Search
CPC .. H01L 27/3246; G02B 5/3025; G02B 5/3033
See application file for complete search history.

(56) References Cited

U.S. PATENT DOCUMENTS

| | | | |
|---|---|---|---|
| 2017/0147850 A1* | 5/2017 | Liu | G06K 9/0002 |
| 2018/0165496 A1* | 6/2018 | Cheng | G09F 9/00 |
| 2018/0314096 A1* | 11/2018 | Yang | G02F 1/13338 |
| 2018/0357462 A1* | 12/2018 | Mackey | G06K 9/4661 |
| 2019/0026523 A1* | 1/2019 | Shen | G06K 9/0004 |

* cited by examiner

DISPLAY PANEL AND DISPLAY DEVICE

CROSS-REFERENCES TO RELATED APPLICATIONS

This application claims the priority of Chinese Patent Application No. CN201710289239.9, filed on Apr. 27, 2017, the entire contents of which are incorporated herein by reference.

FIELD OF THE DISCLOSURE

The present disclosure generally relates to the display technology and, more particularly, relates to a display panel and a display device thereof.

BACKGROUND

A fingerprint is a mark made by the pattern of ridges on the pad of a human finger, which is innate and unique for everyone. With the development of science and technology, a variety of display devices with a fingerprint recognition function are emerging on the market, such as mobile phones, tablets and smart wearable devices, etc. To operate a display device with the fingerprint recognition function, a user can verify the permission only by touching the fingerprint recognition sensor of the display device, thereby simplifying the permission verification.

In an existing display device with the fingerprint recognition function, the fingerprint recognition sensor is often provided in a non-display region of the display panel or on a surface opposite to the light exiting side of the display device. In such an existing display device, the user has to specifically touch the fingerprint recognition sensor to verify the permission, degrading the user experience. In addition, when the fingerprint recognition sensor is disposed in the non-display region of the display panel, the screen-to-body ratio of the display panel is reduced, which is not in line with the development trend of narrow borders in the display panel.

Given the gate, source and drain electrodes of the thin-film-transistor (TFT) in the pixel circuit which is arranged in the display region of the display panel are often made of metal, when the fingerprint recognition sensor is directly disposed in the display region of the display panel, light emitted from the light source of the fingerprint recognition sensor may be directly reflected by the gate, source and drain electrodes of the TFT, and then incident onto the fingerprint recognition sensor, generating noises and degrading the accuracy of the fingerprint recognition sensor. In addition, the light that is leaked from the organic light-emitting layer of the display panel may also be incident onto the fingerprint recognition sensor, generating noises and degrading the accuracy of the fingerprint recognition sensor.

The disclosed display panel and display device thereof are directed to solve one or more problems set forth above and other problems.

BRIEF SUMMARY OF THE DISCLOSURE

One aspect of the present disclosure provides a display panel. The display panel comprises a display module comprising a first substrate and a first polarizer disposed on the first substrate, wherein the first substrate has an inner side facing the first polarizer and an opposite outer side, the first polarizer has an inner side facing the first substrate and an opposite outer side, and a light-exiting surface of the display module is arranged on the outer side of the first polarizer; a fingerprint recognition module disposed on the outer side of the first substrate and comprising a fingerprint recognition layer and a second polarizer, wherein the fingerprint recognition layer has an inner side facing the display module and an opposite outer side, and the second polarizer is disposed on the inner side of the fingerprint recognition layer; and a light source disposed on the inner side of the first polarizer. The fingerprint recognition layer is configured to recognize fingerprint based on fingerprint signal light, the fingerprint signal light being light emitted from the light source and then reflected to the fingerprint recognition layer by a touch object, the first polarizer is engaged with the second polarizer, such that the fingerprint signal light is transmitted through the first polarizer and the second polarizer without a light intensity loss, and the second polarizer is configured to reduce the light intensity of fingerprint noise light, the fingerprint noise light being light other than the fingerprint signal light.

Another aspect of the present disclosure provides a display device comprising a display panel. The display panel comprises a display module comprising a first substrate and a first polarizer disposed on the first substrate, wherein the first substrate has an inner side facing the first polarizer and an opposite outer side, the first polarizer has an inner side facing the first substrate and an opposite outer side, and a light-exiting surface of the display module is arranged on the outer side of the first polarizer; a fingerprint recognition module disposed on the outer side of the first substrate and comprising a fingerprint recognition layer and a second polarizer, wherein the fingerprint recognition layer has an inner side facing the display module and an opposite outer side, and the second polarizer is disposed on the inner side of the fingerprint recognition layer; and a light source disposed on the inner side of the first polarizer. The fingerprint recognition layer is configured to recognize fingerprint based on fingerprint signal light, the fingerprint signal light being light emitted from the light source and then reflected to the fingerprint recognition layer by a touch object, the first polarizer is engaged with the second polarizer, such that the fingerprint signal light is transmitted through the first polarizer and the second polarizer without a light intensity loss, and the second polarizer is configured to reduce the light intensity of fingerprint noise light, the fingerprint noise light being light other than the fingerprint signal light.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
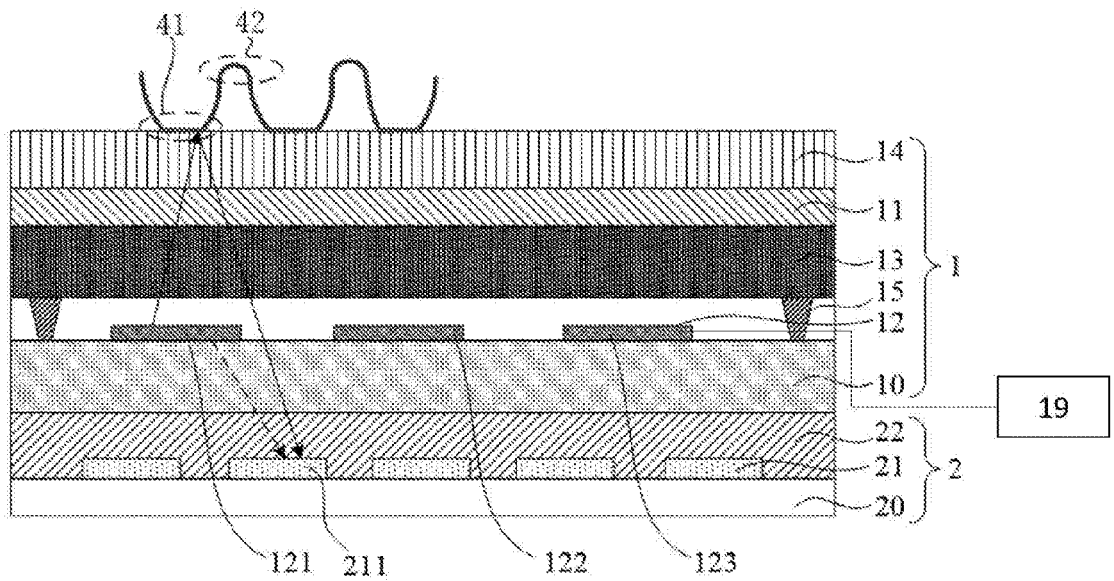
FIG. 1 illustrates a schematic cross-sectional view of an exemplary display panel consistent with disclosed embodiments.

Reference will now be made in detail to exemplary embodiments of the disclosure, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure. Further, in the present disclosure, the disclosed embodiments and the features of the disclosed embodiments may be combined under conditions without conflicts.

As discussed in the background, a fingerprint is a mark made by the pattern of ridges on the pad of a human finger, which is innate and unique for everyone. Thus, we can put a person with his fingerprints, by comparing his fingerprints and pre-stored fingerprint data to verify his true identity, which is called as fingerprint recognition technology. The analysis of fingerprints for matching purposes generally requires the comparison of several features of the print pattern. These include patterns, which are aggregate characteristics of ridges, and minutia points, which are unique features found within the patterns.

Thanks to the electronic integration manufacturing technology, as well as the reliable algorithm research, optical fingerprint recognition technology is emerging in our daily life, which has been the most deeply-researched, the most widely used, and the most mature technology in biological detection technology. The principle of optical fingerprint recognition technology is explained as follows. The light source in the display panel emits light to a user finger, and the light reflected by the user finger is incident onto a fingerprint sensor, and corresponding light signals are collected by the fingerprint sensor. Due to the specific lines on the fingerprint, the light reflected at different positions of the user finger has different light intensity, and then the fingerprint sensor collects different light signals, according to which the user's true identity is determined.

The present disclosure provides an improved display panel and display device, which is able to reduce the noise signal in the fingerprint recognition module, and improve the accuracy of the fingerprint recognition.

The display panel comprises:

a display module comprising a first substrate and a first polarizer disposed on the first substrate, wherein the first substrate has an inner side facing the first polarizer and an opposite outer side, the first polarizer has an inner side facing the first substrate and an opposite outer side, and a light-exiting surface of the display module is arranged on the outer side of the first polarizer;

a fingerprint recognition module disposed on the outer side of the first substrate and comprising a fingerprint recognition layer and a second polarizer, wherein the fingerprint recognition layer has an inner side facing the display module and an opposite outer side, and the second polarizer is disposed on the inner side of the fingerprint recognition layer; and a light source disposed on the inner side of the first polarizer, wherein the fingerprint recognition layer is configured to recognize fingerprint based on fingerprint signal light, the fingerprint signal light being light emitted from the light source and then reflected to the fingerprint recognition layer by a touch object, the first polarizer is engaged with the second polarizer, such that the fingerprint signal light is transmitted through the first polarizer and the second polarizer without a light intensity loss, and the second polarizer is configured to reduce the light intensity of fingerprint noise light, the fingerprint noise light being light other than the fingerprint signal light.

In the disclosed embodiments, the light-exiting surface of the display module is disposed on the outer side of the first polarizer, the fingerprint recognition module is disposed on the outer side of the first substrate, the fingerprint recognition module comprises the fingerprint recognition layer and the second polarizer disposed on the inner side of the fingerprint recognition layer. At the fingerprint recognition stage, the light emitted from the inner side of the first polarizer is reflected by the touch object (such as a user finger) to form the fingerprint signa light, during which the first polarizer is engaged with the second polarizer, such that the fingerprint signal light is transmitted through the first polarizer and the second polarizer without a light intensity loss.

Meanwhile, before the light (i.e., the fingerprint noise light) which is not reflected by the touch object is incident onto the fingerprint recognition layer, the second polarizer at least reduces the light intensity of the fingerprint noise light. Thus, the crosstalk caused by the fingerprint noise may be suppressed, the signal-to-noise ratio may be improved, and the accuracy of the fingerprint recognition module may be improved.

In one embodiment, the light source may be an existing light source in the display panel, such that the thickness of the display panel may not be increased, the fabrication process may be simplified, and the fabrication cost may be reduced. In another embodiment, the fingerprint recognition module has an inner side facing the display module and an opposite outer side, and an external source may be disposed on the outer side of the fingerprint recognition module and configured as the light source. Thus, the position of the light source (for example, the distance between the light source and the fingerprint recognition layer) may be adjusted, and the light source with the desired lighting properties may be selected (for example, a highly collimated light source may be selected to reduce the interference between the fingerprint signal light). The light source is not limited by the present disclosure, as long as the light source is disposed on the inner side of the first polarizer and the fingerprint recognition module can detect the fingerprint signal light.

The fingerprint noise light may include part of the light leaked out from the light source of the display module to the fingerprint recognition module, and/or the light emitted from the external light source and then reflected by the metals (e.g., gate, source, drain electrodes of a thin-film-transistors) in the display module.

For the part of the light leaked out from the light source of the display module to the fingerprint recognition module, the second polarizer may be configured to be a linear polarizer or a circular polarizer, which is able to reduce the light intensity of the fingerprint noise light by half. For the light emitted from the external light source and then reflected by the metals (e.g., gate, source, drain electrodes of a thin-film-transistors) in the display module, the second polarizer may be configured to be a circular polarizer, which is able to completely eliminate the fingerprint noise light.

In one embodiment, when second polarizer is a linear polarizer, the first polarizer may be configured to have the same polarization direction as the second polarizer, such that the fingerprint signal light is transmitted through the first polarizer and the second polarizer without a light intensity loss. In another embodiment, when second polarizer is a circular polarizer, the first polarizer may be configured to be a circular polarizer which is engaged with the second polarizer, such that the fingerprint signal light is transmitted through the first polarizer and the second polarizer without a light intensity loss.

FIG. 1 illustrates a schematic cross-sectional view of an exemplary display panel consistent with disclosed embodiments. As shown in FIG. 1, the display panel may comprise a display module 1 and a fingerprint recognition module 2. The display module 1 may comprise a first substrate 10 and a first polarizer 11 disposed on the first substrate 10. The first polarizer 11 may have an inner side facing the first substrate 10 and an opposite outer side. The light-exiting surface of the display module 1 may be disposed on the outer side of the first polarizer 11.

The first substrate 10 may have an inner side facing the first polarizer 11 and an opposite outer side. The fingerprint recognition module 2 may be disposed on the outer side of the first substrate 10. The fingerprint recognition module 2 may comprise a fingerprint recognition layer 21 and a second polarizer 22. The fingerprint recognition layer 21 may have an inner side facing the display module 1 and an opposite outer side, and the second polarizer 22 may disposed on the inner side of the fingerprint recognition layer 21. The fingerprint recognition layer 21 may be configured to identify the fingerprint based on fingerprint signal light, which is emitted from a light source and then reflected to the fingerprint recognition layer 21 by a touch object.

The display module 1 may further comprise an organic light-emitting layer 12 disposed between the first substrate 10 and the first polarizer 11 for generating light for displaying an image. The display module 1 may also comprise any other appropriate components, which is not limited by the present disclosure.

In one embodiment, the organic light-emitting layer 12 may comprise a plurality of organic light-emitting units. For example, as shown in FIG. 1, the organic light-emitting layer 12 may comprise a red organic light-emitting unit 121, a green organic light-emitting unit 122, and a blue organic light-emitting unit 123. The fingerprint recognition layer 21 may comprise a plurality of fingerprint recognition units 211.

In one embodiment, the organic light-emitting layer 12 may be multiplexed as the light source for fingerprint recognition. For example, a plurality of organic light-emitting units and a plurality of fingerprint recognition units may be arranged in an array, respectively. The plurality of organic light-emitting units may be arranged in correspondence with the plurality of fingerprint recognition units. When the organic light-emitting unit is multiplexed as the light source, the light emitted from one organic light-emitting unit may be received by one or more fingerprint recognition units corresponding to the organic light-emitting unit.

In one embodiment, the display panel may include a display region, where the organic light-emitting unit and the fingerprint recognition unit are disposed. Thus, the fingerprint recognition may be realized in the display region of the display panel.

Referring to FIG. 1, the light emitted from the organic light-emitting layer 12 may be incident onto the touch object, which is often a user finger. The fingerprint is composed of a series of ridges 41 and valleys 42 disposed on the skin surface of the fingertip. The light, which is received by the fingerprint recognition unit 42 after being respectively reflected by the ridges 41 and the valley 42, may be different in light intensity. Then the current signals converted from the light intensity of the light respectively reflected by the ridges 41 and the valley 42 may be different in magnitude, based on which fingerprint may be recognized.

It should be noted that, the touch object may also be a palm, and the fingerprint recognition unit may realize the detection and recognition functions based on the palmprint.

When the organic light-emitting layer 12 functions as a light source for both image display and fingerprint recognition, the organic light-emitting layer 12 has to emit light at both the display stage and the fingerprint recognition stage. In one embodiment, at the display stage, all the organic light-emitting units in the organic light-emitting layer may be provided with a driving signal for light emission, while at the fingerprint recognition stage, a part of the organic light-emitting units in the organic light-emitting layer may be provided with a driving signal for light emission. Accordingly, the display module 1 may further include a first display driving circuit 19, which may output a driving signal for driving at least one of the organic light-emitting units to emit light at the fingerprint recognition stage, thereby providing a light source to the fingerprint recognition module 2.

Because the light emitted by the blue organic light-emitting unit often has short wavelength while respective layers (e.g., organic insulating layers, inorganic insulating layers, polarizers, etc.) in the display panel strongly absorb the light of short wavelength, the light emitted by the blue organic light-emitting unit has lower light transmittance and is easily to be absorbed by the display panel. In addition, the material of the light-emitting functional layer of the blue organic light-emitting unit may have a shorter lifetime than the materials of the light-emitting function layer in the red organic light-emitting unit and green organic light-emitting unit. Thus, at the fingerprint recognition stage, the first display driving circuit 19 may output a driving signal for driving at least one of the red organic light-emitting unit and the green organic light-emitting unit to emit light.

In one embodiment, the display panel may include a touch function layer, where the structure and the position of the touch function layer are not limited by the present disclosure as long as the touch position on the screen can be detected. When the finger touch position on the screen is detected, during the fingerprint recognition stage, the first display driving circuit 19 may output a driving signal to drive the organic light-emitting units in the region corresponding to the finger touch position to emit light.

In one embodiment, the first polarizer 11 may comprise a first linear polarizer, and the second polarizer 22 may comprise a second linear polarizer. The first and second polarizers may have the same polarization direction, i.e., the optical axes of the first and second polarizers may be arranged in the same direction.

Referring to FIG. 1, the solid arrows indicate the light emitted from the organic light-emitting layer 12 toward the light exiting surface and the light reflected by the touch object to form the fingerprint signal light. The dashed arrow indicates the light that is leaked out from the organic light-emitting layer 12 to the fingerprint recognition module 2

On one hand, the light emitted from the organic light-emitting layer, such as the red organic light-emitting unit 121 in FIG. 1, may be converted into linearly polarized light by the first polarizer 11. After being incident onto and reflected by the touch object, the reflected light which is the fingerprint signal light may still be linearly polarized light, and the polarization direction is not changed. The fingerprint signal light may be transmitted through the first polarizer 11 without a light loss. Because the first and second polarizers have the same polarization direction, the fingerprint signal light may also be transmitted through the second polarizer 22 without a light loss, and then incident onto the fingerprint recognition unit 211

On the other hand, the light leaked out from the red organic light-emitting unit 121 is substantially uniform in the respective polarization directions. After being transmitted through the second polarizer 22, the transmitted light has only one polarization direction, and the light intensity thereof is approximately reduced by half. Thus, when upon being incident onto the fingerprint recognition unit 211, the light leaked out from the organic light-emitting unit may have significantly reduced light intensity.

In summary, the light intensity of the fingerprint noise light is relatively reduced while the light intensity of the fingerprint light is substantially the same. Thus, the signal-to-noise ratio of the fingerprint recognition module 2 may be improved, thereby improving the accuracy of the fingerprint recognition module 2.

In one embodiment, the display panel may be a rigid display panel. For example, as shown in FIG. 1, the first substrate 10 may be a first glass substrate. The display module 1 may further include a second glass substrate 13, and the organic light-emitting layer 12 may be disposed between the first glass substrate 10 and the second glass substrate 13. The first glass substrate 10 and the second glass substrate 13 may be supported by spacers 15, and an air gap may be formed between the first glass substrate 10 and the second glass substrate 13. In certain embodiments, the thickness of the air gap may be approximately 4 μm.

The display panel may also include a cover glass or cover lens 14. The first polarizer 11 may have an inner side facing the organic light-emitting layer 12 and an opposite outer side. The cover glass 14 may be attached to the outer side of the first polarizer 11 by liquid optical clear adhesive (LOCA). In certain embodiments, the thickness of the display module 1 may be approximately 1410 μm.

Further, the fingerprint recognition module 2 may further include a second substrate 20 having an inner side facing the display module 1 and an opposite outer side. The fingerprint recognition layer 21 may be disposed on the inner side of the second substrate 20. That is, the fingerprint recognition layer 21 may be directly fabricated on the inner side of the second substrate 20, simplifying the arrangement of the fingerprint recognition layer 21. Meanwhile, the second substrate 20 may also protect the fingerprint recognition layer 21. In addition, the second polarizer 22 may be attached to the first substrate 10 through a liquid optical clear adhesive (LOCA) (not drawn in FIG. 1), through which the display module 1 and the fingerprint recognition module 2 may be attached to each other to form the display panel.

In one embodiment, the first polarizer 11 may include a first quarter-wave plate and a third linear polarizer stacked together. The third linear polarizer may have an inner side facing the organic light-emitting layer 12 and an opposite outer side, and the first quarter-wave plate may be disposed on the inner side of the third linear polarizer. The second polarizer 22 may include a second quarter-wave plate and a fourth linear polarizer stacked together. The fourth linear polarizer may have an inner side facing the organic light-emitting layer 12 and an opposite outer side, and the second quarter-wave plate may be disposed on the inner side of the fourth linear polarizer. The first quarter-wave plate and the second quarter-wave plate may have the same material and the same thickness.

In the disclosed embodiments, when facing the propagation direction of the light, counterclockwise is defined as the positive direction.

In one embodiment, the angle from the optical axis of the first quarter-wave plate to the polarization direction of the third linear polarizer may be configured to be approximately 45°. The angle from the optical axis of the second quarter-wave plate to the polarization direction of the fourth linear polarizer may be configured to be approximately −45°. In another embodiment, the angle from the optical axis of the first quarter-wave plate to the polarization direction of the third linear polarizer may be configured to be approximately −45°. The angle from the optical axis of the second quarter-wave plate to the polarization direction of the fourth linear polarizer may be configured to be approximately 45°. Thus, the formed first polarizer and second polarizer may both be circular polarizers.

Figure 2A:
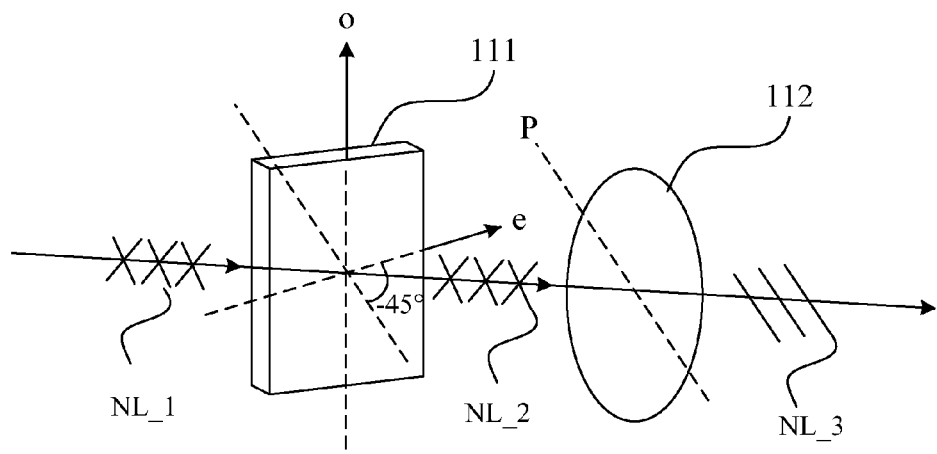
FIG. 2a illustrates an exemplary optical path before light emitted from an organic light-emitting layer is reflected by a touch object consistent with disclosed embodiments.
Figure 2B:
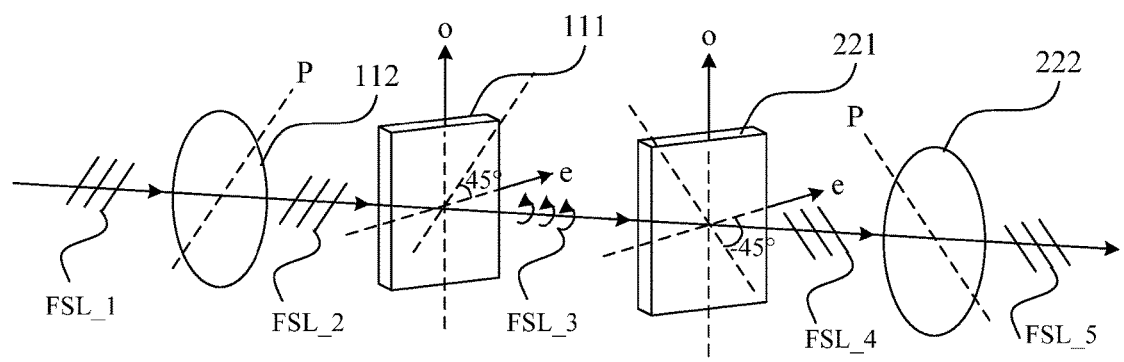
FIG. 2b illustrates an exemplary optical path after light emitted from an organic light-emitting layer is reflected by a touch object consistent with disclosed embodiments.

FIG. 2a illustrates an exemplary optical path before light emitted from an organic light-emitting layer is reflected by a touch object consistent with disclosed embodiments. FIG. 2b illustrates an exemplary optical path after light emitted from an organic light-emitting layer is reflected by a touch object consistent with disclosed embodiments;

In FIG. 2a and FIG. 2b, counterclockwise is defined as the positive direction when facing the propagation direction of the light. As shown in FIG. 1, the light before and after being reflected by the touch object have different propagation directions.

The first quarter-wave plate and the second quarter-wave plate may both be calcite, and the e-axis of the first quarter-wave plate and the e-axis of the second quarter-wave plate are defined as the optical axis, respectively.

Referring to FIG. 1 and FIG. 2a, at the fingerprint recognition stage and before the light is reflected by the touch object, the angle from the e-axis of the first quarter-wave 111 plate to the polarization direction P of the third linear polarizer 112 may be configured to be approximately −45°. The natural light NL_1 emitted from the organic light-emitting layer 12 may pass through the first quarter-wave plate 111 and become natural light NL_2 which is substantially remain the same as the natural light NL_1. The NL_2 may pass through the third linear polarizer 112 to be converted into linearly polarized light NL_3 having the same polarization direction P as the third linear polarizer 112. That is, the polarization direction of the converted linearly polarized light NL_3 may be in the second and fourth quadrants.

Referring to FIG. 2b, the linearly polarized light NL_3 in FIG. 2a may be reflected by the touch body to form the fingerprint signal light FSL_1 in FIG. 2b, which is still linearly polarized light with substantially the same polarization direction (i.e., polarization direction P). However, after the linearly polarized light NL_3 in FIG. 2a is reflected by the touch body, when facing the propagation direction of the fingerprint signal light, the angle from the e-axis of the first quarter-wave plate 111 to the polarization direction P of the third linear polarizer 112 now becomes 45°, and the polarization direction of the fingerprint signal light is in the first and third quadrants, as shown in FIG. 2b.

The fingerprint signal light FSL_1 may be transmitted through the third linear polarizer 112 to become the fingerprint signal light FSL_2 having substantially the same polarization state and the light intensity. The fingerprint signal light FSL_2 may be transmitted through the first quarter-wave plate 111 to become left-handed circular polarized light FSL_3 having substantially the same light intensity.

Then the left-handed circular polarized light FSL_3 may be transmitted through the second quarter-wave plate 221 to become linearly polarized light FSL_4 with a polarization direction in the second and fourth quadrants and substantially the same light intensity. Finally, the linearly polarized light FSL_4 may pass through the fourth linear polarizer 222 having the same polarization direction as the FSL_4 to become linearly polarized light FSL_5 with substantially the same light intensity.

Figure 3:
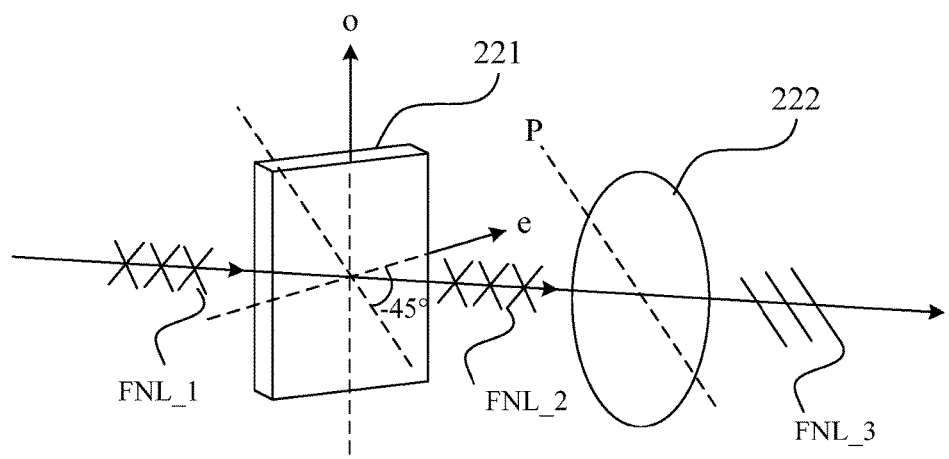
FIG. 3 illustrates an exemplary optical path of fingerprint noise light emitted from an organic light-emitting layer consistent with disclosed embodiments.

FIG. 3 illustrates an exemplary optical path of fingerprint noise light emitted from an organic light-emitting layer consistent with disclosed embodiments. The fingerprint noise light FNL_1 emitted from the organic light-emitting layer may be directly incident onto the second polarizer. When facing the propagation direction of the fingerprint noise light, the angle from the e-axis of the second quarter-wave plate 221 to the polarization direction of the fourth linear polarizer 222 may be configured to be approximately −45°. The polarization direction of the fourth linear polarizer 222 is in the second and fourth quadrants.

The fingerprint noise light FNL_1 may be transmitted through the second quarter-wave plate 221 to become fingerprint noise light FNL_2 which is still natural light. The fingerprint noise light FNL_2 may pass through the fourth linear polarizer 222 to become linear polarized light FNL_3 having a same polarization direction as the fourth linear polarizer 222, and the light intensity of FNL_3 is reduced to half. Thus, the second polarizer 222 may reduce the light intensity of the fingerprint noise light, thereby improving the signal-to-noise ratio of fingerprint recognition.

Figure 4:
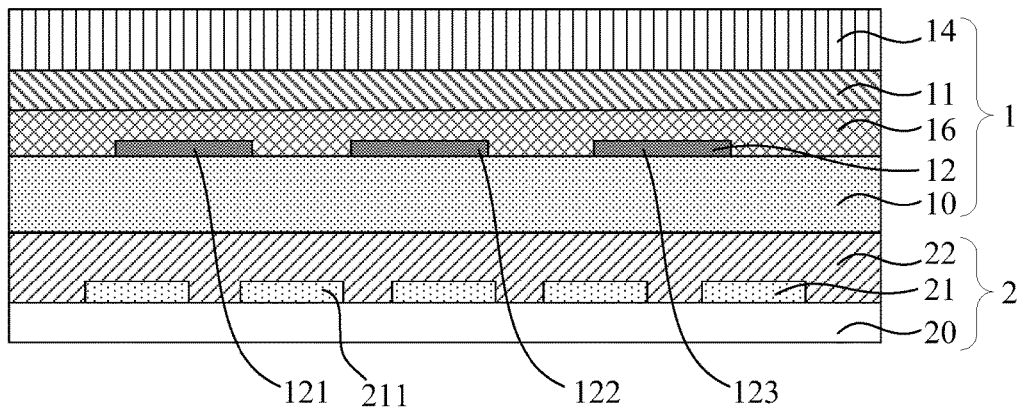
FIG. 4 illustrates a schematic cross-sectional view of another exemplary display panel consistent with disclosed embodiments.

FIG. 4 illustrates a schematic cross-sectional view of another exemplary display panel consistent with disclosed embodiments. The similarities between FIG. 1 and FIG. 4 are not repeated here, while certain difference may be explained.

As shown in FIG. 4, the display panel may be a flexible display panel. For example, the first substrate 10 may be a flexible substrate. The display module 1 may further comprises a thin film encapsulation layer 16, which replaces the second glass substrate 13 in FIG. 1. The thin film encapsulation layer 16 may cover the organic light-emitting layer 12.

Figure 5:
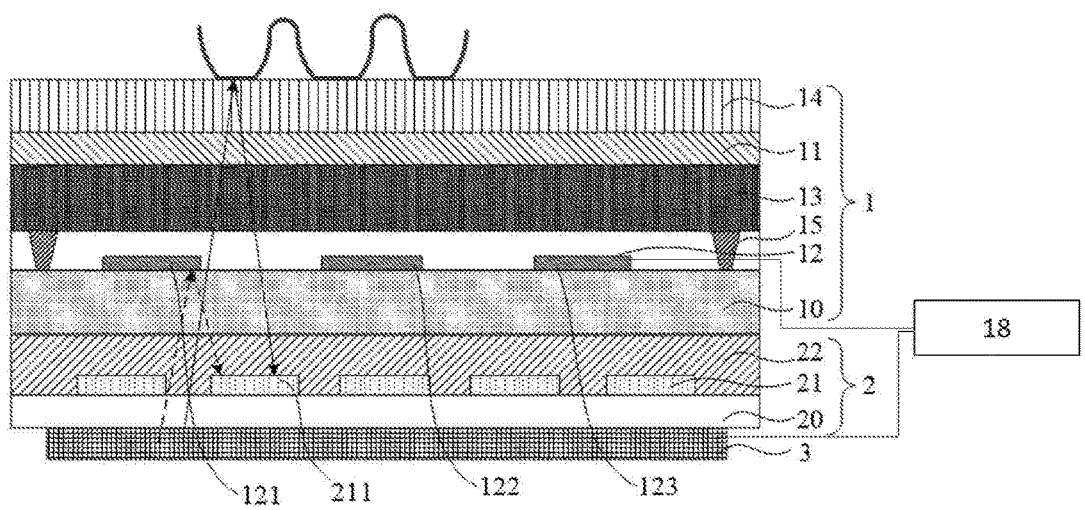
FIG. 5 illustrates a schematic cross-sectional view of another exemplary display panel consistent with disclosed embodiments.

FIG. 5 illustrates a schematic cross-sectional view of another exemplary display panel consistent with disclosed embodiments. The similarities between FIG. 1 and FIG. 5 are not repeated here, while certain difference may be explained.

As shown in FIG. 5a, the display panel may comprise a display module 1, a fingerprint recognition module 2, and a backlight source 3. The display module 1 may comprise a first substrate 10, a first polarizer 11 disposed on the first substrate 10, and an organic light-emitting layer 12 disposed between the first substrate 10 and the first polarizer 11 for displaying images. The first polarizer 11 may have an inner side facing the first substrate 10 and an opposite outer side. The light-exiting surface of the display module 1 may be disposed on the outer side of the first polarizer 11.

The first substrate 10 may have an inner side facing the first polarizer 11 and an opposite outer side. The fingerprint recognition module 2 may be disposed on the outer side of the first substrate 10. The fingerprint recognition module 2 may comprise a fingerprint recognition layer 21 and a second polarizer 22. The fingerprint recognition layer 21 may have an inner side facing the display module 1 and an opposite outer side, and the second polarizer 22 may disposed on the inner side of the fingerprint recognition layer 21. The fingerprint recognition layer 21 may be configured to identify the fingerprint based on the fingerprint signal light, which is emitted from a light source and then reflected to the fingerprint recognition layer 21 by a touch object.

The fingerprint recognition module 2 may have an inner side facing the display module 1 and an opposite outer side. The backlight source 3 may be disposed on the outer side of the fingerprint recognition module 2. The backlight source 3 may be configured to be a light source for the fingerprint recognition module 2.

In one embodiment, the organic light-emitting layer 12 may comprise a plurality of organic light-emitting units. For example, as shown in FIG. 5, the organic light-emitting layer 12 may comprise a red organic light-emitting unit 121, a green organic light-emitting unit 122, and a blue organic light-emitting unit 123. The fingerprint recognition layer 21 may comprise a plurality of fingerprint recognition units 211.

In one embodiment, the display panel may include a display region and a non-display region surrounding the display region, and the organic light-emitting unit and the fingerprint recognition unit may be disposed in the display region. Thus, the fingerprint recognition may be realized in the display region of the display panel.

The organic light-emitting layer 12 may emit light for displaying images, while the backlight source 3 may be configured as a light source for the fingerprint recognition module 2. That is, at the display stage, the backlight source 3 may not emit light while the organic light-emitting layer 12 may emit light, such that the image display may not be affected. At the fingerprint recognition stage, the organic light-emitting layer 12 may not emit light while the backlight source 3 may emit light, such that the interference on the fingerprint recognition, which is caused by the light leaked out from the organic light-emitting layer 12 as well as the light reflected by the touch object to the fingerprint recognition unit 121, may be suppressed.

Accordingly, the display module 1 in FIG. 5 may further comprise a second display driving circuit 18, which may not output a display driving signal for driving the organic light-emitting layer to emit light at the fingerprint recognition stage, and not output a detection driving signal for driving the backlight source to emit light at the display stage.

In one embodiment, the first polarizer 11 may include a first quarter-wave plate and a third linear polarizer stacked together. The third linear polarizer may have an inner side facing the organic light-emitting layer 12 and an opposite outer side, and the first quarter-wave plate may be disposed on the inner side of the third linear polarizer. The second polarizer 22 may include a second quarter-wave plate and a fourth linear polarizer stacked together. The fourth linear polarizer may have an inner side facing the organic light-emitting layer 12 and an opposite outer side, and the second quarter-wave plate may be disposed on the inner side of the fourth linear polarizer. The first quarter-wave plate and the second quarter-wave plate may have the same material and the same thickness.

Counterclockwise is defined as the positive direction when facing the propagation direction of the fingerprint signal light. In one embodiment, the angle from the optical axis of the first quarter-wave plate to the polarization direction of the third linear polarizer may be configured to be approximately 45°. The angle from the optical axis of the second quarter-wave plate to the polarization direction of the fourth linear polarizer may be configured to be approximately −45°. In another embodiment, the angle from the optical axis of the first quarter-wave plate to the polarization direction of the third linear polarizer may be configured to be approximately −45°. The angle from the optical axis of the second quarter-wave plate to the polarization direction of the fourth linear polarizer may be configured to be approximately 45°. Thus, the formed first polarizer and second polarizer may both be circular polarizers.

Figure 6A:
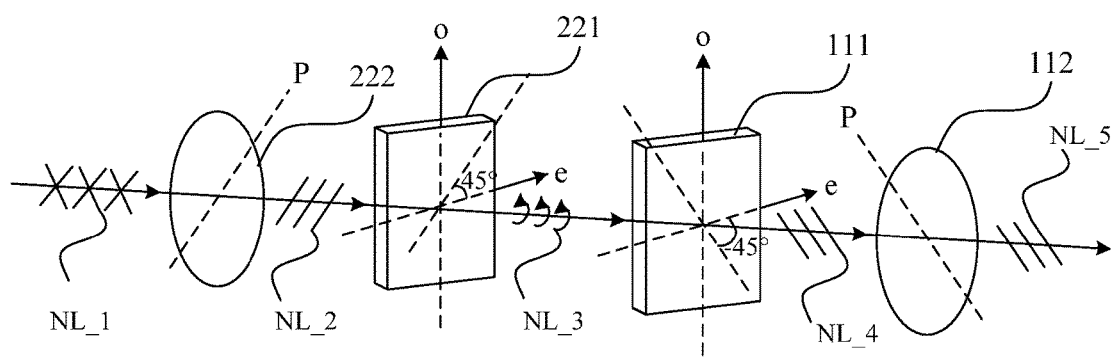
FIG. 6a illustrates another exemplary optical path before light emitted from a backlight source is reflected by a touch object consistent with disclosed embodiments.
Figure 6B:
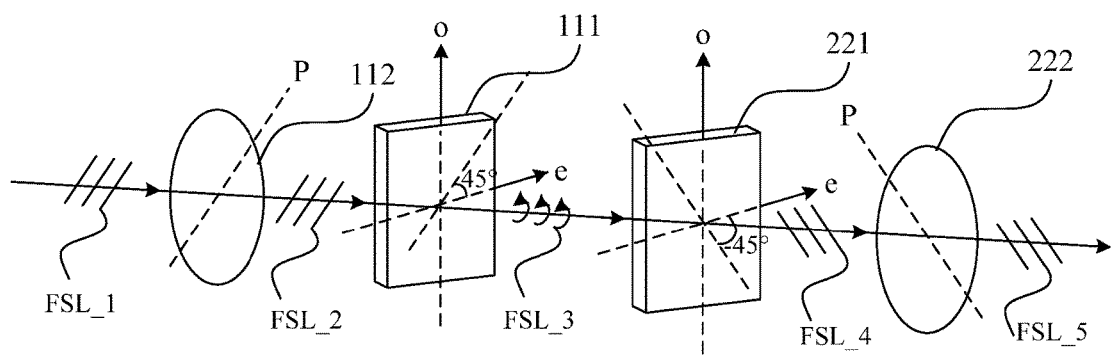
FIG. 6b illustrates another exemplary optical path after light emitted from a backlight source is reflected by a touch object consistent with disclosed embodiments.

FIG. 6a illustrates another exemplary optical path before light emitted from a light source is reflected by a touch object consistent with disclosed embodiments. FIG. 6b illustrates another exemplary optical path after light emitted from a light source is reflected by a touch object consistent with disclosed embodiments.

In FIG. 6a and FIG. 6b, counterclockwise is defined as the positive direction when facing the propagation direction of the fingerprint signal light. The first quarter-wave plate and the second quarter-wave plate may both be calcite, and the e-axis of the first quarter-wave plate and the e-axis of the second quarter-wave plate is defined as the optical axis, respectively.

Referring to FIG. 5, the light before and after being reflected by the touch object have different propagation directions. The solid arrows indicate the light emitted from the backlight source 3 toward the light exiting surface, as well as, the light reflected by the touch object to form the fingerprint signal light. The dashed arrow indicates the light that is leaked out from the backlight source 3 to the fingerprint recognition module 2

Referring to FIG. 5 and FIG. 6a, at the fingerprint recognition stage and before the light emitted from the backlight source 3 is reflected by the touch object, the angle from the e-axis of the first quarter-wave plate 111 to the polarization direction P of the third linear polarizer 112 may be configured to be approximately −45°. The angle from the e-axis of the second quarter-wave plate 221 to the polarization direction P of the fourth linear polarizer 222 may be configured to be approximately 45°.

The natural light NL_1 emitted from the backlight source 3 may pass through the fourth linear polarizer 222, and become linearly polarized light NL_2 with a polarization direction in the first and third quadrants. The linearly polarized light NL_2 with the polarization direction in the first and third quadrants may pass through the second quarter-wave plate 221, and become left-handed circular polarized light NL_3. The left-handed circular polarized light NL_3 may pass through the first quarter-wave plate 111, and become linearly polarized light NL_4 with a polarization direction in the second and fourth quadrants, which is the same as the polarization direction P of the third linear polarizer 112. Finally, the linearly polarized light NL_4 with the polarization direction in the second and fourth quadrants may pass through the third linear polarizer 112 to become linearly polarized light NL_5 without a polarization direction change, i.e., the linearly polarized light NL_5 with the same polarization as the third linear polarizer 112 may be incident onto the touch object.

Referring to FIG. 5 and FIG. 6b, at the fingerprint recognition stage and after the light emitted from the backlight source 3 is reflected by the touch object, now the angle from the e-axis of the first quarter-wave plate 111 to the polarization direction P of the third linear polarizer 112 may be configured to be approximately 45°. The angle from the e-axis of the second quarter-wave plate 221 to the polarization direction P of the fourth linear polarizer 222 may be configured to be approximately −45°.

As discussed in FIG. 6a, the linearly polarized light NL_5 in FIG. 6a may be incident onto the touch object. The linearly polarized light NL_5 may be reflected by the touch object to become the linearly polarized fingerprint signal light FSL_1 in FIG. 6b without a polarization direction change. Facing the prorogation direction of the fingerprint signal light FSL_1, the polarization direction of the linearly polarized fingerprint signal light FSL_1 may be in the first and third quadrants. The linearly polarized fingerprint signal light FSL_1 may pass through the third linear polarizer 112 and become the linearly polarized fingerprint signal light FSL_2 with substantially the same polarization direction and light intensity.

The linearly polarized fingerprint signal light FSL_2 may pass through the first quarter-wave plate 111 and become left-handed circular polarized fingerprint signal light FSL_3 with substantially the same light intensity. The left-handed circular polarized fingerprint signal light FSL_3 may pass through the second quarter-wave plate 221 and become linearly polarized fingerprint signal light FSL_4 with a polarization direction in the second and fourth quadrants and with substantially the same light intensity. The linearly polarized fingerprint signal light FSL_4 may pass through the fourth linear polarizer 222 having a same polarization direction as the linearly polarized fingerprint signal light FSL_4 and become the linearly polarized fingerprint signal light FSL_5 with substantially the same light intensity.

Figure 7A:
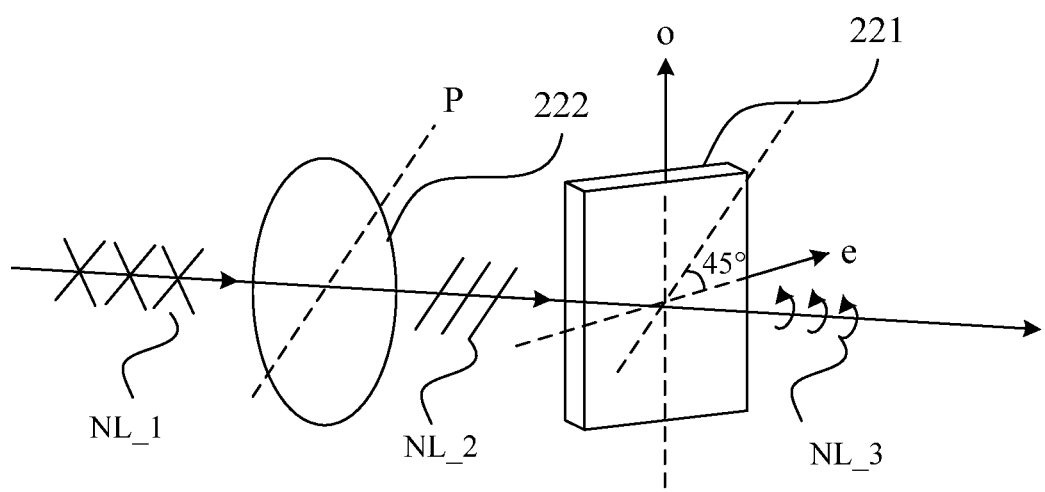
FIG. 7a illustrates an exemplary optical path before fingerprint noise light emitted from a backlight source is reflected by a touch object consistent with disclosed embodiments.
Figure 7B:
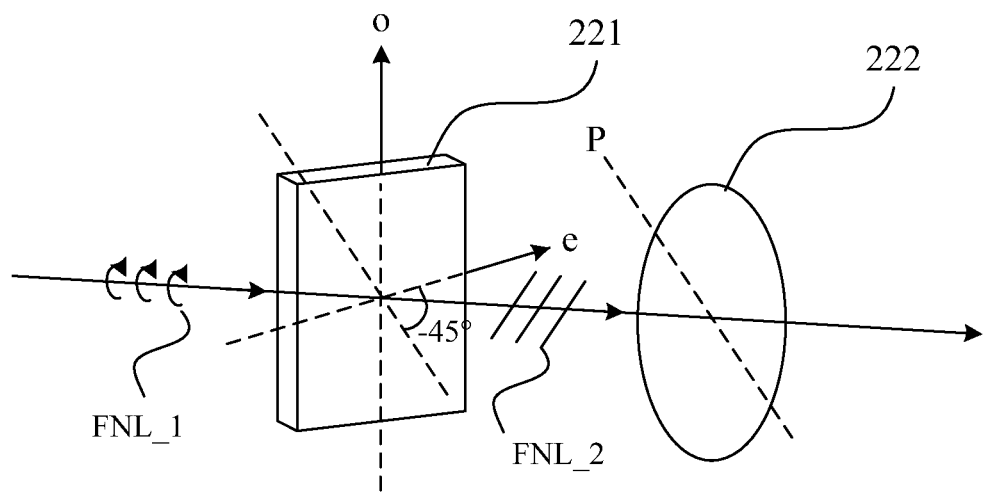
FIG. 7b illustrates an exemplary optical path after fingerprint noise light emitted from a backlight source is reflected by a touch object consistent with disclosed embodiments.

FIG. 7a illustrates an exemplary optical path before fingerprint noise light emitted from a backlight source is reflected by a touch object consistent with disclosed embodiments. FIG. 7b illustrates an exemplary optical path after fingerprint noise light emitted from a backlight source is reflected by a touch object consistent with disclosed embodiments. In FIG. 7a and FIG. 7b, counterclockwise is defined as the positive direction when facing the propagation direction of the light.

Referring to FIG. 5 and FIG. 7a, when facing the propagation direction of the fingerprint signal light, the angle from the e-axis of the second quarter-wave plate 221 to the polarization direction P of the fourth linear polarizer 222 may be configured to be approximately 45°. The natural light NL_1 emitted from the backlight source 3 may pass through the fourth linear polarizer 222 and become linearly polarized light NL_2 with a polarization direction in the first and third quadrants. The linearly polarized light NL_2 with a polarization direction in the first and third quadrants may pass through the second quarter-wave plate 221 and become left-handed circular polarized light NL_3.

Then the left-handed circular polarized light NL_3 may be incident onto a metal layer (e.g., an electrode in the organic light-emitting layer 12 in FIG. 5), then reflected by the metal layer, becoming right-handed circular polarized fingerprint noise light FNL_1 in FIG. 7b.

Referring to FIG. 5 and FIG. 7b, when facing the propagation direction of the fingerprint noise light, the angle from the e-axis of the second quarter-wave plate 221 to the polarization direction P of the fourth linear polarizer 222 may be configured to be approximately −45°. The right-handed circular polarized fingerprint noise light FNL_1 may pass through the second quarter-wave plate 221 and become linearly polarized light FNL_2 with a polarization direction in the first and third quadrants. In particular, the polarization direction of the linearly polarized light FNL_2 may be perpendicular to the polarization direction P of the fourth linear polarizer 222. Thus, the linearly polarized light FNL_2 may not pass through the fourth linear polarizer 222 to be incident onto the fingerprint recognition units 211. Accordingly, the fourth linear polarizer 222 may be able to eliminate the fingerprint noise light reflected by the metal layers in the display module 1, and the signal-to-noise ratio of the fingerprint recognition may be improved.

In one embodiment, the display panel may be a rigid display panel. For example, as shown in FIG. 5, the first substrate 10 may be a first glass substrate. The display module 1 may further include a second glass substrate 13, the organic light-emitting layer 12 may be disposed between the first glass substrate 10 and the second glass substrate 13. The first glass substrate 10 and the second glass substrate 13 may be supported by spacers 15, and an air gap may be formed between the first glass substrate 10 and the second glass substrate 13. In certain embodiments, the thickness of the air gap may be approximately 4 µm.

The display panel may also include a cover glass or cover lens 14. The first polarizer 11 may have an inner side facing the organic light-emitting layer 12 and an opposite outer side. The cover glass 14 may be attached to the outer side of the first polarizer 11 by liquid optical clear adhesive (LOCA). In certain embodiments, the thickness of the display module 1 may be approximately 1410 µm.

Further, in the disclosed embodiments, the fingerprint recognition module 2 may further include a second substrate 20 having an inner side facing the display module 1 and an opposite outer side. The fingerprint recognition layer 21 may be disposed on the inner side of the second substrate 20. That is, the fingerprint recognition layer 21 may be directly fabricated on the inner side of the second substrate 20, facilitating the arrangement of the fingerprint recognition layer 21. Meanwhile, the second substrate 20 may also protect the fingerprint recognition layer 21. In addition, the second polarizer 22 may be attached to the first substrate 10 through an optical adhesive layer including liquid optical clear adhesive (LOCA) (not drawn in FIG. 5), through which the display module 1 and the fingerprint recognition module 2 may be attached to each other to form the display panel.

Figure 8:
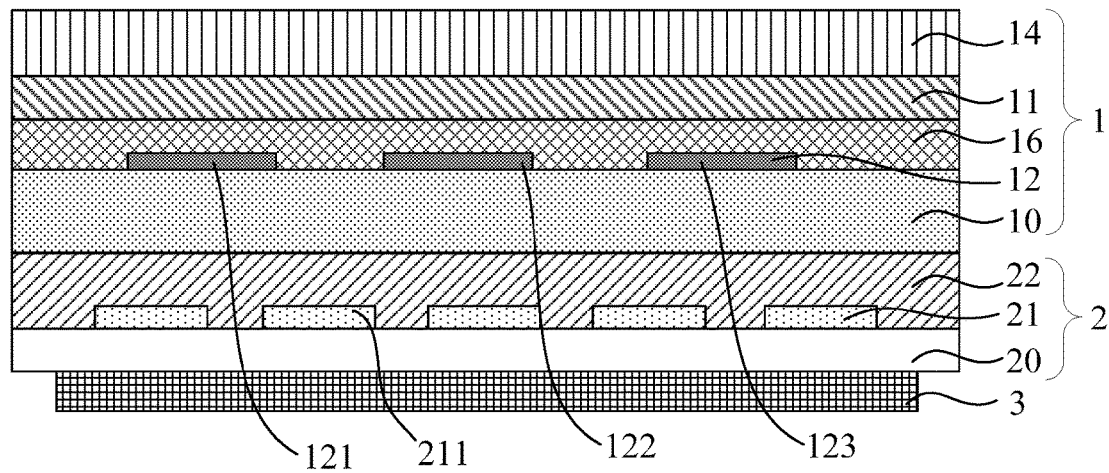
FIG. 8 illustrates a schematic cross-sectional view of another exemplary display panel consistent with disclosed embodiments.

FIG. 8 illustrates a schematic cross-sectional view of another exemplary display panel consistent with disclosed embodiments. The similarities between FIG. 5 and FIG. 8 are not repeated here, while certain difference may be explained.

As shown in FIG. 8, the display panel may be a flexible display panel. In particular, the first substrate 10 may be a flexible substrate, and the display module 1 may further comprises a thin film encapsulation layer 16, which replaces the second glass substrate 13 in FIG. 5. The thin film encapsulation layer 16 may cover the organic light-emitting layer 12.

It should be noted that, the optical axis direction of the quarter-wave plate and the polarization direction of the linear polarizer shown in FIGS. 2a, 6a and 6b are for illustrative purposes, and are not intended to limit the scope of the present disclosure. In the disclosed embodiments, the optical axis direction of the first quarter-wave plate and the optical axis direction of the second quarter-wave plate have no specific relationship, and the polarization direction of the third linear polarizer and the polarization direction of the fourth linear polarizer have no specific relationship, as long as the angle from the optical axis of the first quarter-wave plate to the polarization direction of the third linear polarizer, and the angle from the fourth quarter-wave plate to the polarization direction of the fourth linear polarizer satisfy the limiting conditions of the disclosed embodiments.

Further, in the disclosed embodiments, a fingerprint recognition unit may comprise a fingerprint sensor.

Figure 9A:
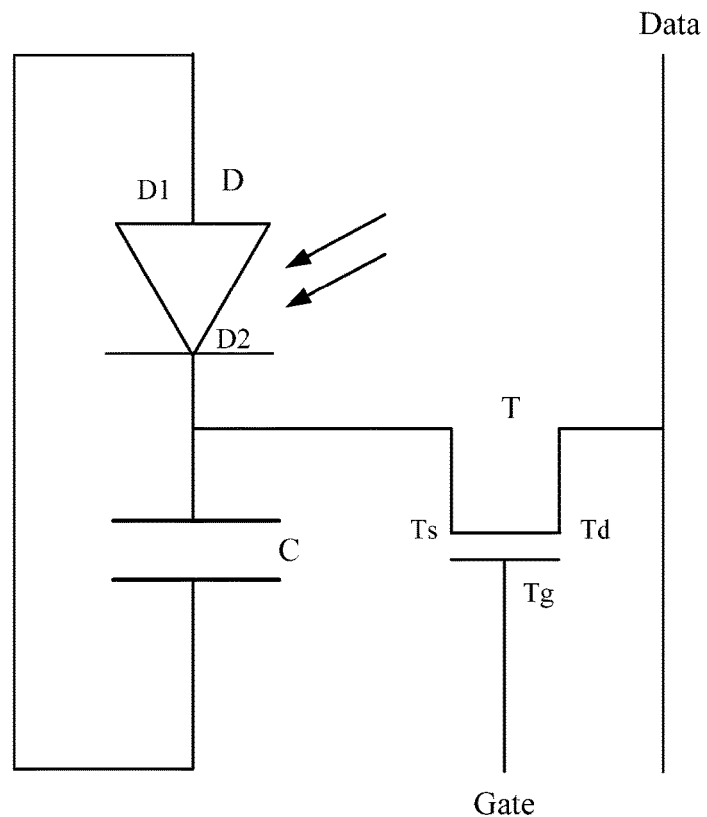
FIG. 9a illustrates a circuit diagram of an exemplary fingerprint sensor in an exemplary fingerprint recognition module consistent with disclosed embodiments.
Figure 9B:
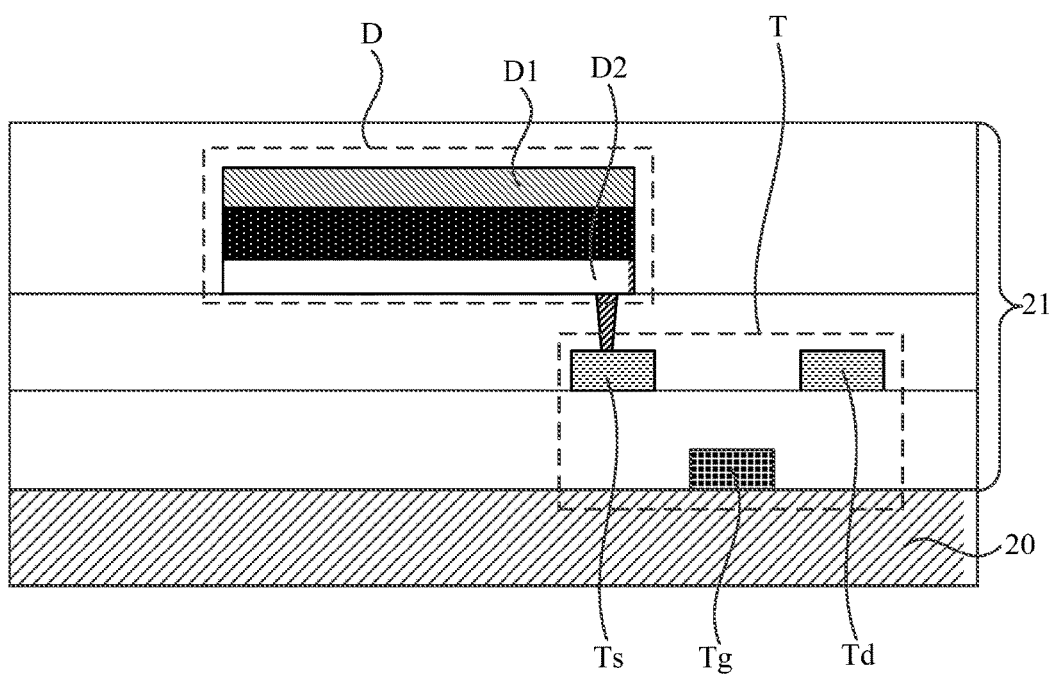
FIG. 9b illustrates a schematic cross-sectional view of an exemplary fingerprint sensor in an exemplary fingerprint recognition module consistent with disclosed embodiments.

FIG. 9a illustrates a circuit diagram of an exemplary fingerprint sensor in an exemplary fingerprint recognition module consistent with disclosed embodiments. FIG. 9b illustrates a schematic cross-sectional view of an exemplary fingerprint sensor in an exemplary fingerprint recognition module consistent with disclosed embodiments.

As shown in FIG. 9a and FIG. 9b, the fingerprint sensor may include a photodiode D, a storage capacitor C, and a thin-film-transistor (TFT) T. In particular, the photodiode D may have a positive electrode D1 electrically connected to the first electrode of the storage capacitor C, and a negative electrode D2 electrically connected to the second electrode of the storage capacitor C and the source electrode Ts of the thin-film-transistor T. The gate electrode Tg of the thin-film-transistor T may be electrically connected to a switch control line Gate, and the drain Td of the thin-film-transistor T may be electrically connected to a signal detection line Data. The photodiode D may convert the fingerprint signal light into a current signal. At the fingerprint recognition stage, the switch control line Gate may control the thin-film-transistor T to turn on, and the current signal may be transmitted to the signal detection line Data by the thin-film-transistor T, thereby realizing the fingerprint recognition according to the current signal.

In addition, to improve the accuracy of fingerprint recognition, the present disclosure also provides certain exemplary display panels.

For example, the present disclosure provides an exemplary display panel where the organic light-emitting layer is multiplexed as a light source for fingerprint recognition.

Figure 10A:
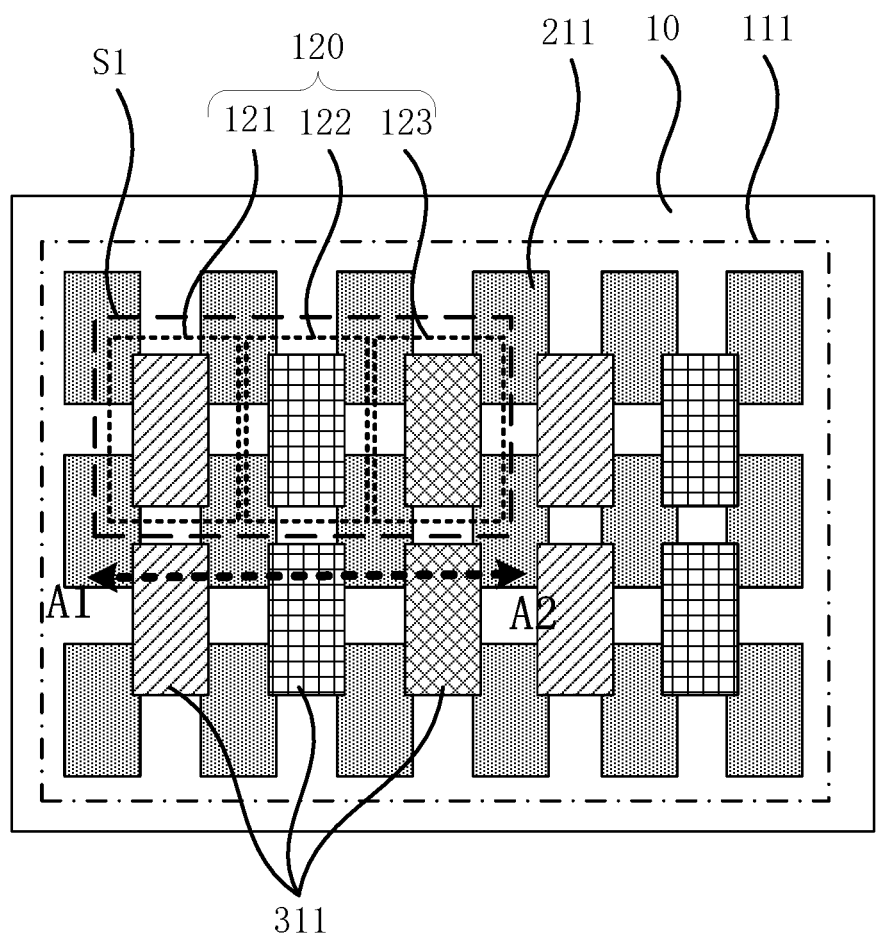
FIG. 10a illustrates a schematic top view of another exemplary display panel consistent with disclosed embodiments.
Figure 10B:
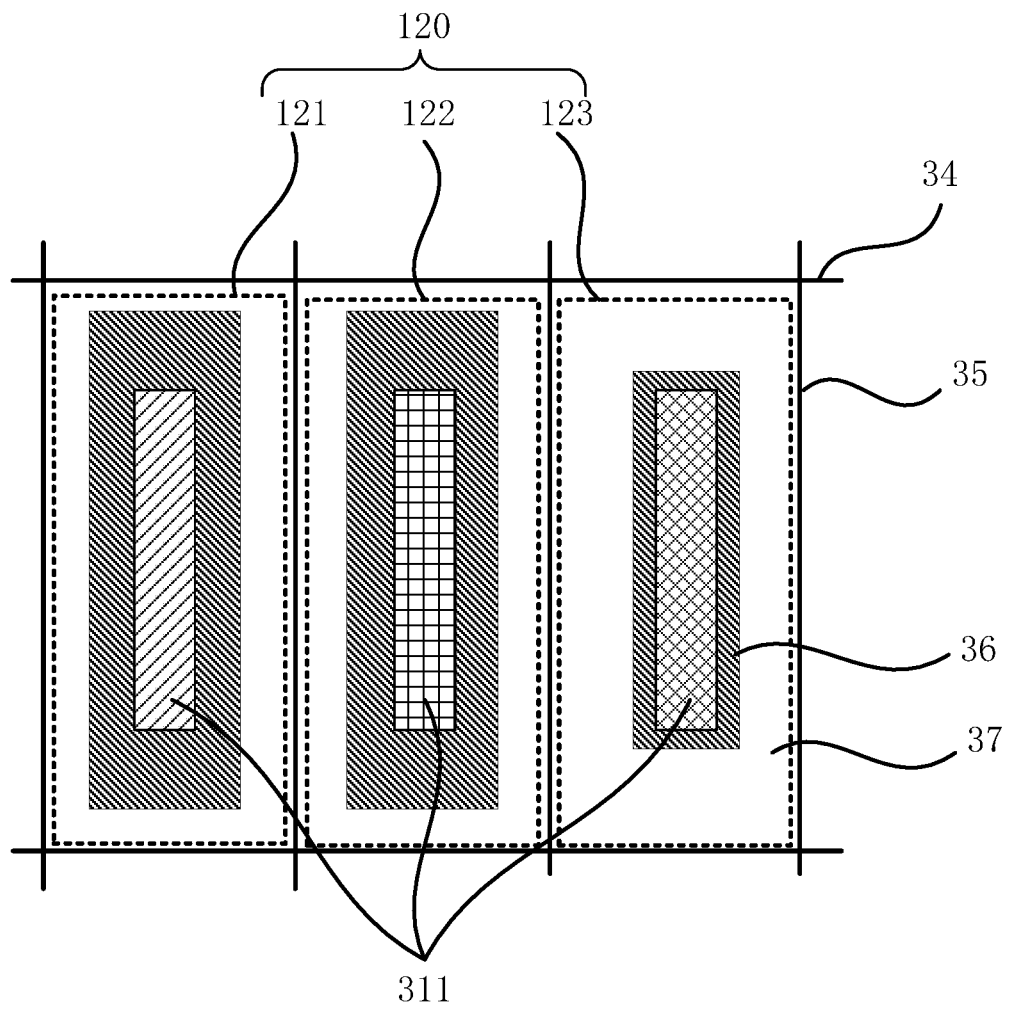
FIG. 10b illustrates a partial enlarged schematic view of an exemplary S1 region in FIG. 10a consistent with disclosed embodiments.
Figure 10C:
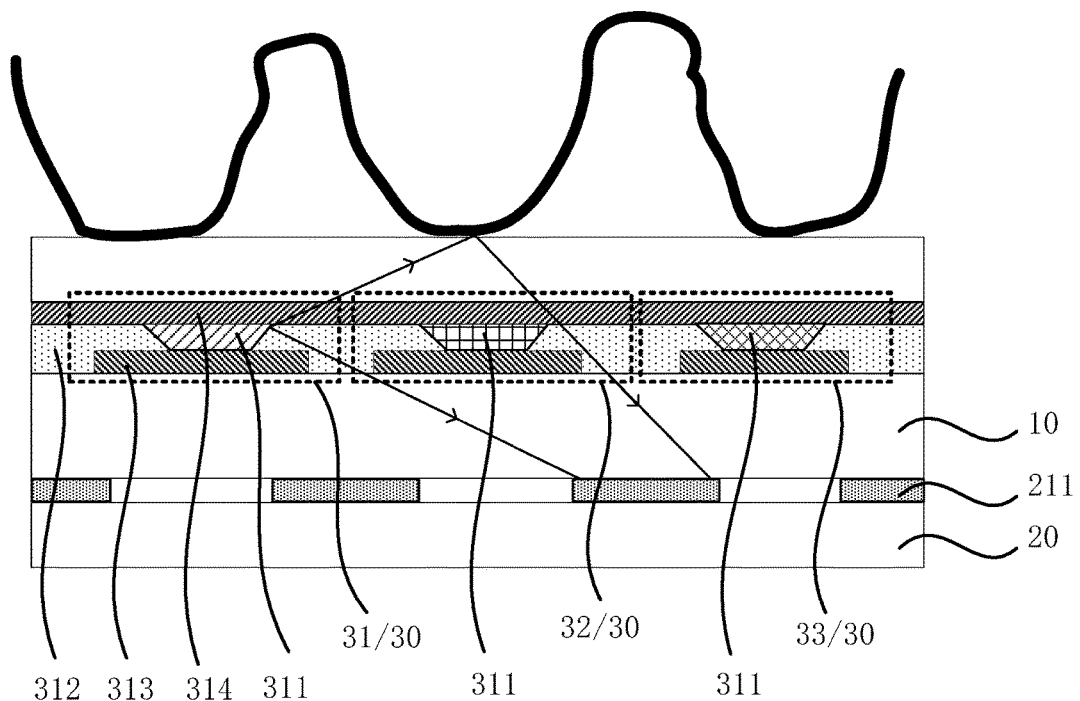
FIG. 10c illustrates a schematic A1-A2 sectional view of another exemplary display panel in FIG. 10a consistent with disclosed embodiments.

FIG. 10a illustrates a schematic top view of another exemplary display panel consistent with disclosed embodiments. FIG. 10b illustrates a partial enlarged schematic view of an exemplary S1 region in FIG. 10a consistent with disclosed embodiments. FIG. 10c illustrates a schematic A1-A2 sectional view of another exemplary display panel in FIG. 10a consistent with disclosed embodiments;

As shown in FIGS. 10a-10c, the display panel may comprise a first substrate 10, a plurality of organic light-emitting units 120, and at least one fingerprint recognition unit 211. The plurality of organic light-emitting units 120 may be disposed on the first substrate 10. The organic light-emitting unit 120 may have an inner side facing the viewers and an opposite outer side facing the first substrate 10. The fingerprint recognition unit 211 may be disposed on the outer side of the organic light-emitting units 120, i.e., the fingerprint recognition unit 211 may be disposed between the organic light-emitting units 120 and the first substrate 10. The fingerprint recognition unit 211 may be configured to recognize or identify the fingerprint based on the light reflected by the touch object (such as finger) to the fingerprint recognition unit 211.

The plurality of organic light-emitting units 120 may comprise a plurality of red organic light-emitting units 121, a plurality of green organic light-emitting units 122, and a plurality of blue organic light-emitting units 123. Each organic light-emitting unit may have the inner side facing the light-exiting surface of the display panel and the outer side far away from the light-exiting surface of the display panel.

At the fingerprint recognition stage, at least one of the red organic light-emitting unit 121 and the green organic light-emitting unit 122 may be configured as the light source for the fingerprint recognition unit 211 to emit light. At least one of the red organic light-emitting unit 121 and the green organic light-emitting unit 122, which is configured as the light source for the fingerprint recognition unit 211, may have the area of a light-transparent region at the outer side of the organic light-emitting unit 120 smaller than the blue organic light-emitting unit 123.

It should be noted that, the number and the layout of the organic light-emitting units in the display panel are for illustrative purposes, and are not intended to limit the scope of the present disclosure. In one embodiment, as shown in FIGS. 10a-10c, the first substrate 1 may be an array substrate.

Referring to FIG. 10b and FIG. 10c, each organic light-emitting unit 120 may have an inner side far away from the first substrate 10 and an opposite outer side facing the first substrate 10. A first electrode 313, a light-emitting function layer 311, and a second electrode 314 may be sequentially disposed on the inner side of the organic light-emitting unit 120. The organic light-emitting units 120 may include the red organic light-emitting units 121, the green organic light-emitting units 122, and the blue organic light-emitting units 123.

Each organic light-emitting unit 120 may include a light-emitting function layer 311. The light-emitting function layer 311 may have an inner side facing the light-exiting surface of the display panel and an opposite outer side far away from the light-exiting surface of the display panel. The light-emitting function layer 311 in the organic light-emitting unit 120 may a light-transparent region 37 and an opaque region 36 at the outer side of the light-emitting function layer 311. For the top-emission type OLED display panel, the light-exiting surface of the display panel may be arranged at the outer side of the organic light-emitting unit 120.

In particular, the light-emitting functional layer 311 may include a first auxiliary function layer, a light-emitting material or luminescent material layer, and a second auxiliary function layer. The first auxiliary functional layer may be a hole-type auxiliary functional layer, and may have a multilayer structure comprising, for example, one or more layers of a hole injection layer (HIL), a hole transport layer (HTL), and an electron blocking layer (EBL). The second auxiliary functional layer may be an electron-type auxiliary functional layer, and may have a multilayer structure comprising, for example, one or more layers of an electron transport layer (ETL), an electron injection layer (EIL), and a hole blocking layer (HBL).

When applied with an external electric field, electrons from the second electrode 314 and holes the first electrode 313 may be injected into the luminescent material layer in the luminescent functional layer 311, and then recombined to generate excitons. The excitons migrate under the applied electric field, and the energy is transferred to the light-emitting molecules in the luminescent material. Then the electrons are stimulated to transit from the ground state to the excited state. The electrons at the excited state may release the energy through the radiation transition, thereby generating light.

In one embodiment, as shown in FIGS. 10b-10c, the first electrode 313 may be an anode and the second electrode 314 may be a cathode. In another embodiment, the first electrode 313 may be a cathode, the second electrode 314 may be an anode, which is not limited by the present disclosure.

In the disclosed embodiments shown in FIGS. 10a-10c, the display panel may comprise a plurality of organic light-emitting units 120 and at least one fingerprint recognition unit 211 disposed on the first substrate 10. The plurality of organic light-emitting units 120 may comprise a plurality of red organic light-emitting units 121, a plurality of green organic light-emitting units 122, and a plurality of blue organic light-emitting units 123. At the display stage, the red organic light-emitting unit 121, the green organic light-emitting units 122, and the plurality of blue organic light-emitting units 123 may emit light according to a predetermined sequence.

At the fingerprint recognition stage, because the light emitted by the blue organic light-emitting unit 123 has substantially short wavelength while the respective layers (e.g., organic insulating layers, inorganic insulating layers, polarizers, etc.) in the display panel strongly absorb light of short wavelength, the light emitted by the blue organic light-emitting unit 123 has lower light transmittance as compared to that of the red organic light-emitting unit 121 and green organic light-emitting unit 122.

To address the above-mentioned concern, at least one of the red organic light-emitting unit 121 and the green organic light-emitting unit 122 may be configured to be the light source for the fingerprint recognition unit 211 and, meanwhile, the at least one of the red organic light-emitting unit 121 and the green organic light-emitting unit 122, which is configured to be the light source for the fingerprint recognition unit 211, may be configured to have the area of the light-transparent region at the outer side of the organic light-emitting unit 120 smaller than the blue organic light-emitting unit 123.

Because the organic light-emitting unit configured as the light source for the fingerprint recognition unit 211 has a smaller area of the light-transparent region, stray light which is directly incident onto the fingerprint recognition unit 211 without being reflected by the touch object (e.g., finger) may be reduced. The stray light which is directly incident onto the fingerprint recognition unit 211 without being reflected by the touch object (e.g., finger) may not carry the fingerprint information, as a comparison, the light reflected by the touch body may carry the fingerprint information. Thus, through reducing the stray light, the noise in the fingerprint recognition may be suppressed, and the accuracy of the fingerprint recognition may be improved.

Further, as shown in FIG. 10c, the display panel may also include a second substrate 20 having an inner side facing the display module 1 and an opposite outer side. The first substrate 10 may have an inner side facing the organic light-emitting units 120 and an opposite outer side, and the second substrate 20 may be disposed on the outer side of the first substrate 10. The fingerprint recognition units 211 may be disposed between the second substrate 20 and the first substrate 10. The fingerprint recognition unit 211 and the second substrate 20 may be configured as a part of the fingerprint recognition module 2, and the fingerprint recognition module 2 may also comprise a plurality of metal connection lines and IC drive circuits (not drawn in FIG. 10c).

In one embodiment, as shown in FIGS. 10b-10c, each organic light-emitting unit 120 may have the inner side facing the viewers and the outer side facing the first substrate 10. The first electrode 313, the light-emitting function layer 311, and the second electrode 314 may be sequentially disposed on the inner side of the organic light-emitting unit 120. The first electrode 313 may be a reflective electrode which may include, for example, an indium tin oxide (ITO) conductive layer, a reflective electrode layer (Ag), and an ITO conductive layer sequentially stacked. The ITO conductive layer comprises materials of a high work function, which may facilitate the hole injections. The light-emitting functional layer 311 of the red organic light-emitting unit 121, the light-emitting functional layer 311 of the green organic light-emitting unit 122, and the light-emitting functional layer 311 of the blue organic light-emitting unit 123 may be spaced apart from each other by a pixel-defining layer 312.

Further, at the fingerprint recognition stage, both the red organic light-emitting unit 121 and the green organic light-emitting unit 122 may be configured as the light source for the fingerprint recognition. The area of the first electrode 313 in the red organic light-emitting unit 121 and the area of the first electrode 313 in the green organic light-emitting unit 122 each may be larger than the area of the first electrode 313 in the blue organic light-emitting unit 123. On one hand, the light emitted from the light-emitting function layer 311 in the organic light-emitting unit 120 towards the first substrate 10 may be blocked by the first electrode 313, which is disposed between the light-emitting function layer 311 and the fingerprint recognition unit 211. On the other hand, as compared to the reflective electrode in the existing display panel, the reflective electrodes (i.e., the first electrodes 313) in the red organic light-emitting unit 121 and green organic light-emitting unit 122 which are configured as the light source for the fingerprint recognition may be further extended outwards, for example, in the arrangement direction of the first electrodes 313, thereby reducing the stray light incident onto the fingerprint recognition unit 211 and improving the accuracy of the fingerprint recognition.

That is, the area of the reflective electrode 313 in the blue organic light-emitting unit 123 may substantially remain the same, while the area of the reflective electrode 313 in the red organic light-emitting unit 121 and the area of the reflective electrode 313 in the green organic light-emitting unit 122 each may be expanded to block the stray light, as compared to the area of the reflective electrode in the existing display panel.

In addition, the reflective electrode 313 may be arranged adjacent to or in contact with the light-emitting functional layer 311, such that the light emitted from the light-emitting functional layer 311 towards the first substrate 10 may be substantially close to the edge of the reflective electrode 313. Thus, the reflective electrode 313 may be configured to extend a predetermined distance to prevent the light emitted from the light-emitting function layer from being directly incident onto the fingerprint recognition unit 211. Further, when the reflective electrode 313 is extended to a certain extent, the reflective electrode 313 may completely prevent the stray light from being incident onto the fingerprint recognition unit 211, thereby greatly improving the accuracy of the fingerprint recognition.

In one embodiment, as shown in FIGS. 10b-10c, in the organic light-emitting unit 120 which is configured as the light source for the fingerprint recognition unit 211, a ratio between the area of the first electrode 313 and the area of the light-emitting function layer 311 may be approximately in the range of 1.2 to 6. In the organic light-emitting unit 120 which is not configured as the light source for the fingerprint recognition unit 211, a ratio between the area of the first electrode 313 and the area of the light-emitting function layer 311 may be approximately in the range of 1 to 1.2.

For example, as shown in FIGS. 10b-10c, the opaque region 36 in FIG. 10b may be the orthogonal projection of the first electrode 313 in the organic light-emitting unit 120 onto the first substrate 10. When the red organic light-emitting unit 121 and the green organic light-emitting unit 122 are configured as the light source of the fingerprint recognition unit 211, while the blue organic light-emitting unit 123 is not configured as the light source of the fingerprint recognition unit 211, the ratio between the area of the opaque region 36 and the area of the light-emitting function layer 311 in the red organic light-emitting unit 121 and the ratio between the area of the opaque region 36 and the area of the light-emitting function layer 311 in the green organic light-emitting unit 122 each may be larger than the ratio between the area of the opaque region 36 and the area of the light-emitting function layer 311 in the blue organic light-emitting unit 123.

Thus, in the organic light-emitting unit 120 which is configured as the light source for the fingerprint recognition unit 211, through configuring the ratio between the area of the first electrode 313 and the area of the light-emitting function layer 311 to be approximately in the range of 1.2 to 6, the first electrode 313 may effectively prevent the light emitted from the light-emitting function layer from being directly incident onto the fingerprint recognition unit 211. That is, the stray light may be effectively suppressed, the noise in the fingerprint recognition may be reduced, and the accuracy of the fingerprint recognition may be improved.

It is understood that, in the organic light-emitting unit 120 which is configured as the light source for the fingerprint recognition unit 211, when the ratio of the area of the first electrode to the area of the light-emitting function layer is larger, the stray light may be more effectively blocked by the first electrode 313, or more stray light may be blocked by the first electrode 313. When the ratio between the area of the first electrode 313 and the area of the light-emitting function layer 311 is approximately 6, the first electrode may be able to block most of the stray light, greatly improving the accuracy of the fingerprint recognition.

Figure 10D:
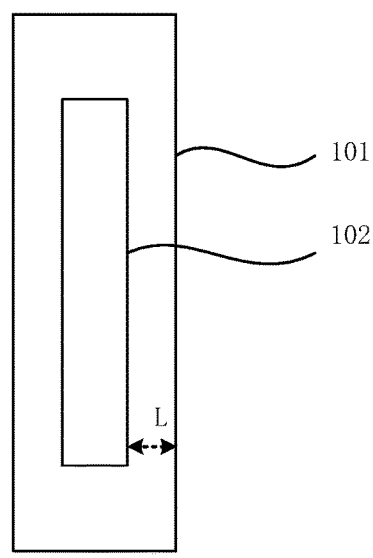
FIG. 10d illustrates an exemplary first closed loop and an exemplary second closed loop consistent with disclosed embodiments.

FIG. 10d illustrates an exemplary first closed loop and an exemplary second closed loop consistent with disclosed embodiments. In one embodiment, as shown in FIGS. 10c to 10d, in the organic light-emitting unit 120 which is configured as the light source for the fingerprint recognition unit 211, when being projected onto the first substrate 10, the orthogonal projection of the border of the first electrode 313 in the organic light-emitting unit 120 may form a first closed loop 101, and the orthogonal projection of the border of the light-emitting function layer 311 in the organic light-emitting unit 120 may form a second closed loop 102.

Referring to FIG. 10d, the first closed loop 101 may surround the second closed loop 102. For any point of the first closed loop 101, the second closed loop 102 may have a corresponding point providing a short distance L between the point of the first closed loop 101 and the corresponding point of the second closed loop 102. That is, the distance range between the first closed loop 101 and the second closed loop 102 may include a set of the shortest distances L corresponding to all the points on the first closed loop 101.

The distance range between the first closed loop 101 and the second closed loop 102 may represent the range of the extending length of the first electrode in either direction in the plane of the first electrode. In one embodiment, the distance between the first closed loop 101 and the second closed loop 102 may be approximately in a range of 3 μm to 30 μm That is, the range of the extending length of the first electrode in either direction in the plane of the first electrode may be approximately in a range of 3 μm to 30 μm. In other words, the extending length of the first electrode in either direction in the plane of the first electrode may be approximately in a range of 3 μm to 30 μm. When the distance between the first closed loop 101 and the second closed loop 102 is approximately in a range of 3 μm to 30 μm, the first electrode may effectively reduce the stray light and improve the accuracy of fingerprint recognition.

Figure 10E:
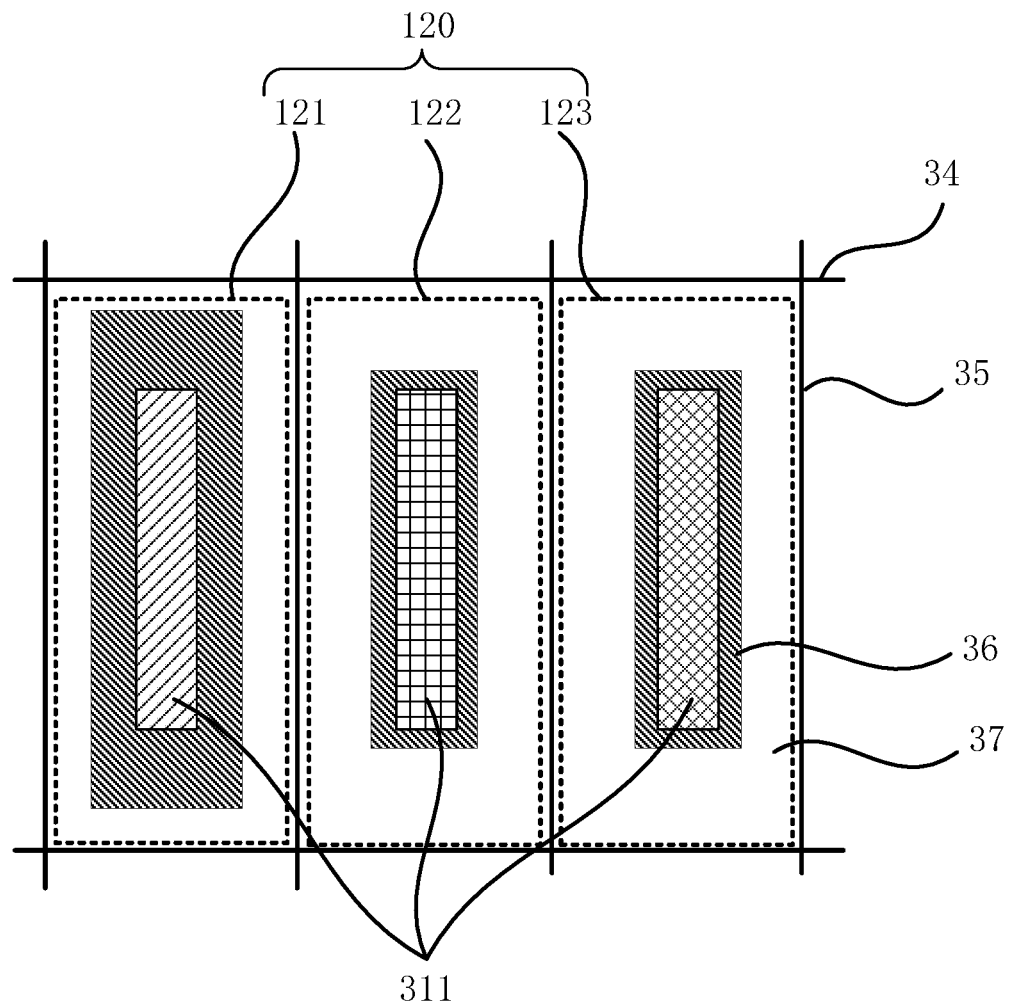
FIG. 10e illustrates a partial enlarged schematic view of another exemplary S1 region in FIG. 10a consistent with disclosed embodiments.

FIG. 10e illustrates a partial enlarged schematic view of another exemplary S1 region in FIG. 10a consistent with disclosed embodiments.

As shown in FIGS. 10a and 10e, only the red organic light-emitting unit 121 may be configured as the light source of the fingerprint recognition unit 211. The red organic light-emitting unit 121 may have the area of the light-transparent region at the outer side of the red organic light-emitting unit 121 smaller than the blue organic light-emitting unit 123. Meanwhile, the red organic light-emitting unit 121 may have the area of the light-transparent region at the outer side of the red organic light-emitting unit 121 smaller than the green organic light-emitting unit 122.

The light-emitting layer in the red organic light-emitting unit 121 may have an inner side facing the light-exiting surface of the display panel and an opposite outer side far away from the light-exiting surface of the display panel. Because only the red organic light-emitting unit is used as the light source for fingerprint recognition, it may be only necessary to block the light emitted from the outer side of the light-emitting layer in the red organic light-emitting unit 121, for example, only the first electrode in the red organic light-emitting unit 121 may have to be extended. The first electrodes in the blue organic light-emitting unit 123 and green organic light-emitting unit 122 may not have to extended and, meanwhile, both the green organic light-emitting unit 122 and the blue organic light-emitting unit 123 may have a light-transparent region of the organic light-emitting unit larger than the red organic light-emitting unit 121.

Thus, on one hand, the accuracy of the fingerprint recognition may be ensured, while the light-transparent regions of the organic light-emitting units may be sufficiently large to transmit the light reflected by the touch object (e.g., finger), thereby increasing the light intensity of the fingerprint signal light detected by the fingerprint recognition unit.

In addition, the light intensity of the fingerprint signal light detected by the fingerprint recognition unit may be increased by raising the operating voltage of the red organic light-emitting unit 121.

In another embodiment, only the green organic light-emitting unit 122 may be configured as the light source of the fingerprint recognition unit 211. The green organic light-emitting unit 122 may have the area of the light-transparent region at the outer side of the green organic light-emitting unit 122 smaller than the blue organic light-emitting unit 123. Meanwhile, the green organic light-emitting unit 122 may have the area of the light-transparent region at the outer side of the green organic light-emitting unit 122 smaller than the red organic light-emitting unit 121.

Figure 11:
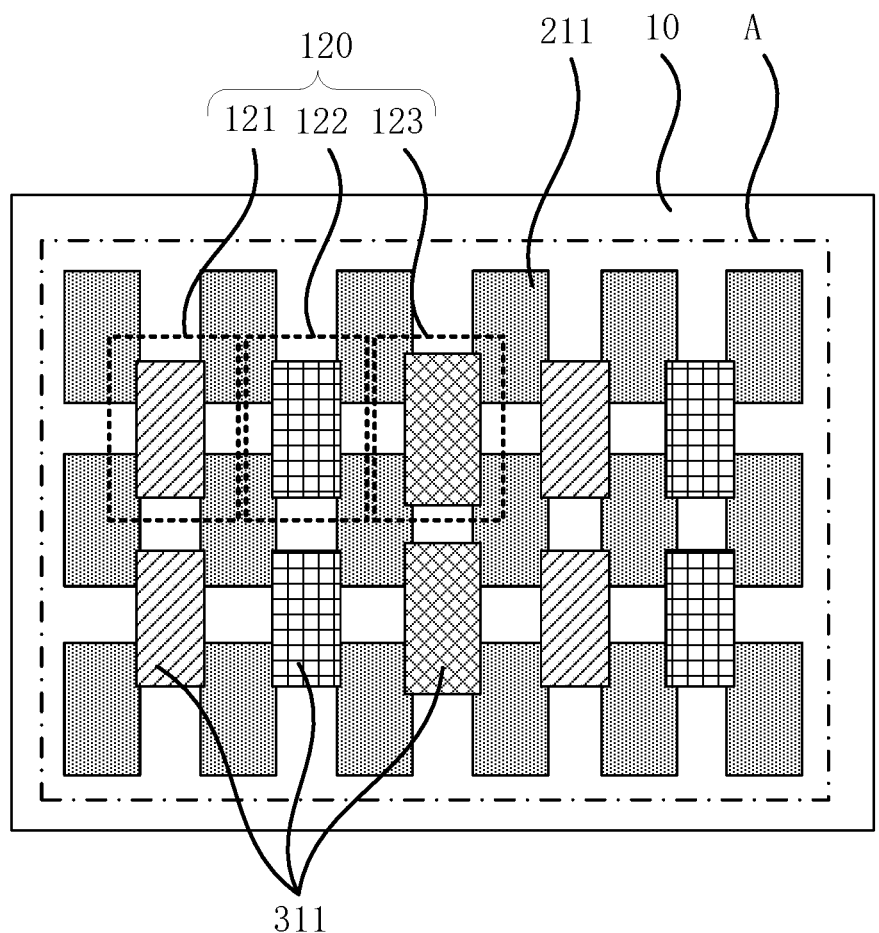
FIG. 11 illustrates a schematic top view of another exemplary display panel consistent with disclosed embodiments.

FIG. 11 illustrates a schematic top view of another exemplary display panel consistent with disclosed embodiments.

As shown in FIG. 11, the area of the light-emitting function layer in the blue organic light-emitting unit 123 may be larger than the area of the light-emitting functional layer in the red organic light-emitting unit 121. Meanwhile, the area of the light-emitting function layer in the blue organic light-emitting unit 123 may be larger than the area of the light-emitting function layer in the green organic light-emitting unit 122.

Because the material of the light-emitting function layer of the blue organic light-emitting unit has a shorter life than the materials of the light-emitting functional layer in the red organic light-emitting mechanism and blue organic light-emitting unit, the area of the light-emitting function layer in the blue organic light-emitting unit may be desired to be larger, and the light-emitting function layer of the blue organic light-emitting unit may be able to be operated at a lower voltage.

For example, the operating voltage of the light-emitting functional layer in the red organic light-emitting unit 121 and the green organic light-emitting unit 122 may be set as approximately 3 V, and the operating voltage of the light-emitting functional layer in the blue organic light-emitting unit 123 may be set as approximately 2 V, thereby improving the lifetime of the blue organic light-emitting unit 123. Accordingly, the lifetime of the red organic light-emitting unit, green organic light-emitting unit and blue organic light-emitting unit may be balanced, and the lifetime of the entire display panel may be improved.

Figure 12A:
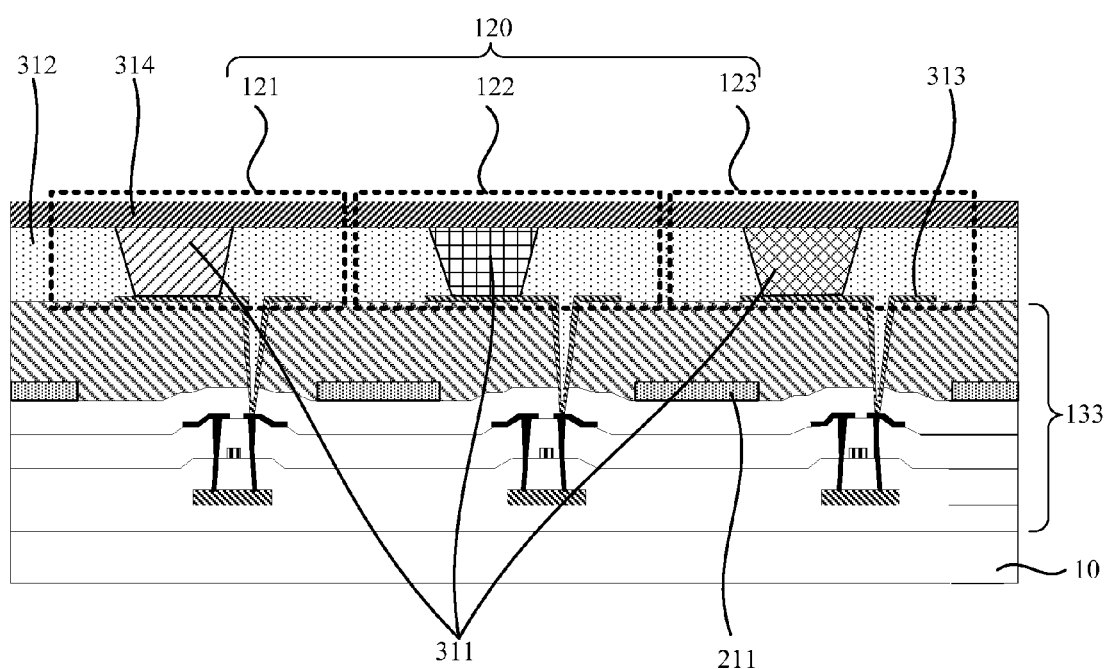
FIG. 12a illustrates a schematic cross-sectional view of another exemplary display panel consistent with disclosed embodiments.
Figure 12B:
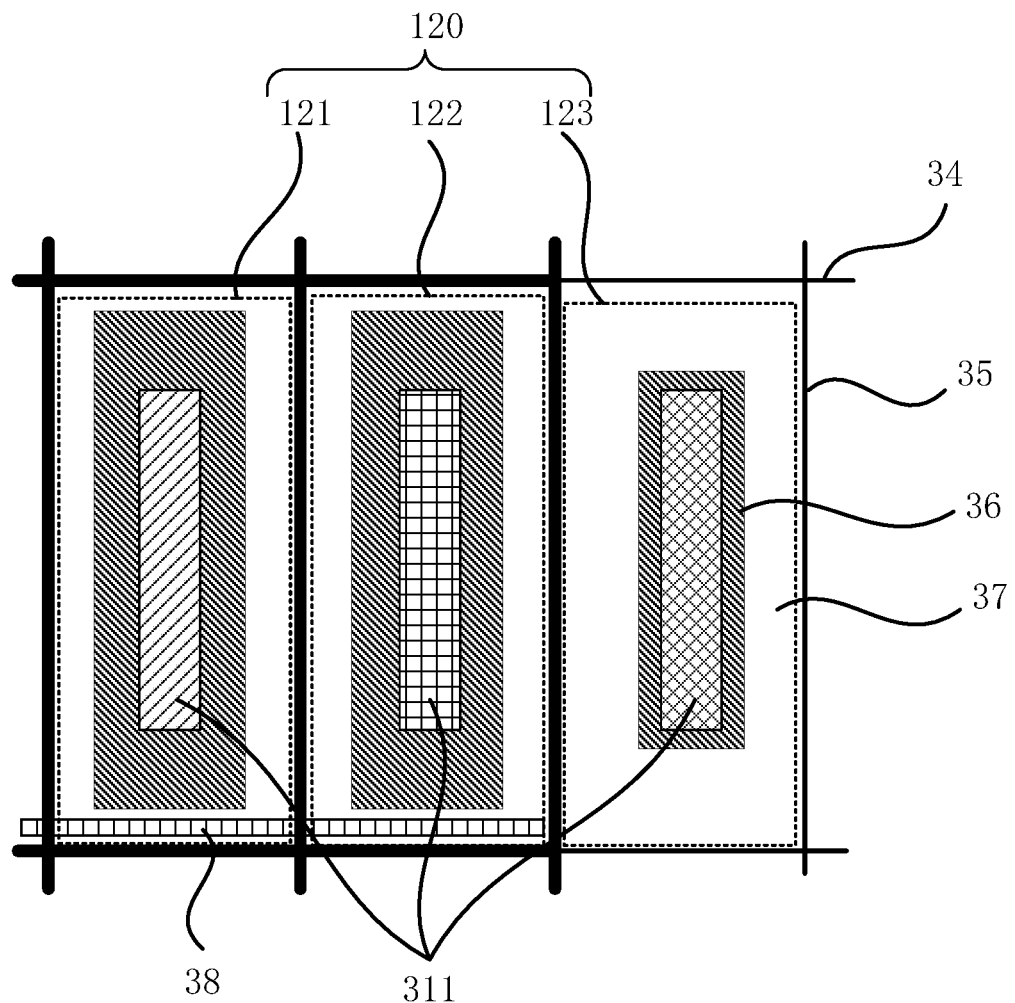
FIG. 12b illustrates a partial enlarged schematic view of an exemplary S1 region in FIG. 12a consistent with disclosed embodiments.

FIG. 12a illustrates a schematic cross-sectional view of another exemplary display panel consistent with disclosed embodiments. FIG. 12b illustrates a partial enlarged schematic view of an exemplary S1 region in FIG. 12a consistent with disclosed embodiments.

As shown in FIG. 12a, the display panel may comprise a first substrate 10 and a plurality of pixel driving circuits 133 arranged on the first substrate 10. Each pixel driving circuit 133 may be electrically connected to a corresponding organic light-emitting unit 120, and the fingerprint recognition unit 211 may be disposed between the first substrate 10 and the organic light-emitting unit 120. For illustrative purposes, FIG. 12a shows three pixel driving circuits 133, and each of the pixel driving circuits 133 may be electrically connected to the first electrode 313 in the corresponding organic light-emitting unit 120. The fingerprint recognition units 211, metal connecting lines, and an IC driving circuit (not drawn in FIG. 12a) may form a fingerprint recognition module, which may be embedded inside the display panel. Because the fingerprint recognition module is embedded inside the display panel, the thickness of the display panel may be reduced, and the thin-and-light design of the display panel may be realized.

In one embodiment, as shown in FIGS. 12a and 12b, when being projected onto the first substrate 10, the pixel driving circuit 133 corresponding to the organic light-emitting unit 120 configured as the light source for the fingerprint recognition unit 211, may have a larger orthogonal projection than, the pixel driving circuit 133 corresponding to the organic light-emitting unit 120 not configured as the light source for the fingerprint recognition unit 211. The fingerprint recognition unit 211 may be arranged between the pixel driving circuit 133 and the first substrate 10.

In one embodiment, as shown in FIGS. 12a and 12b, the pixel driving circuits 133 may comprise a plurality of scanning lines 34 and a plurality of data lines 35. The scanning lines 34 and data lines 35 in the pixel driving circuits 133, which are corresponding to the organic light-emitting unit 120 configured as the light source for the fingerprint recognition unit 211, may be widened, thereby blocking the stray light. In another embodiment, the position or the size of the opaque elements in the pixel driving circuits 133, which are corresponding to the organic light-emitting unit 120 configured as the light source for the fingerprint recognition unit 211, may be modified, thereby blocking the stray light without affecting the original function of the opaque elements. For example, the position of the capacitive metal plate 38 may be changed, such that in addition to the capacitance storage function, the capacitive metal plate 38 may also be able to block the stray light.

Figure 12C:
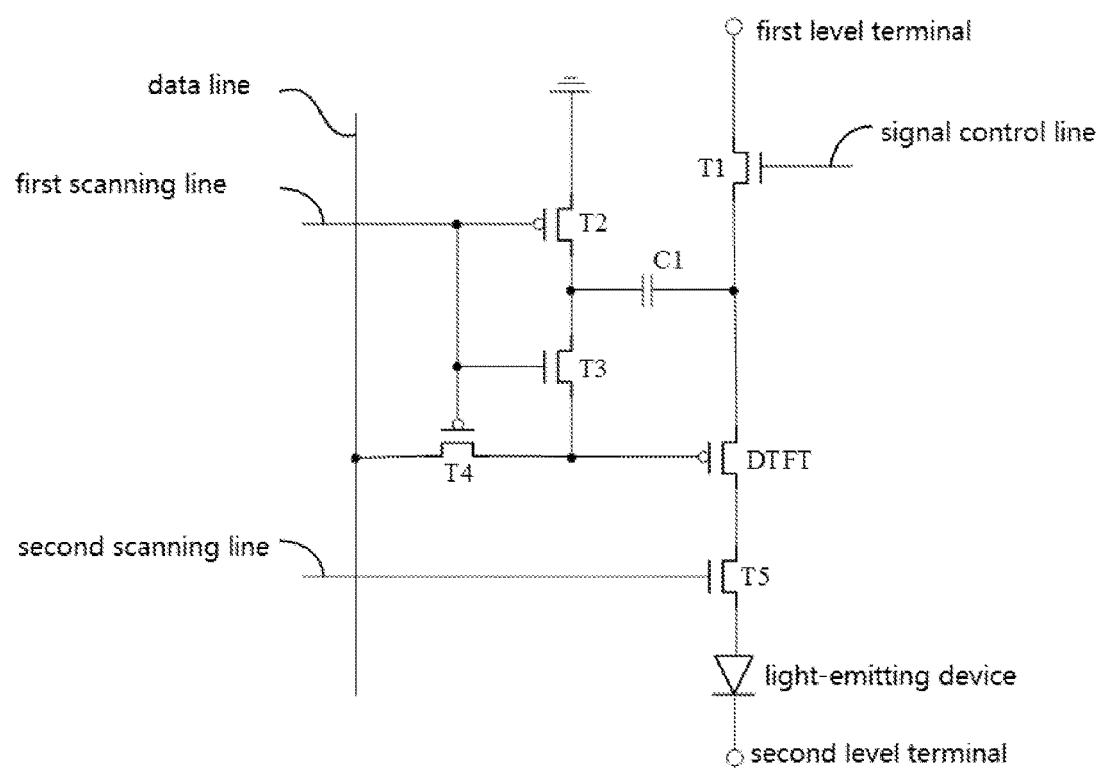
FIG. 12c illustrates a circuit diagram of an exemplary pixel driving circuit consistent with disclosed embodiments.
Figure 12D:
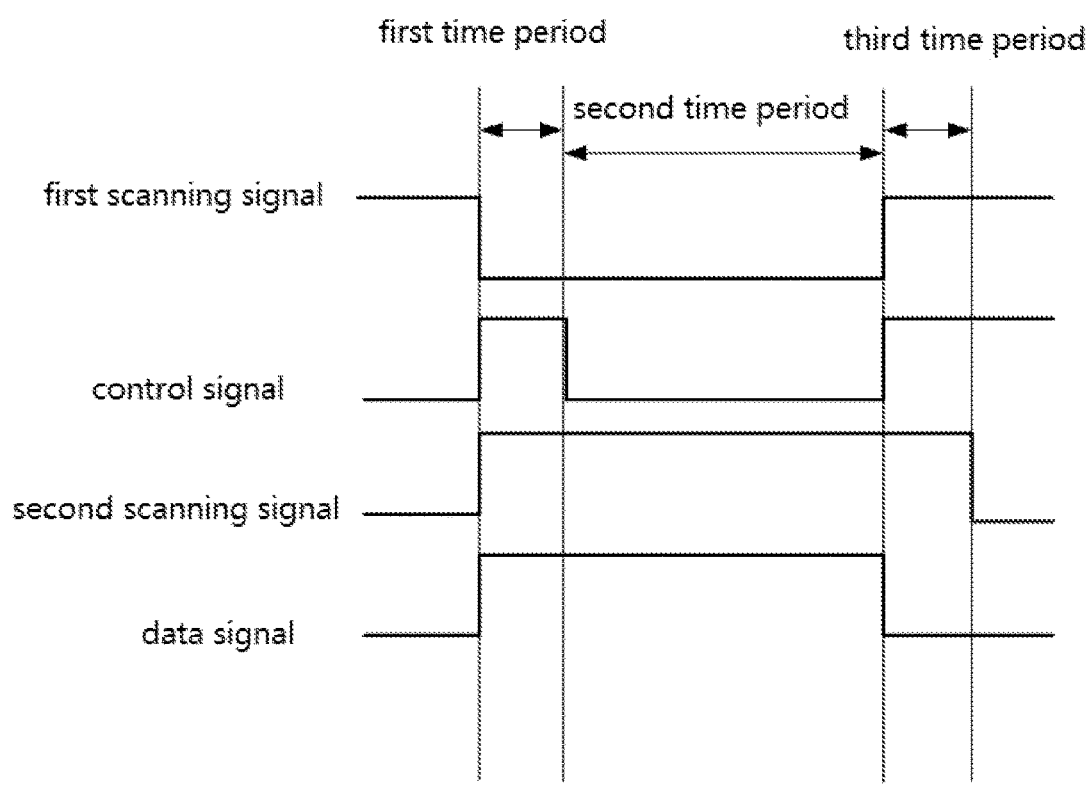
FIG. 12d illustrates an exemplary driving diagram of an exemplary pixel driving circuit consistent with disclosed embodiments.

FIG. 12c illustrates a circuit diagram of an exemplary pixel driving circuit consistent with disclosed embodiments. FIG. 12d illustrates an exemplary driving diagram of an exemplary pixel driving circuit consistent with disclosed embodiments.

Referring to FIGS. 12b and 12c, the scanning lines 34 in FIG. 12b may be a signal control line, a first scanning line, and a second scanning line in the pixel drive circuit in FIG. 12c. The data line 35 in FIG. 12b may be a data line in the pixel drive circuit in FIG. 12c. The capacitive metal plate 38 in FIG. 12b may be a storage capacitor C1 in the pixel driving circuit in FIG. 12c. It is understood that the gate electrode, the source electrode and other non-transparent component of the first TFT T1 and the second TFT T2 in the pixel driving circuit may also be configured to block the stray light.

Referring to FIGS. 12c and 12d, the pixel driving circuit may include a data line, a first scanning line, a second scanning line, a signal control line, a light-emitting device, a storage capacitor C1, a driving transistor DTFT and five switching transistors T1 to T5.

The first TFT T1 may have a gate electrode electrically connected to the signal control line, a source electrode electrically connected to a first level terminal, and a drain electrode electrically connected to a first electrode of the storage capacitor C1.

The second switching transistor T2 may have a gate electrode electrically connected to the first scanning line, a source electrode electrically connected to the ground, and a drain electrode electrically connected to a second electrode of the storage capacitor C1.

The third switching transistor T3 may have a gate electrode electrically connected to the first scanning line, and a source electrode electrically connected to the second electrode of the storage capacitor C1.

The fourth switching transistor T4 may have a gate electrode electrically connected to the first scanning line, a source electrode electrically connected to the data line, and a drain electrode electrically connected to the drain electrode of the third switching transistor T3.

The driving transistor DTFT may have a gate electrode electrically connected to the drain electrode of the fourth switching transistor T4, and a source electrode electrically connected to the data line, and a drain electrode electrically connected to the first electrode of the storage capacitor C1.

The fifth switching transistor T5 may have a gate electrode electrically connected to the second scanning line, a source electrode electrically connected to the drain electrode of the driving transistor DTFT, and a drain electrode electrically connected to one terminal (e.g., an electrode) of the light-emitting device. The other terminal (e.g., another electrode) of the light-emitting device may be electrically connected to a second level terminal.

In particular, the first switching transistor T1, the third switching transistor T3, and the fifth switching transistor T5 may be N-type switching transistors, while the driving transistor DTFT, the second switching transistor T2, and the fourth switching transistor T4 may be P-type switching transistors.

Referring to FIG. 12d, the driving method of the pixel driving circuit may be explained as follows. Referring to FIG. 12d and FIG. 12c, the first scanning signal, the second scanning signal, the control signal, and the data signal are provided by the first scanning line, the second scanning line, the signal control line and the data line, respectively.

As shown in FIG. 12d, during the first time period, the first switching transistor T1, the second switching transistor T2, the fourth switching transistor T4, the fifth switching transistor T5 may be turned on, while the third switching transistor T3 may be turned off, the first level terminal may charge the storage capacitor C1.

During the second time period, the second switching transistor T2, the fourth switching transistor T4, and the fifth switching transistor T5 may be turned on, while the first switching transistor T1 and the third switching transistor T3 may be turned off. The storage capacitor C1 may be discharged until the voltage difference between the gate electrode and source electrode of the driving transistor DTFT is sustainably equal to the threshold voltage of the driving transistor DTFT.

During the third time period, the first switching transistor T1, the third switching transistor T3 and the fifth switching transistor T5 may be turned on, while the second switching transistor T2 and the fourth switching transistor T4 may be turned off. The first and second level terminals may provide a turn-on signal to the light-emitting device.

The fifth switching transistor T5 may be turned off after the image displaying is completed, thereby protecting the light-emitting device.

Figure 13:
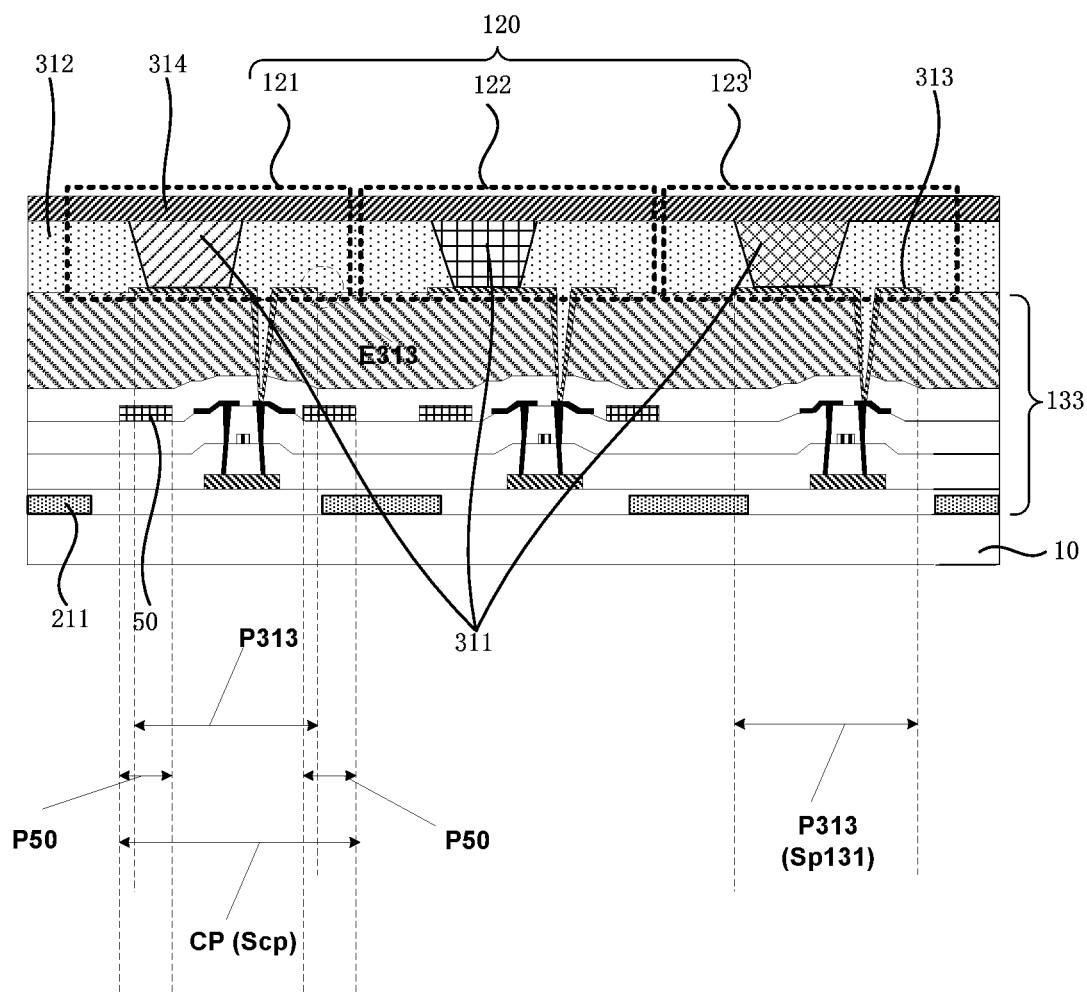
FIG. 13 illustrates a schematic cross-sectional view of another exemplary display panel consistent with disclosed embodiments.

FIG. 13 illustrates a schematic cross-sectional view of another exemplary display panel consistent with disclosed embodiments.

As shown in FIG. 13, the display panel may further include a plurality of light-shielding pads 50 disposed between the organic light-emitting units 120 and the fingerprint recognition units 211. Each organic light-emitting unit 120 may have an inner side facing the viewers and an opposite outer side facing the first substrate 10. A first electrode 313, a light-emitting function layer 311, and a second electrode 314 may be sequentially disposed on the inner side of the organic light-emitting unit 120.

In particular, the first electrode 313 may be reflective electrode. The organic light-emitting unit 120 configured as the light source for the fingerprint recognition unit 211 may correspond to at least one light-shielding pad 50, and the organic light-emitting unit 120 not configured as the light source for the fingerprint recognition unit 211 may not correspond to any light-shielding pads 50.

In one embodiment, as shown in FIG. 13, the organic light-emitting unit 120 configured as the light source for the fingerprint recognition unit 211 may be corresponding to two light-shielding pads 50. For the organic light-emitting unit 120 configured as the light source for the fingerprint recognition unit 211, the area of the combined orthogonal projection (CP) of the first electrode 313 and the two light-shielding pads 50 onto the first substrate 10 may be defined as Scp. For the organic light-emitting unit 120 not configured as the light source for the fingerprint recognition unit 211, the area of the orthogonal projection of the first electrode 313 onto the first substrate 10 may be defined as Sp131. In particular, Scp is larger than Sp131.

For the organic light-emitting unit 120 configured as the light source for the fingerprint recognition unit 211, the combined orthogonal projection (CP) of the first electrode 313 and the light-shielding pads 50 onto the first substrate 10 may be the union of the orthogonal projection (P313) of the first electrode 313 onto the first substrate 10 and the orthogonal projections (P50) of the first electrodes 313 onto the first substrate 10. That is, when X and Y are sets, the union of X and Y includes all the elements in X and all the elements in Y, but without any other elements.

For illustrative purposes, FIG. 13 only shows the combined orthogonal projection (CP) of the first electrode 313 in the red organic light-emitting unit 121 and the two light-shielding pads 50 onto the first substrate 10. The combined orthogonal projection (CP) of the first electrode 313 in the green organic light-emitting unit 122 and the two light-shielding pads 50 onto the first substrate 10 can be similarly drawn.

Further, as shown in FIG. 13, for the organic light-emitting unit 120 configured as the light source for the fingerprint recognition unit 211, the orthogonal projection of the edge (E313) of the first electrode 313 onto the first substrate 10 may fall within the orthogonal projections (P50) of the light-shielding pad 50 onto the first substrate 10. Such an arrangement of the reflective electrode (i.e., the first electrode 313) and the light-shielding pad 50 may be equivalent to extending the reflective electrode (i.e., the first electrode 313) shown in FIG. 10c, i.e., equivalent to remaining the area of the reflective electrode in the blue organic light-emitting unit 123 unchanged while increasing at least one of the area of the reflective electrode in the red organic light-emitting unit 121 and the area of the reflective electrode in the green organic light-emitting unit 122. Thus, for the organic light-emitting unit 120 configured as the light source for the fingerprint recognition unit 211, the stray light may be prevented by the light-shielding pad 50 and the reflective electrode (i.e., the first electrode 313) from being incident onto the fingerprint recognition unit 211.

In one embodiment, as shown in FIG. 13, the display panel may include a first substrate 10 and a plurality of pixel driving circuits 133 disposed on the first substrate 10. The pixel driving circuits 133 may comprise data lines, scanning lines, and capacitive metal plates (not drawn in FIG. 13). The light-shielding pad 50 may be arranged in the same layer as the data line, the scanning line or the capacitive metal plate, simplifying the fabrication process. That is, the light-shielding pad 50 may be fabricated without introducing an extra metal layer, thereby increasing the production efficiency and lowering the fabrication cost.

The light-shielding pad 50 may be made of a metal material or a non-metal material capable of shielding light. The light-shielding pad 50 may prevented the stray light from being incident onto the fingerprint recognition unit 211, thereby improving the accuracy of fingerprint recognition.

It should be noted that, the disclosed embodiments and the features of the disclosed embodiments may be combined under conditions without conflicts, to achieve the purpose of improving the accuracy of fingerprint recognition.

For example, in one embodiment, the reflective electrode of the organic light-emitting unit configured as the light source may be extended outwards and, meanwhile, the pixel driving circuit may be designed to block a portion of the stray light (See FIG. 12b). In another embodiment, the reflective electrode of the organic light-emitting unit configured as the light source may be extended outwards and, meanwhile, the light-shielding pad may be disposed to block a portion of the stray light. In another embodiment, the light-shielding pad may be disposed to block a portion of the stray light and, meanwhile, the pixel driving circuit may be designed to block another portion of the stray light. In another embodiment, the reflective electrode of the organic light-emitting unit configured as the light source may be extended outwards to block a portion of the stray light, the pixel driving circuit may be designed to block another portion of the stray light, and the light-shielding pad may be disposed to block another portion of the stray light.

Figure 14A:
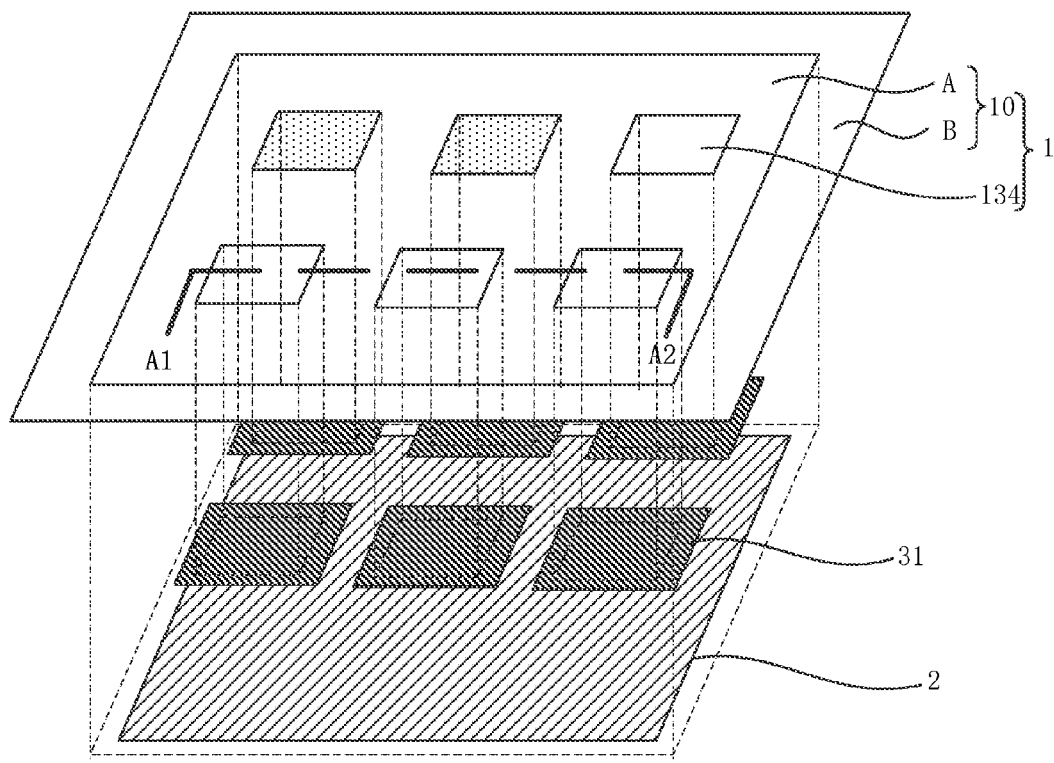
FIG. 14a illustrates a schematic three-dimensional (3D) view of an exemplary display panel consistent with disclosed embodiments.
Figure 14B:
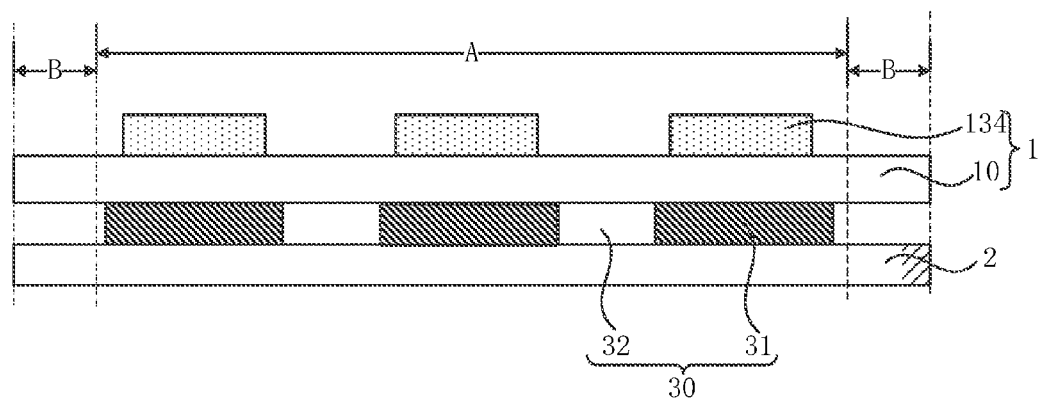
FIG. 14b illustrates a schematic B1-B2 sectional view of an exemplary display panel in FIG. 14a consistent with disclosed embodiments.

In addition, the present disclosure also provides a display panel in which the backlight is configured as a light source of the fingerprint recognition module. FIG. 14a illustrates a schematic three-dimensional view of an exemplary display panel consistent with disclosed embodiments. FIG. 14b illustrates a schematic B1-B2 sectional view of an exemplary display panel in FIG. 14a consistent with disclosed embodiments.

As shown in FIGS. 14a-14b, the display panel may include a display module 1, a fingerprint recognition module 2, and at least one black matrix 30. The display module 1 may include a first substrate 10 and a plurality of pixel circuits 134. The first substrate 10 may include a display region A and a non-display region B surrounding the display region A, and the plurality of pixel circuits 134 may be disposed in the display region A of the first substrate 10. The pixel circuit 134 may include a plurality of thin film transistors (TFTs) (not drawn in FIGS. 14a-14b), and each TFT includes a gate electrode, a source electrode and a drain electrode.

The first substrate 10 may have an inner side facing the TFTs included in the pixel circuits 134 and an opposite outer side, and the fingerprint recognition module 2 may be disposed on the outer side of the first substrate 10 and in the display region A. The black matrix 30 may be disposed between the TFTs (included in the pixel circuit 134) and the fingerprint recognition module 2, and the black matrix 30 may include a plurality of light-shielding regions 31 and a plurality of opening regions (or a light-transparent regions) 32. The opening region 32 may be arranged between the light-shielding regions 31. When being projected onto the first substrate 10, the orthogonal projection of the gate, source, drain electrodes of the TFT (included in the pixel circuit 134) may be disposed within the orthogonal projection of the light-shielding region 31.

In the disclosed embodiments, the black matrix 30 may be disposed between the TFTs (included in the pixel circuit 134) and the fingerprint recognition module 2. The black matrix 30 may include a plurality of light-shielding regions 31 and a plurality of opening regions 32 arranged between the light-shielding regions 31. When being projected onto the first substrate 10, the orthogonal projection of the gate, source, drain electrodes of the TFT may be disposed within the orthogonal projection of the light-shielding region 31.

The light-shielding regions 31 of the black matrix 30 may block the light emitted from the fingerprint recognition module 2, such that the light may be less reflected by the gate, source, drain electrodes of the TFT, the possibility that the light reflected at the gate, source, drain electrodes of the TFT is incident onto the fingerprint recognition module 2 may be reduced, and the corresponding noise in the fingerprint recognition module 2 may be reduced accordingly.

In addition, through arranging a plurality of opening regions 32 in the black matrix 30, the light emitted from the fingerprint recognition module 2 may be transmitted through the opening regions 32 and incident onto a finger pressing the display panel and, meanwhile, the light reflected by the fingerprint of the finger may be transmitted through the opening regions 32. Thus, the signal-to-noise ratio of the fingerprint recognition module may be increased, and the fingerprint recognition accuracy of the fingerprint recognition module may be improved.

In one embodiment, the light-shielding regions 31 of the black matrix 30 may be made of black metal, a black organic material, or a material doped with a black pigment, which may significantly absorb light, facilitating the light absorption of the light emitted from the fingerprint recognition module 2 and incident onto the light-shielding region 31 of the black matrix 30. Thus, the possibility that the light reflected at the gate, source, drain electrodes of the TFT is incident onto the fingerprint recognition module 2 may be further reduced, and the fingerprint recognition accuracy of the fingerprint recognition module may be improved. In one embodiment, the material of the black matrix 30 shading region 31 may include chromium (Cr).

Figure 15:
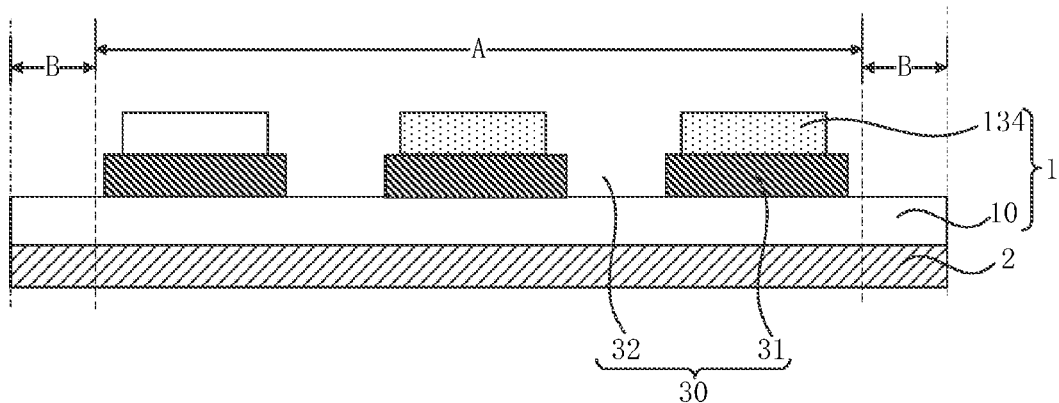
FIG. 15 illustrates a schematic cross-sectional view of another exemplary display panel consistent with disclosed embodiments.
Figure 16:
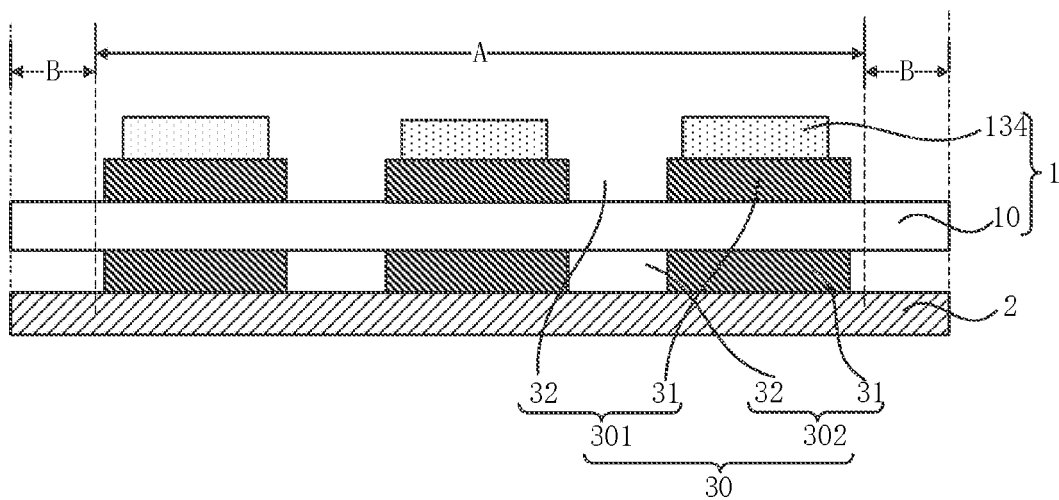
FIG. 16 illustrates a schematic cross-sectional view of another exemplary display panel consistent with disclosed embodiments.

It should be noted that, in FIG. 14b, the black matrix 30 may be disposed between the first substrate 10 and the fingerprint recognition module 2, which is for illustrative purposes and is not intended to limit the scope of the present disclosure. In another embodiment, as shown in FIG. 15, the black matrix 30 may be disposed between the TFTs (included in the pixel circuit 134) and the first substrate 10. In another embodiment, as shown in FIG. 16, the display panel may include two black matrixes 30. A first black matrix 301 may be disposed between the TFTs (included in the pixel circuit 134) and the first substrate 10, and a second black matrix 302 may be disposed between the first substrate 10 and the fingerprint recognition module 2.

In one embodiment, the first substrate 10 may be a rigid substrate made from, for example, quartz or glass. In another embodiment, the first substrate 10 may be a flexible substrate made form, for example, polyimide. Certain exemplary display panels will be described in detail as follows, which is for illustrative purposes and is not intended to limit the scope of the present disclosure.

Figure 17:
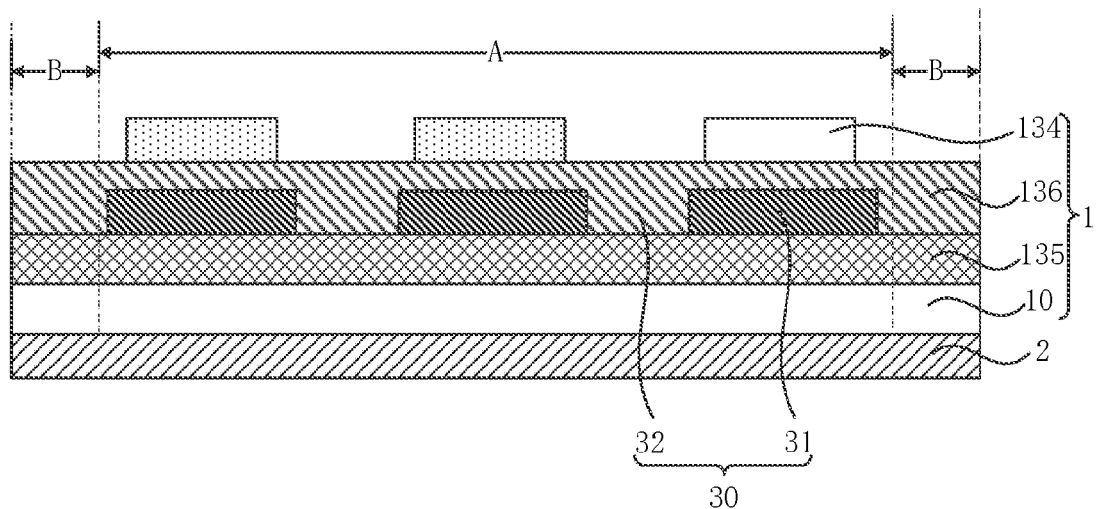
FIG. 17 illustrates a schematic cross-sectional view of another exemplary display panel consistent with disclosed embodiments.

FIG. 17 illustrates a schematic cross-sectional view of another exemplary display panel consistent with disclosed embodiments. As shown in FIG. 17, the display panel may comprise a first substrate 10 which is a rigid substrate, and a black matrix 30 disposed between the TFTs (included in the pixel circuit 134) and the first substrate 10. The display panel may further include a first planarization layer 135 and a second planarization layer 136. The first substrate 10 may have an inner surface facing the black matrix 30 and an opposite outside surface. The first planarization layer 135 may be disposed on the inner surface of the first substrate 10. The black matrix 30 may have an inner surface facing the TFTs (included in the pixel circuit 134) and an opposite outside surface. The second planarization layer 136 may be disposed on the inner surface of the black matrix 30. The second planarization layer 136 may cover the light-shielding regions 31 of the black matrix 30 and fill the opening regions 32 of the black matrix 30.

The first substrate 10 may be made of quartz or glass, and the first substrate 10 may be configured to provide a support in the subsequent fabrication of the pixel circuit 134, and the light-emitting units, etc.

In practice applications, due to the accuracy limitation of the surface polishing of the first substrate 10 and the degree of cleaning of the first substrate 10, the first substrate 10 may have small defects formed on the surface. The first planarization layer 135 may be configured to fill the small defects on the first substrate 10, thereby flattening the surface of the first substrate 10.

Further, in the practical fabrication of the black matrix 30, only the regions determined to be the light-shielding regions 31 of the black matrix 30 on the first substrate 10 may be deposited with a film, while the regions determined to be the opening regions 32 of the black matrix 30 on the first substrate 10 may not be deposited with any film. Thus, after the black matrix 30 is formed on the first substrate 10, the light-shielding regions 31 and the opening regions 32 of the black matrix 30 may exhibit a thickness difference. Then in the subsequent fabrication, a portion of the associated film forming the pixel circuit 134 may be trapped into the opening region 32 of the black matrix 30 and, thus the components in the pixel circuit 134 near the opening area 32 of the black matrix 30 may be displaced, causing a short circuit or open circuit in the pixel circuit 134 and degrading the display performance.

In the disclosed embodiments, through disposing the second planarization layer 136 on the inner surface of the black matrix 30 to cover the light-shielding regions 31 and fill the opening regions 32 of the black matrix 30, the thickness difference between the light-shielding regions 31 and the opening regions 32 of the black matrix 30 may be eliminated. Accordingly, in the subsequent fabrication process, the component displacement in the pixel circuit 134 near the opening area 32 of the black matrix 30 may be suppressed, and the yield of the display panel may be improved. In another embodiment, the second planarization layer 136 may only fill the opening regions 32 of the black matrix 30, i.e., the second planarization layer 136 may not cover the light-shielding regions 31 of the black matrix 30.

The material of the first planarization layer 135 and the second planarization layer 136 may be any appropriate insulating material. In one embodiment, the first planarization layer 135 and the second planarization layer 136 may be made of polyimide, which has stable physical and chemical properties, good electrical insulation, simple production process, and low cost.

Figure 18:
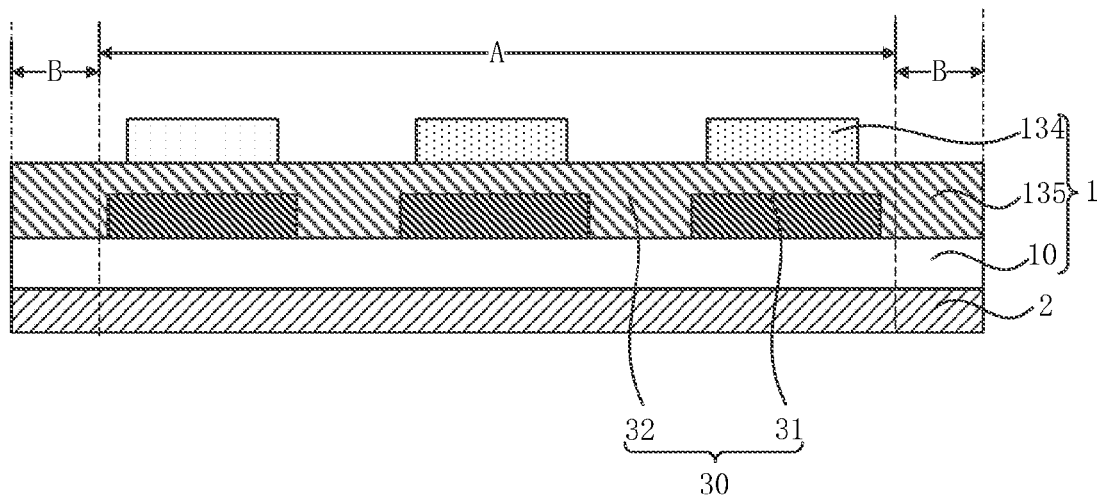
FIG. 18 illustrates a schematic cross-sectional view of another exemplary display panel consistent with disclosed embodiments.

FIG. 18 illustrates a schematic cross-sectional view of another exemplary display panel consistent with disclosed embodiments. As shown in FIG. 18, the display panel may comprise a first substrate 10 which is a rigid substrate, and a black matrix 30 disposed between the TFTs (included in the pixel circuit 134) and the first substrate 10. The display panel may further include a first planarization layer 135. The black matrix 30 may have an inner surface facing the TFTs (included in the pixel circuit 134) and an opposite outside surface. The first planarization layer 135 may be disposed on the inner surface of the black matrix 30. The first planarization layer 135 may cover the light-shielding regions 31 of the black matrix 30 and fill the opening regions 32 of the black matrix 30.

Similar as the display panel shown in FIG. 17, in the display panel in FIG. 18, through disposing the first planarization layer 135 on the inner surface of the black matrix 30 to cover the light-shielding regions 31 and fill the opening regions 32 of the black matrix 30, the thickness difference between the light-shielding regions 31 and the opening regions 32 of the black matrix 30 may be eliminated. Accordingly, in the subsequent fabrication process, the component displacement in the pixel circuit 134 near the opening area 32 of the black matrix 30 may be suppressed, and the yield of the display panel may be improved.

The material of the first planarization layer 135 and the first substrate 10 may be any appropriate insulating material. In one embodiment, the first planarization layer 135 and the first substrate 10 may be made of polyimide, which has stable physical and chemical properties, good electrical insulation, simple production process, and low cost.

Further, in the disclosed display panels, the TFTs forming the pixel circuit 134 may have a top gate structure or a bottom gate structure, which may be determined according to various application scenarios. Certain exemplary display panels will be described in detail as follows, which is for illustrative purposes and is not intended to limit the scope of the present disclosure.

Figure 19:
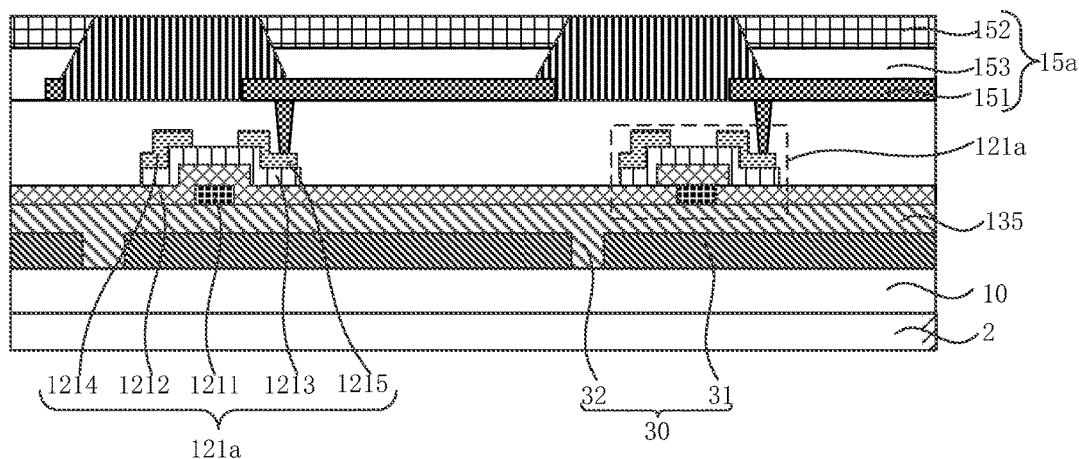
FIG. 19 illustrates a schematic cross-sectional view of another exemplary display panel consistent with disclosed embodiments.

FIG. 19 illustrates a schematic cross-sectional view of another exemplary display panel consistent with disclosed embodiments. The display panel may comprise a plurality of pixel circuits. For illustrative purposes, FIG. 19 merely shows two pixel circuits, each of which includes only one TFT 121a. As shown in FIG. 19, the TFT 121a may have a bottom gate structure, and the TFT 121a may comprise a gate electrode 1211 formed on the first substrate 10, a first insulating layer 1212 formed on the gate electrode 1211, an active layer 1213 formed on the first insulating layer 1212, and a source electrode 1214 and a drain electrode 1215 formed on the active layer 1213.

Figure 20:
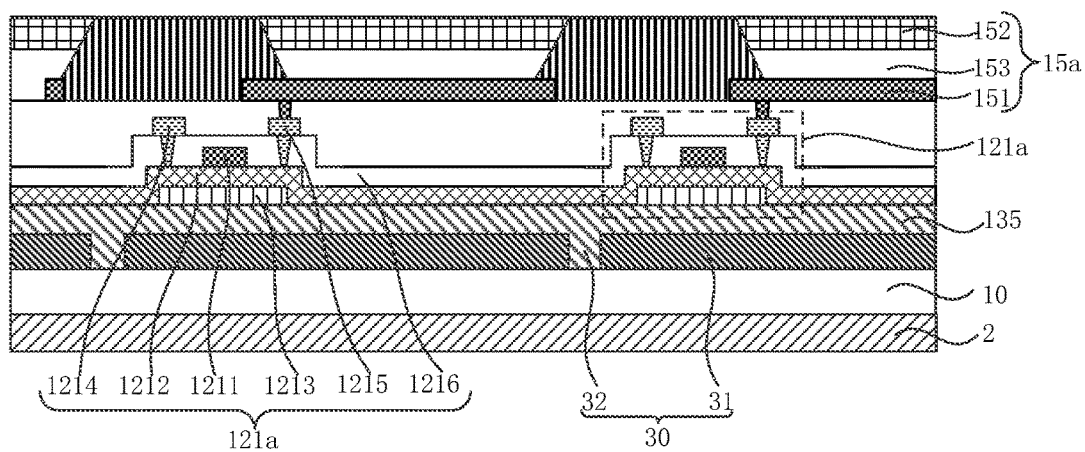
FIG. 20 illustrates a schematic cross-sectional view of another exemplary display panel consistent with disclosed embodiments.

FIG. 20 illustrates a schematic cross-sectional view of another exemplary display panel consistent with disclosed embodiments. The display panel may comprise a plurality of pixel circuits. For illustrative purposes, FIG. 20 merely shows two pixel circuits, each of which includes only one TFT 121a. As shown in FIG. 20, the TFT 121a may have a top gate structure. The TFT 121a may include an active layer 1213 formed on the first substrate 10, a first insulating layer 1212 formed on the active layer 1213, a gate electrode 1211 formed on the first insulating layer 1212, a second insulating layer 1216 formed on the gate electrode 1211, and a source electrode 1214 and a drain electrode 1215 formed on the second insulating layer 1216.

Further, the display module often includes a plurality of light-emitting units. The pixel circuit of the display panel may have an outside surface facing the first substrate 10 and an opposite inner surface, and the plurality of light-emitting units may be disposed on the inner surface of the pixel circuit. The plurality of light-emitting units may be one-to-one corresponding to the plurality of pixel circuits. When the light emitted from the light-emitting unit is directly incident onto the fingerprint sensors in the fingerprint sensor module 2, the noise in the fingerprint sensors in the fingerprint recognition module 2 may also be substantially large, degrading the fingerprint recognition accuracy of the fingerprint recognition module 2.

In certain embodiments, as shown in FIG. 19 or FIG. 20, when being projected onto the first substrate 10, the orthogonal projection of the light-emitting unit 15a may be disposed within the orthogonal projection of the light-shielding region 31. Thus, the light emitted from the light-emitting unit 15a towards the fingerprint recognition module 2 may be blocked by the light-shielding region 31 of the black matrix 30. According, the signal-to-noise ratio of the fingerprint recognition module may be increased, and the fingerprint recognition accuracy of the display panel may be improved.

The display panel may include any appropriate type of display panels capable of displaying videos and/or images, such as plasma display panels, field emission display panels, organic light-emitting diode (OLED) display panels, light-emitting diode (LED) display panels, liquid crystal display (LCD) panels, quantum dots (QDs) display panels, electrophoretic display panels, etc.

In one embodiment, the display panel may be an OLED display panel. As shown in FIG. 19 or FIG. 20, the light-emitting unit 15a may include a first electrode 151, a second electrode 152, and a light-emitting layer 153 sandwiched between the first electrode 151 and the second electrode 152. In certain embodiments, the first electrode 151 may be an anode, the second electrode 152 may be a cathode. In certain other embodiments, the first electrode 151 may be a cathode and the second electrode 152 may be an anode.

In another embodiment, the display panel may be an LCD panel, and the light-emitting unit 12a may be a sub-pixel unit.

Figure 21A:
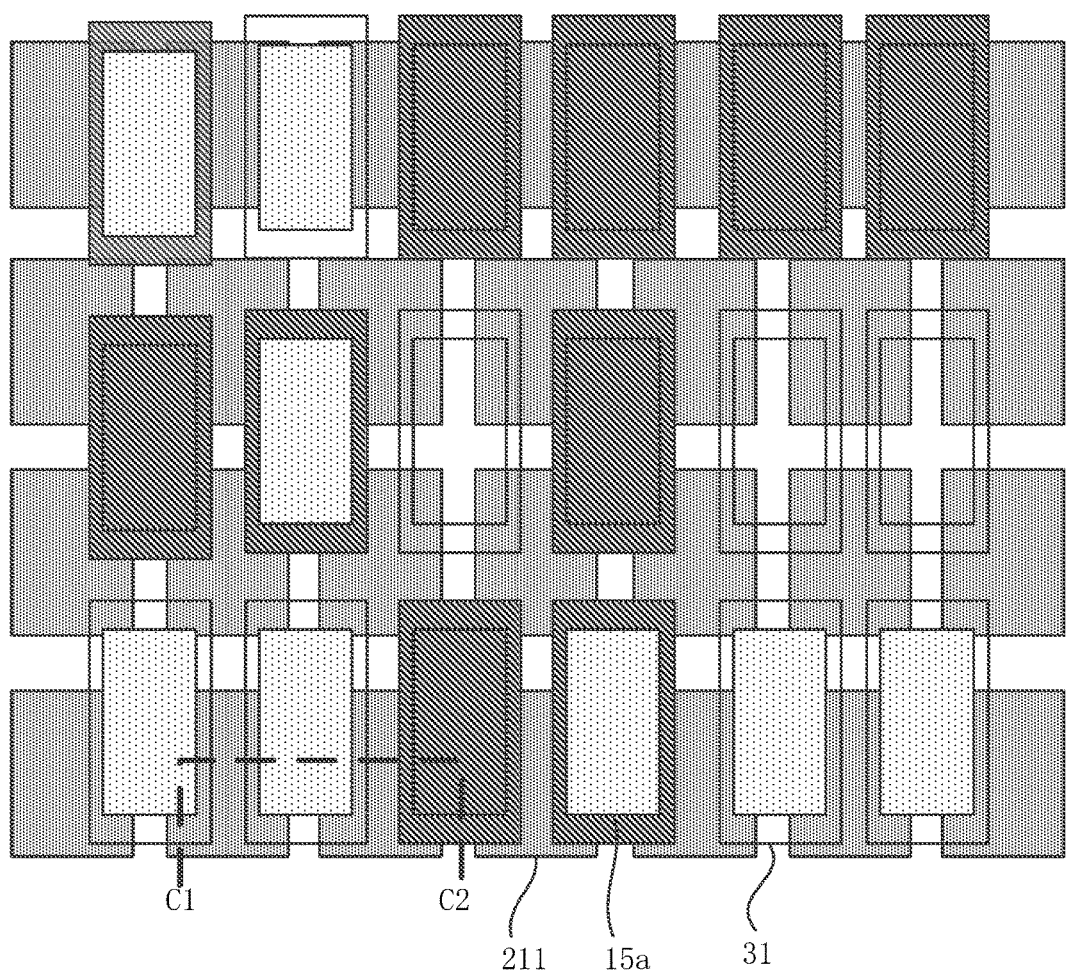
FIG. 21a illustrates a schematic top view of another exemplary display panel consistent with disclosed embodiments.
Figure 21B:
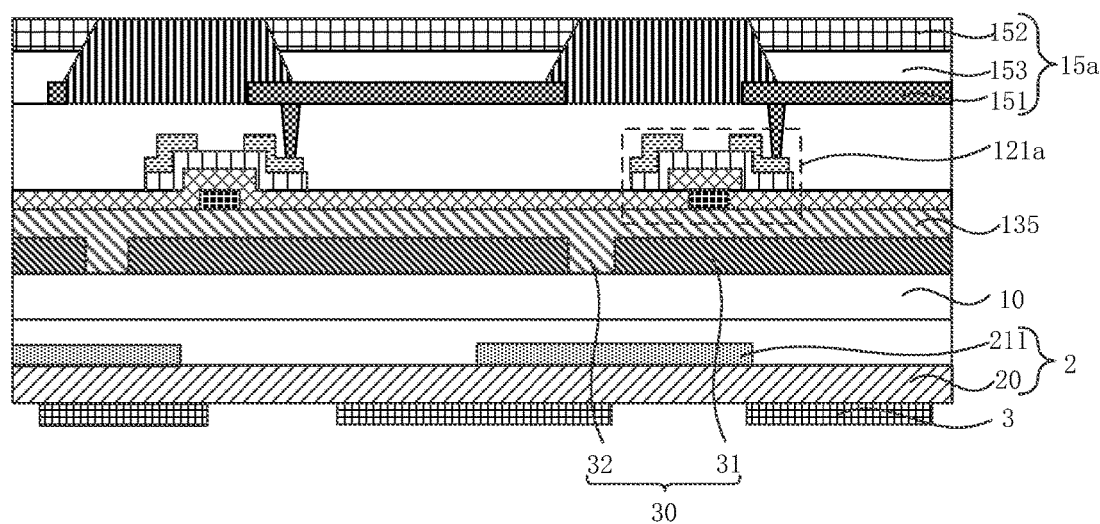
FIG. 21b illustrates a schematic C1-C2 sectional view of another exemplary display panel in FIG. 21a consistent with disclosed embodiments.

FIG. 21a illustrates a schematic top view of another exemplary display panel consistent with disclosed embodiments. FIG. 21b illustrates a schematic C1-C2 sectional view of another exemplary display panel in FIG. 21a consistent with disclosed embodiments.

As shown in FIGS. 21a and 21b, the fingerprint recognition module 2 in the display panel may further comprise a second substrate 20, and a plurality of isolated fingerprint recognition units 211 may be formed on the second substrate 20. The second substrate 20 may have an inner surface facing the first substrate 10 and an opposite outside surface, and the plurality of isolated fingerprint recognition units 211 may disposed on the inner surface of the second substrate 20. When being projected onto the first substrate 10, the orthogonal projection of the fingerprint recognition unit 211 may be at least partially within the orthogonal projection of the opening region 32 of the black matrix 30.

Through configuring the orthogonal projection of the fingerprint recognition unit 211 onto the first substrate 10 to be at least partially within the orthogonal projection of the opening region 32 of the black matrix 30 onto the first substrate 10, the light reflected by the user fingerprint may be less shielded by the light-shielding region 31 of the black matrix 30. Thus, more light may be transmitted through the opening region 32 of the black matrix 30 to be incident onto the fingerprint recognition unit 211, and the signal-to-noise ratio of the fingerprint recognition unit 211 may be increased.

The display panel may further include a backlight source 3, which may be disposed on the outside surface of the second substrate 20. The backlight source 3 in the fingerprint recognition module 2 may be a collimated light source or a planar light source. Compared with surface light source, the collimated light source may reduce the crosstalk between different fingerprint recognition sensors caused by the light reflected by the user fingerprint and, accordingly, improve the accuracy of fingerprint recognition. However, the collimated light source is often thicker than the planar light source, which may increase the thickness of the display panel.

Figure 22:
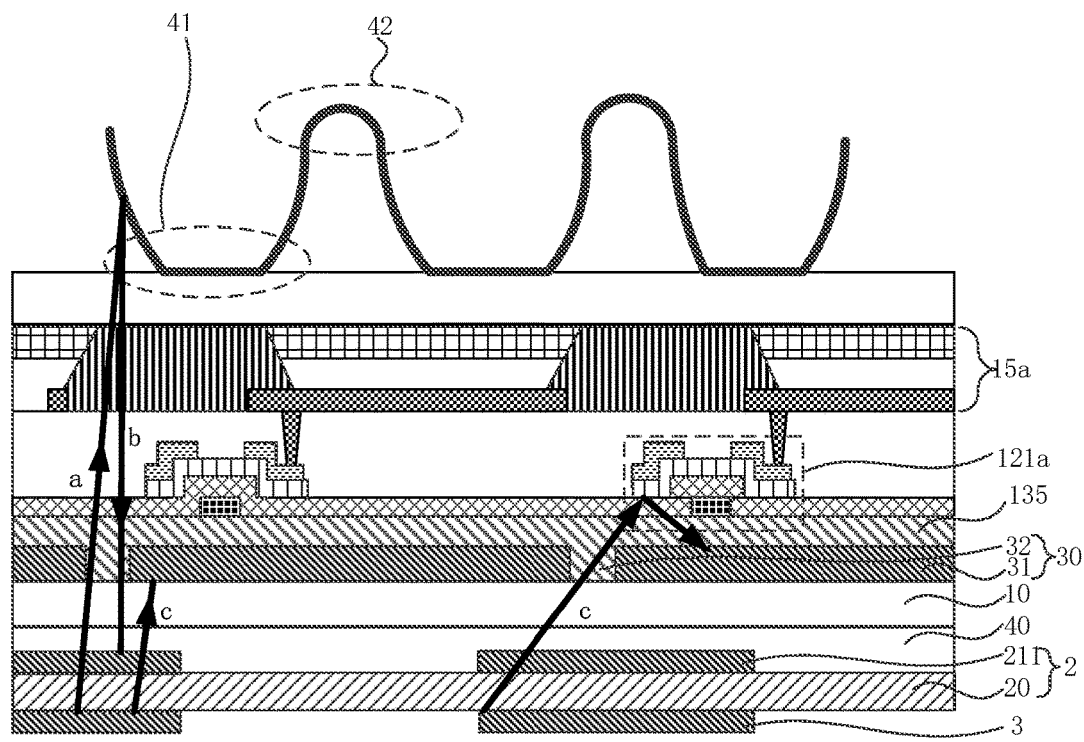
FIG. 22 illustrates a fingerprint recognition principle of an exemplary fingerprint recognition module consistent with disclosed embodiments.

FIG. 22 illustrates a fingerprint recognition principle of an exemplary fingerprint recognition module consistent with disclosed embodiments. The principle of the fingerprint recognition will be described in detail below with reference to FIGS. 9a, 9b and 22. Referring to FIGS. 9a, 9b, and 22, at the fingerprint recognition stage, under the control of a driving chip (not drawn in FIGS. 9a, 9b and 22) electrically connected to the fingerprint sensor, the TFT T in the fingerprint recognition unit 211 may be turned on. When the user finger presses the display panel, the light emitted from the backlight source 3 in the fingerprint recognition module 2 may be divided into two parts: light a and light c. The light a may be transmitted through the opening area 32 of the black matrix 30 and incident onto the finger, forming reflected light b after being reflected by the surface of the fingerprint. The light c may be incident onto the light-shielding region 31 of the black matrix 30 and absorbed. The reflected light b may be incident onto the fingerprint recognition unit 211, received by the photodiode D of the fingerprint recognition unit 211, and converted into a current signal. The converted current signal may be transmitted to the signal detection line Data through the TFT T.

The fingerprint is often composed of a series of ridges 41 and valleys 42 disposed on the skin surface of the fingertip. Because the ridge 41 is in contact with the surface of the display panel while the valley 42 is not in contact with the surface of the display panel, the light reflectance at the valley 42 and the ridge 41 is different. Accordingly, the reflected light b formed at the valley 42 and the reflected light b formed at the ridge 41 may have different light intensity, and the current signals converted from the light intensity of the reflected light b formed at the valley 42 and the ridges 41 may have different magnitude, based on which fingerprint may be recognized.

To prevent the relative displacement of the display module 1 from the fingerprint recognition module 2, and to maintain the good light transmittance of the display panel, in one embodiment, as shown in FIG. 22, the fingerprint recognition module 2 and the first substrate 10 are bonded by a LOCA 40. The materials of the LOCA 40 may include an acrylic material and a silicon-based material.

Further, when the organic light-emitting layer is multi-plexed as the light source of the fingerprint recognition module or an external light source is configured as the light source of the fingerprint recognition module, the present disclosure also provides certain exemplary display panels, in which the light reflected at different positions of the touch object selectively filtered by an angle-limiting film. Thus, the crosstalk caused by the light reflected from different positions of the touch objected to the same fingerprint recognition unit may be suppressed, and the accuracy of the fingerprint recognition may be improved.

An exemplary display panel may comprise a display module, a fingerprint recognition module, and an angle limiting film. The display module may include a first substrate and a plurality of organic light-emitting units disposed on the first substrate. The organic light-emitting unit may have an inner side facing the viewers and an opposite outer side facing the first substrate. The fingerprint recognition module may be disposed on the outer side of the organic light-emitting units. The fingerprint recognition module may comprise a second substrate, and at least one fingerprint recognition unit disposed on the second substrate. The fingerprint recognition unit may be configured to recognize or identify the fingerprint based on the light reflected by the touch object (such as the user finger) to the fingerprint recognition unit.

The angle-limiting film may be disposed between the display module and the fingerprint recognition module. The angle-limiting film may filter out the light, whose incident angle on the angle-limiting film is larger than the transmitting angle of the angle-limiting film, from the light reflected by the touch object (such as the user finger) to the fingerprint recognition unit. In particular, the light transmittance of the light normally (or perpendicularly) incident onto the angle-limiting film is defined as A, and the transmitting angle of the angle-limiting film is defined as the incident angle of the light with kA light transmittance with respect to the angle-limiting film, where $0<k<1$.

In practical applications, the light reflected at different positions of the touch object may be incident onto the same fingerprint recognition unit. For example, the light reflected by the ridge and adjacent valley of the touch object may be incident onto the same fingerprint recognition unit. Thus, the fingerprint recognition unit may be unable to detect the exact locations of the ridge and valley of the fingerprint, which may result serious crosstalk in the fingerprint recognition, and degrade the fingerprint recognition accuracy and sensitivity of the fingerprint recognition sensor.

To address the one or more problems set forth above, in the disclosed embodiments, the angle-limiting film may be disposed between the display module and the fingerprint recognition module, and the angle-limiting film may be configured to filter out the light, whose incident angle on the angle-limiting film is larger than the transmitting angle of the angle-limiting film, from the light reflected by the touch object to the fingerprint recognition unit. Thus, the crosstalk, which is caused by the light reflected at different positions of the touch object (such as the ridge and adjacent valley of the touch object) to the same fingerprint recognition unit, may be suppressed.

That is, because the angle-limiting film is able to selectively filter out the light reflected at different positions of the touch object to the same fingerprint recognition unit, the light with an incident angle larger than the transmitting angle of the angle-limiting film may be filtered by the angle-limiting film. Thus, the crosstalk, which is caused by the light reflected at different positions of the touch object to the same fingerprint recognition unit, may be suppressed, and the fingerprint recognition accuracy and sensitivity may be improved.

Certain exemplary display panels comprising the angle-limiting film will be explained in detail as follows.

Figure 23A:
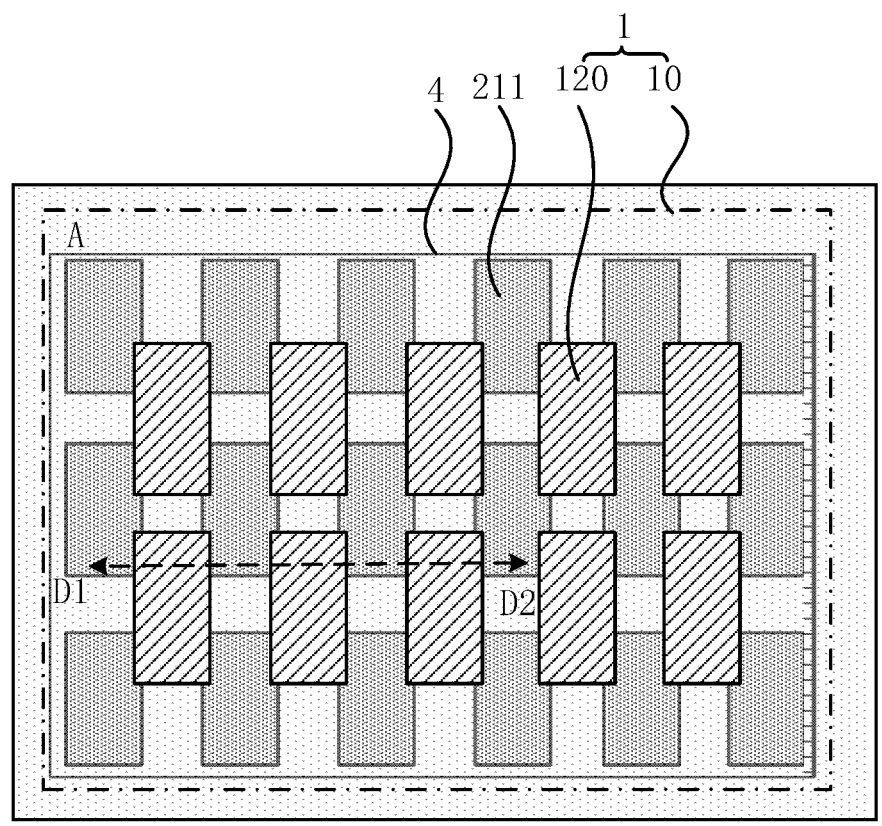
FIG. 23a illustrates a schematic top view of another exemplary display panel consistent with disclosed embodiments.
Figure 23B:
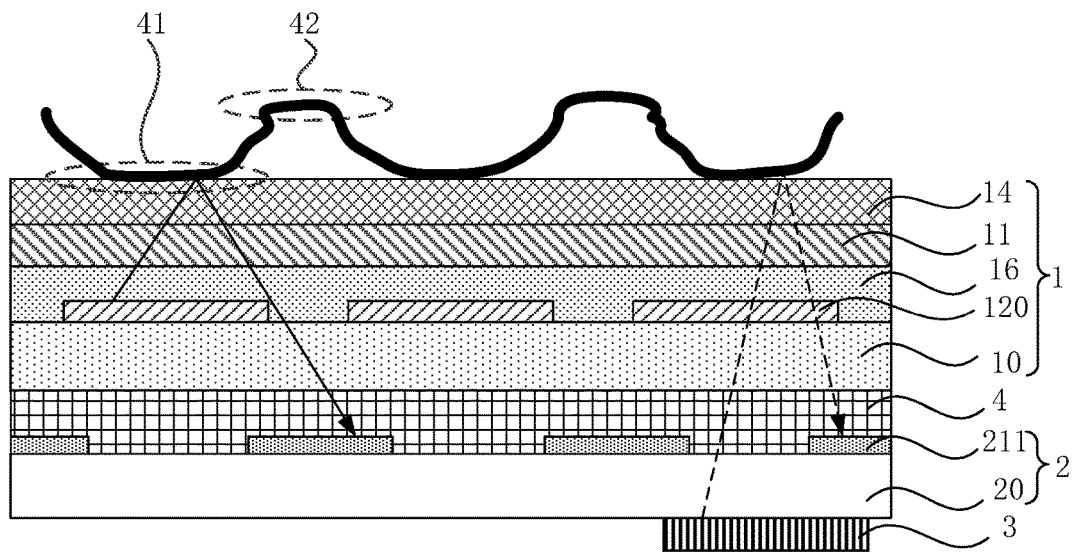
FIG. 23b illustrates a schematic D1-D2 sectional view of another exemplary display panel in FIG. 23a consistent with disclosed embodiments.

FIG. 23a illustrates a schematic top view of another exemplary display panel consistent with disclosed embodiments. FIG. 23b illustrates a schematic D1-D2 sectional view of another exemplary display panel in FIG. 23a consistent with disclosed embodiments.

As shown in FIGS. 23a-23b, the display panel may include a display module 1, a fingerprint recognition module 2, and an angle-limiting film 4. The display module 1 may include a first substrate 10 and a plurality of organic light-emitting units 120 disposed on the first substrate 10. The first substrate 10 may have an inner side facing the organic light-emitting units 120 and an opposite outer side, and the fingerprint recognition module 2 may be disposed on the outer side of the first substrate 10 and in the display region A. The fingerprint recognition module 2 may include a second substrate 20 and at least one fingerprint recognition unit 211 disposed on the second substrate 20. The angle-limiting film 4 may be disposed between the display module 1 and the fingerprint recognition module 2.

The fingerprint recognition module 2 may recognize the fingerprint based on the light reflected by the touch object to the fingerprint recognition unit 211. The angle-limiting film 4 may be able to filter out the light, whose incident angle on the angle-limiting film 4 is larger than the transmitting angle of the angle-limiting film 4, from the light reflected by the touch object to the fingerprint recognition unit 211.

In particular, the light transmittance of the light normally (or perpendicularly) incident onto the angle-limiting film 4 is defined as A, and the transmitting angle of the angle-limiting film 4 is defined as the incident angle of the light with kA light transmittance with respect to the angle-limiting film 4, where 0<k<1. The light, whose incident angle on the angle-limiting film 4 is larger than the transmitting angle of the angle-limiting film 4, may be completely filtered out from the light reflected by the touch object to the fingerprint recognition unit 211, by the angle-limiting film 4.

In one embodiment, k may be configured to be 0.1, i.e., the transmitting angle of the angle-limiting film 4 is defined as the incident angle (with respect to the angle-limiting film 4) of the light with 0.1 A light transmittance.

Referring to FIG. 23b, the light emitted from the light source towards the touch object may correspond to different light sources, for example, the light denoted by the solid arrows in FIG. 23b is emitted from the organic light-emitting unit 120, while the light denoted by the dashed arrows in FIG. 23b is emitted from the backlight source 3. The fingerprint recognition unit 211 may be able to recognize the fingerprint based on the light emitted from any light sources.

The touch object is often a user finger, where the fingerprint is composed of a series of ridges 41 and valleys 42 disposed on the skin surface of the fingertip. Because the ridges 41 and valleys 42 have different distance to the fingerprint recognition unit 211, the light, which is respectively reflected by the ridges 41 and the valley 42 and then received by the fingerprint recognition unit 42, may be different in light intensity. Thus, the current signals converted from the light intensity of the light respectively reflected by the ridges 41 and the valley 42 may be different in magnitude, based on which fingerprint may be recognized.

It should be noted that, the touch object may also be a palm, and the fingerprint recognition unit may realize detection and recognition functions based on the palmprint.

In one embodiment, the organic light-emitting unit 120 may be configured as the light source for the fingerprint recognition module 2, and the fingerprint recognition module 2 may recognize the fingerprint based on the light, which is emitted from the organic light-emitting unit 120 and then reflected by the touch object to the fingerprint recognition unit 211 (such as the solid arrows shown in FIG. 23b). The angle-limiting film 4 may be able to filter out the light, whose incident angle on the angle-limiting film 4 is larger than the transmitting angle of the angle-limiting film 4, from the light emitted from the organic light-emitting unit 120 and then reflected by the touch object to the fingerprint recognition unit 211.

Thus, the crosstalk, which is caused by the light emitted from the organic light-emitting unit 120 and then reflected at different positions of the touch object to the same fingerprint recognition unit 211, may be suppressed. Accordingly, the fingerprint recognition accuracy and sensitivity of the fingerprint recognition module 2 may be improved.

In one embodiment, when the light source for the fingerprint recognition is the organic light-emitting unit 120, for the light reflected perpendicular to the touch body, the light transmitted through the display module 1 and then incident onto the fingerprint recognition unit 211 may be configured to have the light transmittance greater than approximately 1%. When the fingerprint recognition unit 211 recognizes the fingerprint based on the light emitted from the organic light-emitting unit 120, while the light transmittance of the light reflected perpendicular to the touch body then transmitted through the display module 1 and incident onto the fingerprint recognition unit 211 is substantially low, the light intensity received by the fingerprint recognition unit 211 may be substantially low, degrading the accuracy of the fingerprint recognition.

To solve one or more problems set forth above, the thickness of the various films in which the light is transmitted through may be adjusted, such that the light transmittance of the light, which is reflected perpendicular by the touch body and then transmitted through the display module 1 to be incident onto the fingerprint recognition unit 211 may be adjusted, accordingly.

In one embodiment, the display panel may include a light-exiting surface and a non-light-exiting surface. The organic light-emitting unit 120 may have an outer side facing the first substrate 10 and an opposite inner side far away from the first substrate 10. The first substrate 10 have an outer side far away from the organic light-emitting unit 120 and an opposite inner side. The light-exiting surface of the display panel may be arranged at the inner side of the organic light-emitting unit 120, where the inner side of the organic light-emitting unit 120 is arranged far away from the first substrate 10. The non-light-exiting surface of the display panel may be arranged at the outer side of the substrate 10, where the outer side of the substrate 10 is arranged far away from the organic light-emitting unit 120.

When the fingerprint recognition unit 211 recognizes the fingerprint based on the light emitted from the organic light-emitting unit 120, the ratio of the brightness at the light-exiting surface to the brightness at the non-light-exiting surface may be greater than approximately 10:1. The light at the non-light-exiting surface of the display panel may affect the fingerprint recognition, which is performed by the fingerprint recognition unit 211 based on the light emitted from the organic light-emitting unit 120. For example, a crosstalk may be introduced to the light detected by the fingerprint recognition unit 211. When the brightness of the display panel at the non-light-exiting surface is too large, the accuracy of the fingerprint recognition may be significantly reduced.

It should be noted that, FIGS. 23a and 23b show the relative positions of the organic light-emitting unit 120 and the fingerprint recognition unit 211, which is for illustrative purposes and is not intended to limit the scope of the present disclosure. The relative positions of the organic light-emitting unit 120 and the fingerprint recognition unit 211 may be determined according to various application scenarios, as long as the light emitted from the organic light-emitting unit 120 can be reflected to the fingerprint recognition unit 211 by the touch object.

In one embodiment, the display panel may further include a backlight source 3. The second substrate 20 may have an inner side facing the organic light-emitting unit 120 and an opposite outer side, and the backlight source 3 may be disposed on the outer side of the second substrate 20. The fingerprint recognition unit 211 may recognize the fingerprint based on the light, which is emitted from the backlight source 3 and then reflected by the touch object to the fingerprint recognition unit 211 (such as the dashed arrows shown in FIG. 23b).

The angle-limiting film 4 may be able to filter out the light, whose incident angle on the angle-limiting film 4 is larger than the transmitting angle of the angle-limiting film 4, from the light emitted from the backlight source 3 and then reflected by the touch object to the fingerprint recognition unit 211. Thus, the crosstalk, which is caused by the light emitted from the backlight source 3 and then reflected at different positions of the touch object to the same fingerprint recognition unit 211, may be suppressed. Accordingly, the accuracy and sensitivity of the fingerprint recognition may be improved.

In one embodiment, the light emitted from the backlight source 3 may be incident onto the touch object after being transmitted through the gap between two adjacent fingerprint recognition units 211. In one embodiment, when the light source for the fingerprint recognition is the backlight source 3, for the light reflected perpendicular to the touch body, the light transmitted through the display module 1 and then incident onto the fingerprint recognition unit 211 may be configured to have the light transmittance greater than approximately 10%. When the light transmittance of the light, which is reflected perpendicular to the touch body and incident onto the fingerprint recognition unit 211 after being transmitted through the display module 1, is substantially low, the light intensity received by the fingerprint recognition unit 211 may be substantially low, degrading the accuracy of the fingerprint recognition.

Compared to the fingerprint recognition performed by the fingerprint recognition unit 211 based on the light emitted from the organic light-emitting unit 120, during the fingerprint recognition performed by the fingerprint recognition unit 211 based on the light emitted from the backlight source 3, the light emitted from the backlight source 3 may be transmitted through a larger number of films to be incident onto the fingerprint recognition unit 211. A larger number of films may indicate a larger total thickens of the films. Thus, during the fingerprint recognition performed by the fingerprint recognition unit 211 based on the light emitted from the backlight source 3, for the light reflected perpendicular to the touch body, the light transmitted through the display module 1 and then incident onto the fingerprint recognition unit 211 may be desired to have higher light transmittance.

It should be noted that, the position and type of the backlight source 3 is not limited by the present disclosure, the backlight source 3 may be a point light source or a planar light source, as long as the light emitted from the backlight 3 can be reflected to the fingerprint recognition unit 211 by the touch object. Meanwhile, the light indicated by the solid arrow and the dashed arrow in FIG. 23b merely illustrate a certain light beam emitted from the organic light-emitting unit 120 and the backlight 3, however, the light emitted from the organic light-emitting unit 120 and the light source for fingerprint recognition may be divergent.

In addition, the light source for fingerprint recognition is not limited by the present disclosure, as long as the light emitted from the light source for fingerprint recognition can be reflected to the fingerprint recognition unit 211 by the touch object. For example, the light source for fingerprint recognition may be the organic light-emitting unit 120, or may be the backlight 3 which is an external light source rather than being disposed inside the display module.

Figure 24A:
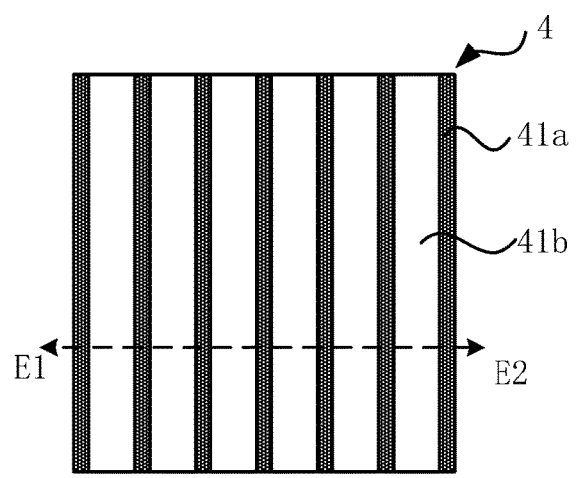
FIG. 24a illustrates a schematic top view of an exemplary angle-limiting film consistent with disclosed embodiments.
Figure 24B:
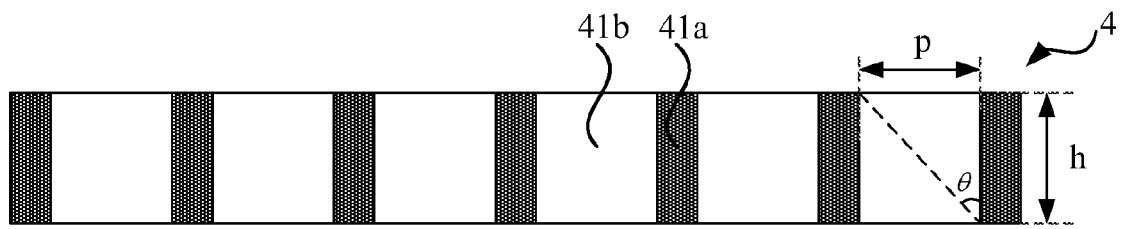
FIG. 24b illustrates a schematic E1-E2 sectional view of an exemplary angle-limiting film in FIG. 24a consistent with disclosed embodiments.

FIG. 24a illustrates a schematic top view of an exemplary angle-limiting film consistent with disclosed embodiments. FIG. 24b illustrates a schematic E1-E2 sectional view of an exemplary angle-limiting film in FIG. 24a consistent with disclosed embodiments.

As shown in FIGS. 24a-24b, the angle-limiting film 4 may include a plurality of opaque regions 41a and light-transparent regions 41b arranged in a plane parallel to the plane of the second substrate 20. The plurality of opaque regions 41a and light-transparent regions 41b may be alternately arranged along a same direction.

Light absorption materials may be disposed in the opaque regions 41a of the angle-limiting film 4. Thus, light incident onto the opaque regions 41a may be absorbed by the light absorption material disposed in the opaque regions 41a. That is, the light reflected by the touch body and then incident onto the opaque regions 41a of the angle-limiting film 4 may not be received by the fingerprint recognition unit 211. In other words, the light reflected by the touch body to the opaque regions 41a of the angle-limiting film 4 may be effectively filter out by the angle-limiting film 4.

As shown in FIG. 24b, because the light incident onto the opaque regions 41a is absorbed by the light absorption material, the transmitting angle of the angle-limiting film 4 may be configured to satisfy the following equation:

$$\theta = \arctan\frac{p}{h}, \qquad (1)$$

where $\theta$ is transmitting angle of the angle-limiting film 4, p is the width of the light-transparent region 41b in the direction where the light transmission regions 41b are arranged, and h is the thickness of the angle-limiting film 4. As shown in FIG. 24b, $\theta$, p, and h have a relationship indicated by Eq (1) and, thus, the transmitting angle of the angle-limiting film 4 may satisfy the Eq (1).

Because the light incident onto the opaque region 41*a* is absorbed by the light absorption material in the opaque region 41*a*, the light having an incident angle (onto the angle-limiting film 4) larger than the calculated transmitting angle of the angle-limiting film 4 may be filtered by the angle-limiting film 4. The light having an incident angle (onto the angle-limiting film 4) larger than the calculated transmitting angle of the angle-limiting film 4 may not be desired for fingerprint recognition.

Through configuring the angle-limiting film 4 in the display panel, the light having an incident angle (onto the angle-limiting film 4) larger than the calculated transmitting angle of the angle-limiting film 4 may be prevented from being incident onto the fingerprint recognition unit 211, thereby suppressing the interference in the fingerprint recognition.

In one embodiment, when the angle-limiting film 4 includes a plurality of opaque regions 41*a* and light-transparent regions 41*b* arranged in a plane parallel to the plane of the second substrate 20, in which the plurality of opaque regions 41*a* and light-transparent regions 41*b* are alternately arranged along a same direction and the light absorption materials are disposed in the opaque regions 41*a*, the diffusing distance of the angle-limiting film 4 may be configured to satisfy the following equation:

$$\Delta X = \frac{p \cdot (H+h)}{h}, \quad (2)$$

where $\Delta X$ is the diffusing distance of the angle-limiting film 4, H is the thickness of the display module 1.

The diffusing distance of the angle-limiting film 4 refers to the distance between two reflection points on the touch object, at which the actually detected light (e.g., fingerprint signal light) and the disturbed light (e.g., fingerprint noise light) corresponding to the same fingerprint recognition unit 211 are reflectively reflected. That is, one reflection point corresponds to the actually detected light (e.g., fingerprint signal light), and the other reflection point corresponds to the disturbed light (e.g., fingerprint noise light), in which the actually detected light (e.g., fingerprint signal light) and the disturbed light (e.g., fingerprint noise light) is going to be received by the same fingerprint recognition unit 211.

The actually detected light is defined as the reflected light (i.e., the light reflected by the touch object) which has the smallest incident angle onto the fingerprint recognition unit 211. The disturbed light is defined as the reflected light (i.e., the light reflected by the touch object) which has a larger incident angle onto the fingerprint recognition unit 211 than the actually detected light.

Figure 24C:
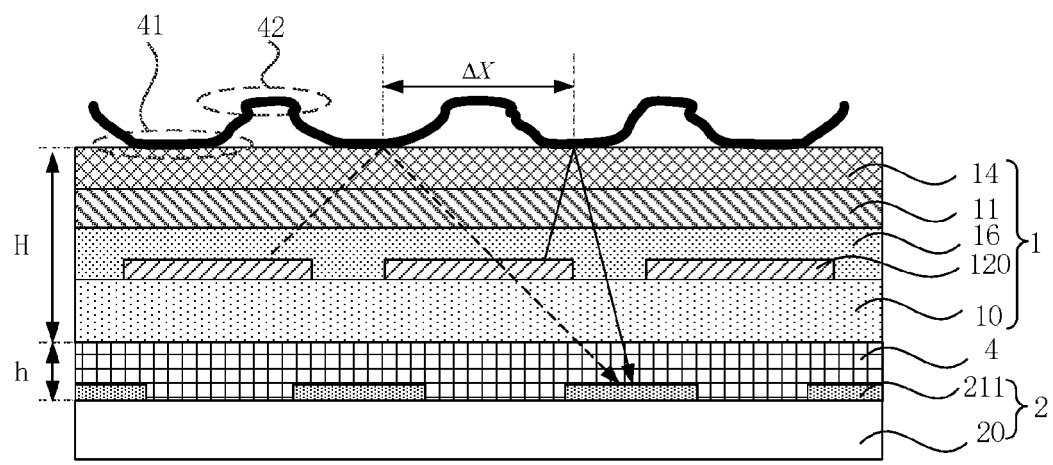
FIG. 24c illustrates a schematic cross-sectional view of another exemplary display panel consistent with disclosed embodiments.

FIG. 24*c* illustrates a schematic cross-sectional view of another exemplary display panel consistent with disclosed embodiments.

As shown in FIG. 24*c*, the fingerprint recognition unit 211 may recognize the fingerprint based on the light, which is emitted from the organic light-emitting unit 120, then reflected by the touch object to the fingerprint recognition unit 211. The light denoted by the solid arrow in FIG. 24*c* may be the reflected light (i.e., the light reflected by the touch object) which has the smallest incident angle onto the fingerprint recognition unit 211, i.e., the actually detected light. The light denoted by the dashed arrow in FIG. 24*c* may be the reflected light (i.e., the light reflected by the touch object) which has a larger incident angle onto the fingerprint recognition unit 211 than the actually detected light, i.e., the disturbed light.

Without the angle-limiting film 4, the actually detected light and the disturbed light, which is the reflected light formed at different positions of the touch object, such as two adjacent ridges 41, may be incident onto the same fingerprint recognition unit 211. That is, interference may be generated in the fingerprint recognition process.

Figure 24D:
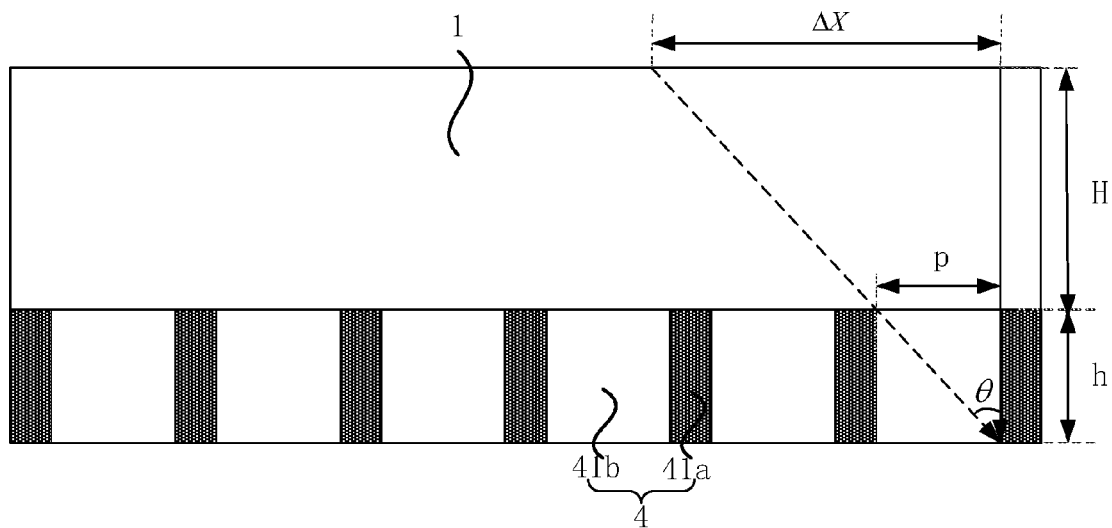
FIG. 24d illustrates a diffusing distance of an exemplary angle-limiting film in FIG. 24a consistent with disclosed embodiments.

FIG. 24*d* illustrates a diffusing distance of an exemplary angle-limiting film in FIG. 24*a* consistent with disclosed embodiments. Referring to FIG. 24*c* and FIG. 24*d*, the diffusing distance $\Delta X$ of the angle-limiting film 4 refers to the distance between two reflection points on the touch object, at which the actually detected light (e.g., fingerprint signal light) and the disturbed light (e.g., fingerprint noise light) corresponding to the same fingerprint recognition unit 211 are reflectively reflected.

The incident angle of the actual detected light onto the fingerprint recognition unit 211 may be approximately 0°. For the disturbed light which could be transmitted through the angle-limiting film 4, the incident angle onto the fingerprint recognition may have a minimum value as the transmitting angle of the angle-limiting film 4. Thus, $$\tan\theta = \frac{p}{h} = \frac{\Delta X}{H+h},$$

and the diffusing distance of the angle-limiting film 4 may also satisfy this question. A larger diffusing distance of the angle-limiting film 4 may indicate a lower accuracy and sensitivity of the fingerprint recognition in the display panel.

Figure 24E:
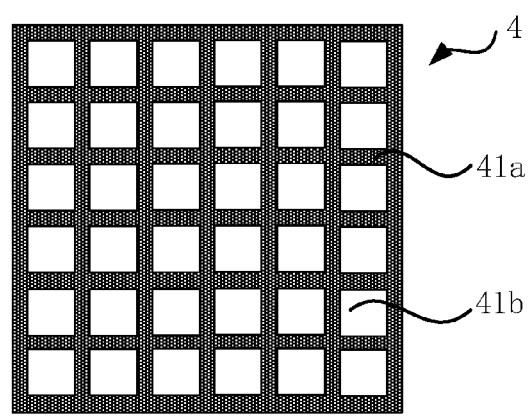
FIG. 24e illustrates a schematic top view of another exemplary angle-limiting film consistent with disclosed embodiments.

The angle-limiting film 4 in FIG. 24*a* may be arranged in a one-dimensional (1D) structure, in which the light-transparent regions 41*b* and the opaque regions 41*a* are alternately arranged in the horizontal direction. In another embodiment, the angle-limiting film 4 may be arranged in a two-dimensional (2D) structure. FIG. 24*e* illustrates a schematic top view of another exemplary angle-limiting film consistent with disclosed embodiments. As shown in FIG. 24*e*, the light-transparent regions 41*b* and the opaque regions 41*a* may be alternately arranged in both the horizontal direction and the vertical direction.

As compared to the angle-limiting film 4 having the 1D structure in FIG. 24*a*, the angle-limiting film 4 having the 2D structure in FIG. 24*e* may be able to selectively filter the light incident onto the angle-limiting film 4 from every direction.

Figure 25A:
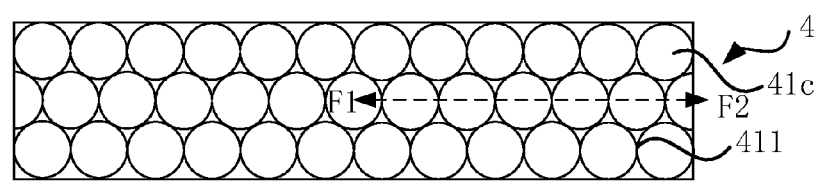
FIG. 25a illustrates a schematic top view of another exemplary angle-limiting film consistent with disclosed embodiments.
Figure 25B:
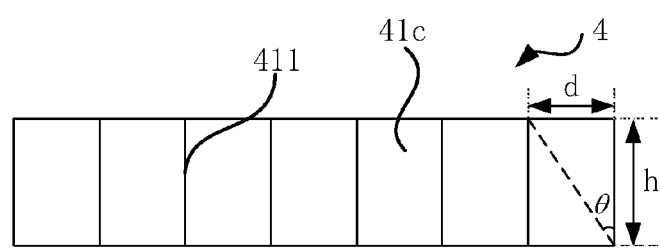
FIG. 25b illustrates a schematic F1-F2 sectional view of another exemplary angle-limiting film in FIG. 25a consistent with disclosed embodiments.

FIG. 25*a* illustrates a schematic top view of another exemplary angle-limiting film consistent with disclosed embodiments. FIG. 25*b* illustrates a schematic F1-F2 sectional view of another exemplary angle-limiting film in FIG. 25*a* consistent with disclosed embodiments.

As shown in FIGS. 25*a*-25*b*, the angle-limiting film 4 may have a porous structure including a plurality of through-holes 41*c*, and the side wall 411 of the through-holes 41*c* may absorb the light incident on the side wall 411. That is, the light absorbed by the side wall 411 of the through-holes 41*c* may be no longer incident onto the fingerprint recognition unit 211.

In one embodiment, the porous structure 41*c* may be a glass capillary structure in which a light absorption material in black may be coated on the side wall 411 of the glass capillary, such that that the side wall 411 may absorb the light incident onto the side wall 411. That is, the light may be partially filtered by the angle-limiting film 4.

In one embodiment, the light absorption material may be provided between the adjacent through-holes 41c in the porous structure. In another embodiment, the light absorption material may not be provided between the adjacent through-holes 41c in the porous structure.

In particular, because the side wall 411 of the through-holes 41c is capable of absorbing light incident onto the side wall 411, the transmitting angle of the angle-limiting film 4 may satisfy the following formula:

$$\theta = \arctan\frac{d}{h}, \quad (3)$$

where θ is transmitting angle of the angle-limiting film 4, d is the diameter of the through-hole 41c, and h is the thickness of the angle-limiting film 4. As shown in FIG. 25b, θ, d, and h have a relationship indicated by Eq (3) and, thus, the transmitting angle of the angle-limiting film 4 may satisfy the Eq (3).

Meanwhile, because the side wall 411 of the through-holes 41c is able to absorb light incident onto the side wall 411, the diffusing distance of the angle-limiting film 4 may be configured to satisfy the following equation:

$$\Delta X = \frac{d \cdot (H + h)}{h}, \quad (4)$$

where ΔX is the diffusing distance of the angle-limiting film 4, and H is the thickness of the display module 1.

Eq (4) may be derived similarly to Eq (2), i.e. the diffusing distance of the angle-limiting film 4 shown in FIG. 24a, which is not repeated here. Similarly, a larger diffusing distance of the angle-limiting film 4 may indicate a lower accuracy and sensitivity of the fingerprint recognition in the display panel.

Figure 25C:
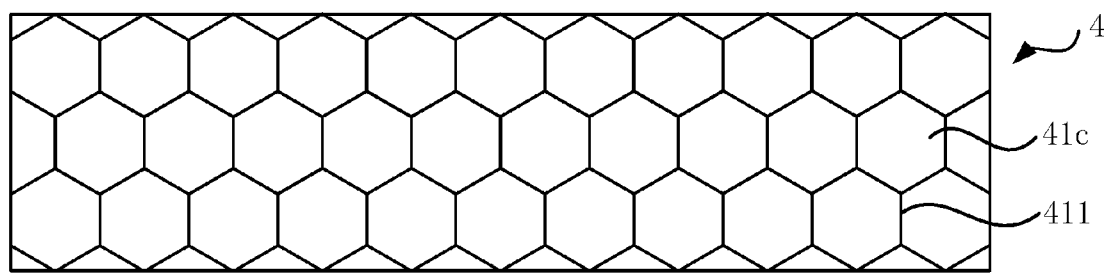
FIG. 25c illustrates a schematic top view of another exemplary angle-limiting film consistent with disclosed embodiments.

It should be noted that, from a top view of the angle-limiting film 4, the aperture of the through-hole 41c included in the porous structure may have a circular shape as shown in FIG. 25a, or have a hexagonal shape as shown in FIG. 25c, which is not limited by the present disclosure. In practical applications, the aperture of the through-hole 41c included in the porous structure may have any appropriate shapes according to various application scenarios.

Figure 26A:
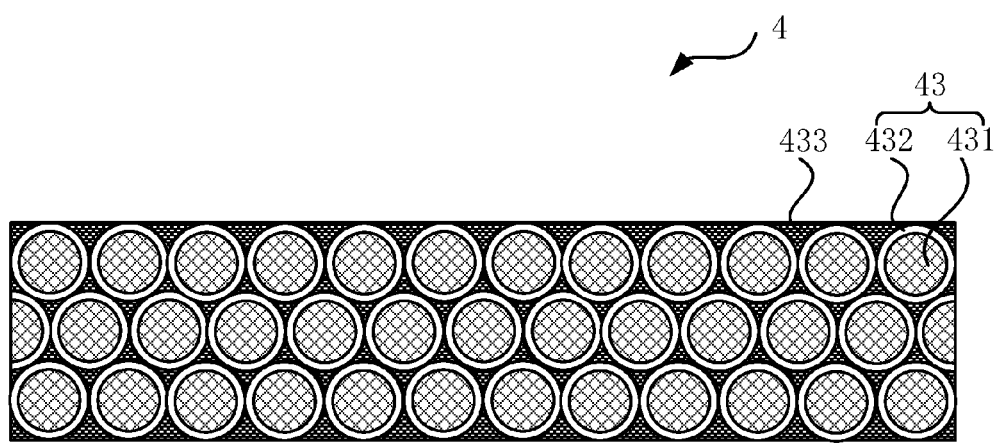
FIG. 26a illustrates a schematic top view of another exemplary angle-limiting film consistent with disclosed embodiments.
Figure 26B:
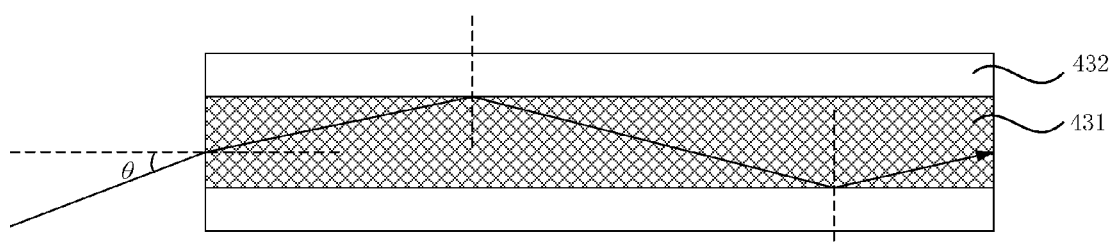
FIG. 26b illustrates a schematic cross-sectional view along an extending direction of optical fibers in an exemplary angle-limiting film in FIG. 26a consistent with disclosed embodiments.

FIG. 26a illustrates a schematic top view of another exemplary angle-limiting film consistent with disclosed embodiments. As shown in FIG. 26a, the angle-limiting film 4 may include a plurality of optical fibers 43 arranged in parallel and extending in a same direction. FIG. 26b illustrates a schematic cross-sectional view along an extending direction of optical fibers in an exemplary angle-limiting film in FIG. 26a consistent with disclosed embodiments.

As shown in FIGS. 26a-26b, each optical fiber 43 may include a core 431 and a clad 432, and a light absorption material 433 may be provided between any two adjacent optical fibers 43. When the light emitted from the optical fiber 43 is incident onto regions between two adjacent optical fibers 43, the light absorption material 433 may absorb the incident light. That is, the light may be partially filtered by the angle-limiting film 4.

In particular, the refractive index of the core 431 and the clad 432 of the optical fiber 43 is different, the transmitting angle of the angle-limiting film 4 may satisfy the following formula:

$$n \cdot \sin\theta = \sqrt{n_{core}^2 - n_{clad}^2}, \quad (5)$$

where θ is transmitting angle of the angle-limiting film 4, n is the refractive index of the film layer in the display module 1 that is in contact with the angle-limiting film 4, $n_{core}$ is the refractive index of the core 431 of the optical fiber 43, and $n_{clad}$ is the refractive index of the clad 432 of the optical fiber 43.

As shown in FIG. 26b, for the light reflected by the touch object, when the incident angle onto the angle-limiting film 4 is larger than the transmitting angle θ of the angle-limiting film 4, the light may not undergo the total internal reflection (TIR) in the optical fiber 43, i.e., the light may be transmitted through the optical fiber 43, and then absorbed by the light absorption material 433 disposed between any two adjacent optical fibers 43 in the angle-limiting film 4. That is, the light transmitted through the optical fiber 43 may be filtered by the angle-limiting film 4, and may be no longer incident onto the fingerprint recognition unit 211.

In other words, the angle-limiting film 4 may effectively filter out the light, whose incident angle on the angle-limiting film is larger than the transmitting angle θ of the angle-limiting film 4, from the light reflected by the touch object (such as the user finger) to the fingerprint recognition unit 211. Thus, the crosstalk, which is caused by the light emitted from the backlight source 3 and then reflected at different positions of the touch object to the same fingerprint recognition unit 211, may be suppressed. Accordingly, the accuracy and sensitivity of the fingerprint recognition may be improved.

When the angle-limiting film 4 includes a plurality of optical fibers 43 arranged in parallel and extending in a same direction, the refractive index of the core 431 and the clad 432 of the optical fiber 43 is different, and the light absorption material 433 is provided between any two adjacent optical fibers 43, the diffusing distance of the angle-limiting film 4 may be configured to satisfy the following equation:

$$\Delta X = H \cdot \tan\theta, \quad (6)$$

where ΔX is the diffusing distance of the angle-limiting film 4, and H is the thickness of the display module 1.

Figure 26C:
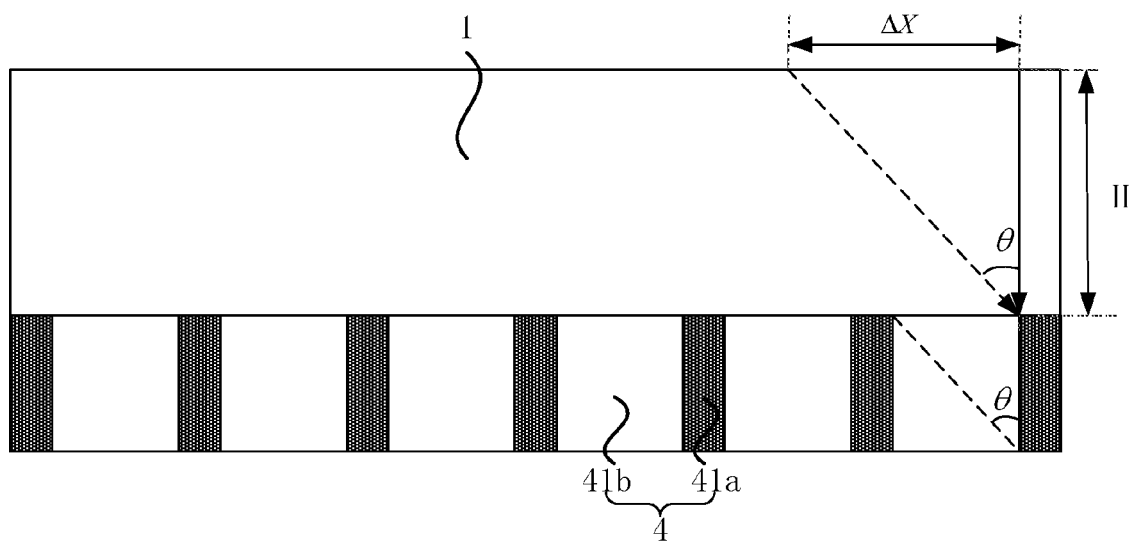
FIG. 26c illustrates a diffusing distance of another exemplary angle-limiting film in FIG. 26a consistent with disclosed embodiments.

As shown in FIG. 26c, the incident angle of the actual detected light onto the fingerprint recognition unit 211 may be approximately 0°. For the disturbed light which could be transmitted through the angle-limiting film 4, the incident angle onto the fingerprint recognition may have a minimum value as the transmitting angle of the angle-limiting film 4, i.e., the critical angle of the total internal reflection of in the optical fiber 43. Thus, $$\tan\theta = \frac{\Delta X}{H}.$$

A larger diffusing distance of the angle-limiting film 4 may indicate a lower accuracy and sensitivity of the fingerprint recognition in the display panel.

Figure 27A:
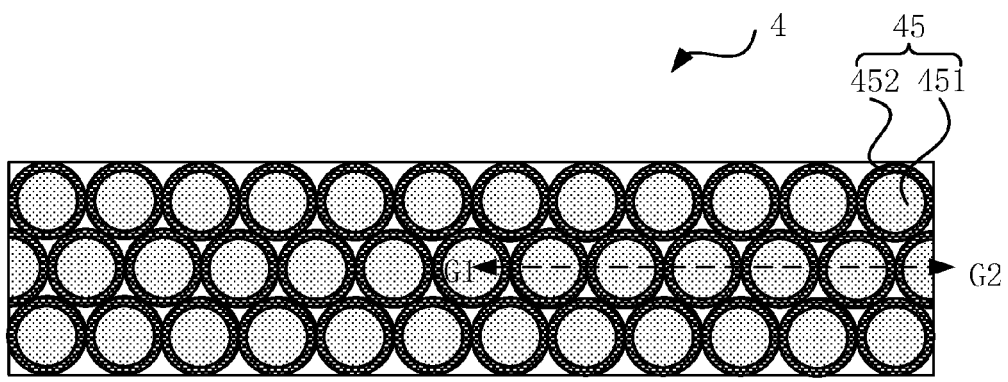
FIG. 27a illustrates a schematic top view of another exemplary angle-limiting film consistent with disclosed embodiments.
Figure 27B:
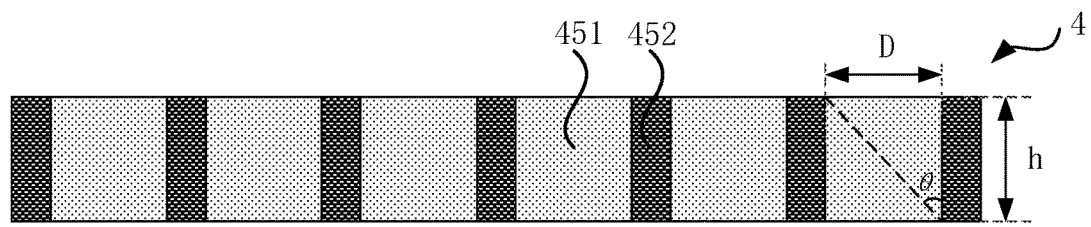
FIG. 27b illustrates a schematic G1-G2 sectional view of another exemplary angle-limiting film in FIG. 27a consistent with disclosed embodiments.

FIG. 27a illustrates a schematic top view of another exemplary angle-limiting film consistent with disclosed embodiments. FIG. 27b illustrates a schematic G1-G2 sectional view of another exemplary angle-limiting film in FIG. 27a consistent with disclosed embodiments.

As shown in FIGS. 27a-27b, the angle-limiting film 4 may include a plurality of pillars 43 arranged in parallel and extending in a same direction. Each pillar 43 may include a core 451 and a clad 452 with the same refractive index. The material forming the clad 452 may include a light absorption material, such that the light transmitted through the core 451 and then incident onto the clad 452 may be absorbed by the clad 452. That is, the light transmitted through the core 451 and then incident onto the clad 452 may be no longer incident onto the fingerprint recognition unit 211. Further, a light absorption material 433 may be provided or not provided between any two adjacent pillars 45.

In particular, the light transmitted through the core 451 and then incident onto the clad 452 may be absorbed by the clad 452, the transmitting angle of the angle-limiting film 4 may satisfy the following formula:

$$\theta = \arctan\frac{D}{h}, \quad (7)$$

where θ is transmitting angle of the angle-limiting film 4, D is the diameter of the core 451, and h is the thickness of the angle-limiting film 4. As shown in FIG. 27b, θ, D, and h have a relationship indicated by Eq (7) and, thus, the transmitting angle of the angle-limiting film 4 may satisfy the Eq (7).

When the angle-limiting film 4 includes the plurality of pillars 43 arranged in parallel and extending in a same direction, each pillar 43 includes a core 451 and a clad 452 with the same refractive index, and the material forming the clad 452 includes a light absorption material, the diffusing distance of the angle-limiting film 4 may be configured to satisfy the following equation:

$$\Delta X = \frac{D \cdot (H + h)}{h}, \quad (8)$$

where ΔX is the diffusing distance of the angle-limiting film 4, H is the thickness of the display module 1.

Eq (8) may be derived similarly to Eq (2), i.e. the diffusing distance of the angle-limiting film 4 shown in FIG. 24a, which is not repeated here. Similarly, a larger diffusing distance of the angle-limiting film 4 may indicate a lower accuracy and sensitivity of the fingerprint recognition in the display panel.

It should be noted that, from a top view of the angle-limiting film 4, the aperture of the pillar 45 included in the angle-limiting film 4 may have a circular shape as shown in FIG. 27a. In practical applications, the aperture of the pillar 45 may have any appropriate shapes according to various application scenarios, which is not limited by the present disclosure.

In one embodiment, the angle-limiting film 4 may have a diffusing distance of approximately less than 400 μm. When the diffusing distance of the angle-limiting film 4 increases, the distance between two reflection points on the touch object, at which the actually detected light and the disturbed light corresponding to the same fingerprint recognition unit 211 are respectively reflected, may increase accordingly. When the distance between two reflection points on the touch object, at which the actually detected light and the disturbed light corresponding to the same fingerprint recognition unit 211 are respectively reflected, is larger than the distance between the valley 42 and the adjacent ridge 41 in the fingerprint, errors may be generated in the fingerprint recognition process. Thus, the fingerprint may not be successfully recognized, and the accuracy of the fingerprint recognition may be significantly degraded.

In one embodiment, the organic light-emitting unit 120 may be configured as the light source for the fingerprint recognition module 2, and the fingerprint recognition unit 211 may recognize the fingerprint based on the light, which is emitted from the organic light-emitting unit 120 and then reflected to the fingerprint recognition unit 211 by the touch object. At the fingerprint recognition stage, within a range of twice the diffusing distance of the angle-limiting film 4, only one organic light-emitting unit 120 may be configured to be emit light.

Thus, the probability that the light emitted from different organic light-emitting units 120 is reflected to the same fingerprint recognition unit 211 by different positions of the touch object may be significantly reduced. The crosstalk, which is caused by the light emitted from the organic light-emitting units 120 and then reflected by different positions of the touch object to the same fingerprint recognition unit 211, may be suppressed. Accordingly, the accuracy and sensitivity of the fingerprint recognition may be improved.

In one embodiment, an optical adhesive layer (e.g., formed of LOCA) may be provided between the fingerprint recognition module 2 and the angle-limiting film 4, for bonding the fingerprint recognition module 2 to the angle-limiting film 44. The fingerprint recognition unit 211 may include an optical fingerprint sensor capable of detecting and recognizing the fingerprint based on the light reflected by the touch object. The material forming the fingerprint recognition unit 211 may include, for example, amorphous silicon or gallium arsenide or arsenide sulfide, or other light absorption materials, which is not limited by the present disclosure.

In one embodiment, as shown in FIGS. 23b and 24c, the display panel may also include a thin film encapsulation layer 16, a first polarizer 11 and a cover glass 14 sequentially disposed on the organic light-emitting units 120. The second substrate 20, which is the substrate of the fingerprint recognition unit 211, may be a glass substrate or a flexible substrate. The cover glass 14 may be attached to the first polarizer 11 by liquid optical clear adhesive (LOCA).

In one embodiment, the display panel may also include a touch control electrode layer which may be disposed between the thin film encapsulation layer 16 and the first polarizer 11. In another embodiment, the display panel may also include a touch control electrode layer which may be disposed between the cover glass 14 and the first polarizer 11. The display panel integrated with the touch control electrodes may have the touch control function in addition to the display function.

It should be noted that, the accompanying drawings illustratively show the size of various elements and the thickness of various layers, but do not represent the actual dimensions of the various elements and various layers in the display panel.

In the disclosed embodiments, the angle-limiting film 4 may be disposed between the display module 1 and the fingerprint recognition module 2. The angle-limiting film 4 may be able to filter out the light, whose incident angle on the angle-limiting film 4 is larger than the transmitting angle of the angle-limiting film 4, from the light reflected by the touch object to the fingerprint recognition unit 211. That is, the angle-limiting film 4 may be able to selectively filter the light reflected at different positions of the touch object to the same fingerprint recognition unit 211. Thus, the crosstalk, which is caused by the light reflected at different positions of the touch object to the same fingerprint recognition unit 211, may be suppressed, and the fingerprint recognition accuracy and sensitivity may be improved.

Further, in an existing display device with a fingerprint recognition function, the light emitted from the light sources for the fingerprint recognition is reflected by the finger to a plurality of fingerprint recognition units. Thus, in addition to receiving a fingerprint signal from the corresponding position, each fingerprint recognition unit also receives fingerprint signals from other positions, degrading the accuracy of the fingerprint recognition.

To solve one or more problems set forth above, the present disclosure provides an improved display panel.

Figure 28A:
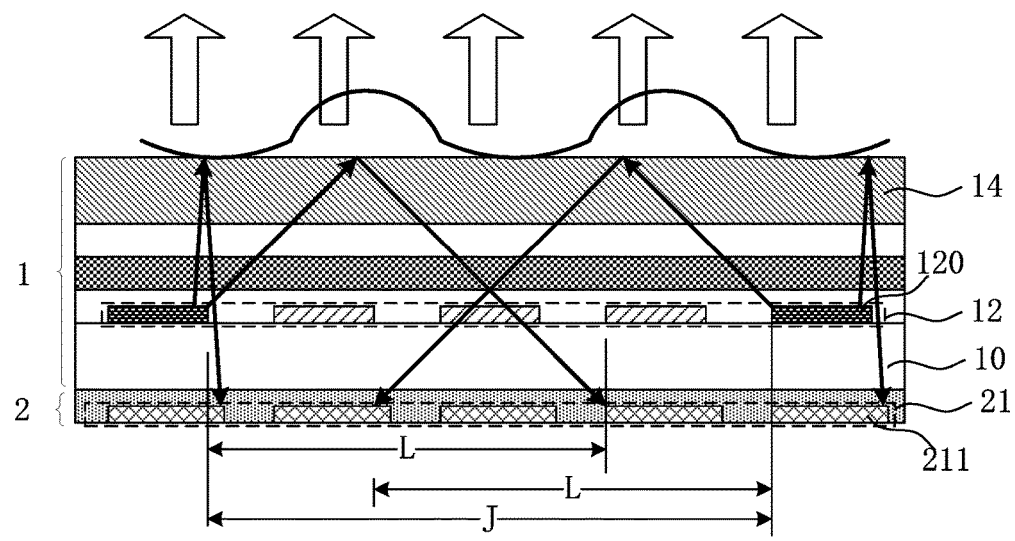
FIG. 28a illustrates a schematic cross-sectional view of another exemplary display panel consistent with disclosed embodiments.
Figure 28B:
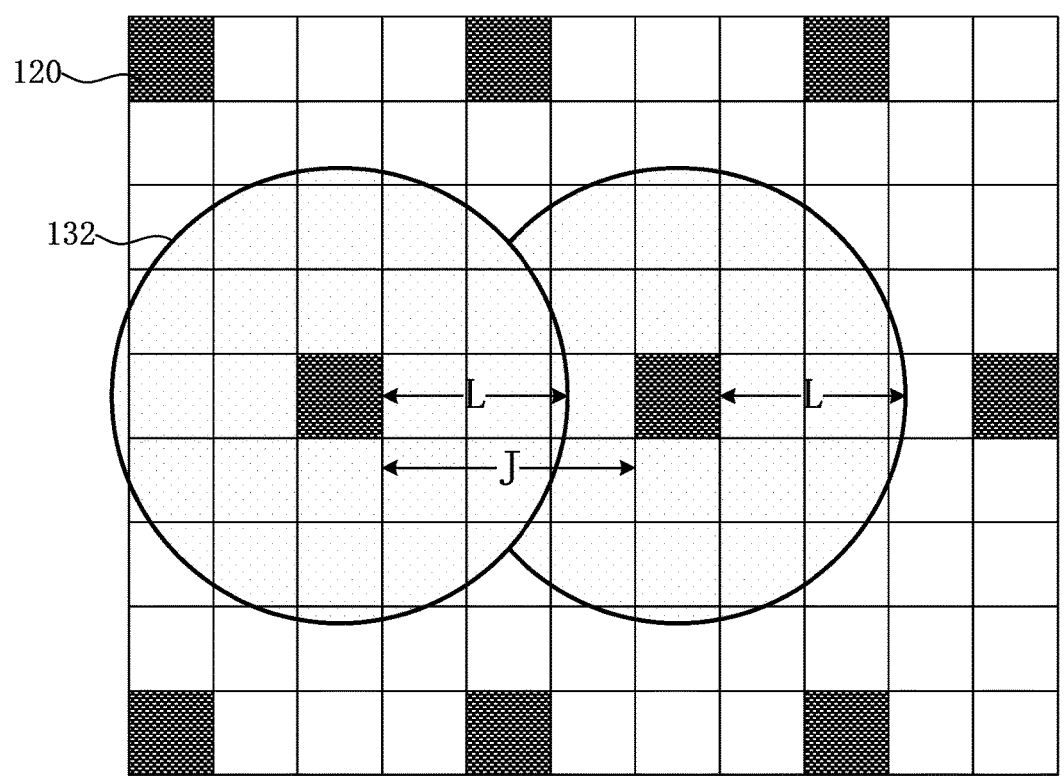
FIG. 28b illustrates a partial top view of another exemplary display panel in FIG. 28a consistent with disclosed embodiments.
Figure 28C:
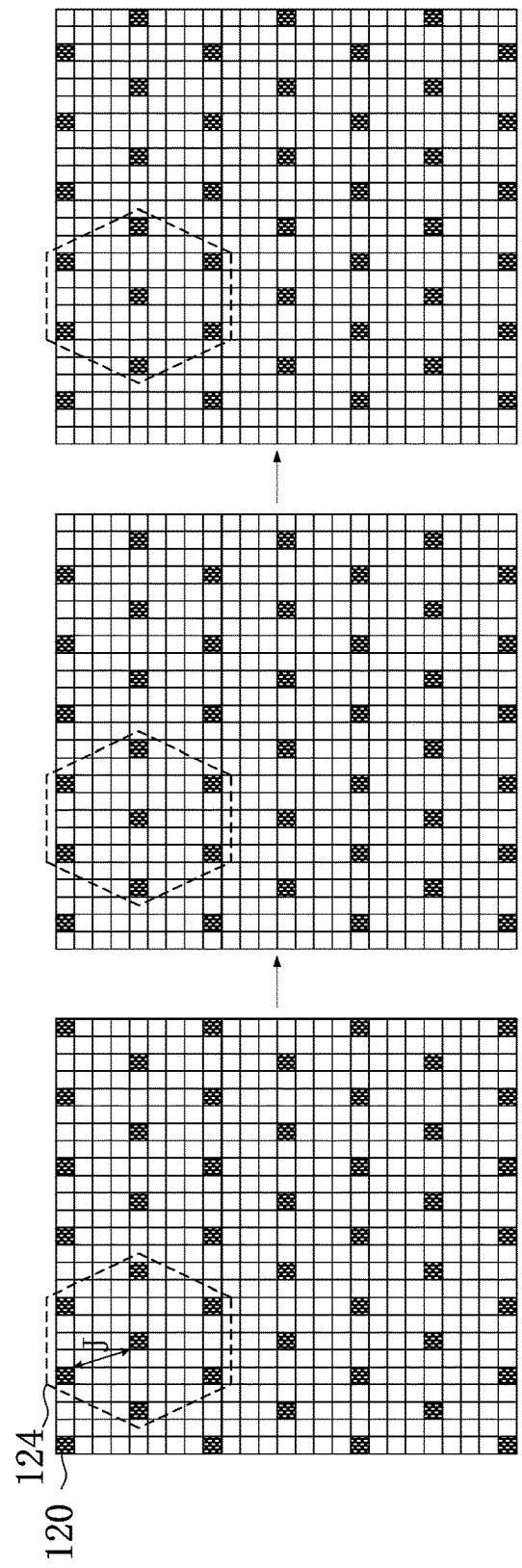
FIG. 28c illustrates a scanning diagram at a fingerprint recognition stage of another exemplary display panel in FIG. 28a consistent with disclosed embodiments.

FIG. 28a illustrates a schematic cross-sectional view of another exemplary display panel consistent with disclosed embodiments. FIG. 28b illustrates a partial top view of another exemplary display panel in FIG. 28a consistent with disclosed embodiments. FIG. 28c illustrates a scanning diagram at a fingerprint recognition stage of another exemplary display panel in FIG. 28a consistent with disclosed embodiments.

As shown in FIGS. 28a-28c, the display panel may comprise display module 1 and a fingerprint recognition module 2. The display module 1 may comprise a first substrate 10, an organic light-emitting layer 12 disposed on the first substrate 10, and a cover glass 14. The organic light-emitting layer 12 may have an inner surface far away from the first substrate 10 and an opposite outside surface facing the first substrate 10. The cover glass 14 may be disposed on the inner surface of the organic light-emitting layer 12.

The organic light-emitting layer 12 may include a plurality of organic light-emitting units 120. The fingerprint recognition module 2 may include a fingerprint recognition layer 21. The cover glass 14 may have a first surface far away from the first substrate 10 and an opposite second surface facing the first substrate 10. The light-exiting surface of the display panel may be defined as the first surface of the cover glass 14.

At the fingerprint recognition stage, the plurality of organic light-emitting units 120 may emit light in accordance with a first light-emitting unit array 124, and the distance J of any two adjacent organic light-emitting units 120 in the first light-emitting unit array 124 may be greater than or equal to the minimum crosstalk distance L. The minimum crosstalk distance L is the maximum radius of a coverage region 132 at the fingerprint recognition layer 21, in which the coverage region 132 is formed by the light emitted from any one of the plurality of organic light-emitting units 120 and then reflected to the fingerprint recognition layer 21 by the first surface of the cover plate 14.

In one embodiment, the first substrate 10 may have an outer side far away from the cover glass 14 and an opposite inner side facing the cover glass 14. The fingerprint recognition layer 21 may be disposed on the outer side of the first substrate 10. The fingerprint recognition layer 21 may include a plurality of fingerprint recognition units 211, and the plurality of fingerprint recognition units 211 may be disposed corresponding to the plurality of organic light-emitting units 120.

The display module 1 may be configured as the light source for fingerprint recognition. In particular, the organic light-emitting unit 120 of the organic light-emitting layer 12 in the display module 1 may be configured as the light source for fingerprint recognition. When the user finger presses against the first surface of the cover plate 14, the light emitted by the organic light-emitting unit 120 is incident onto the user finger after being transmitted through the first surface of the cover plate 14, and then is reflected by the fingerprint of the user finger to form the fingerprint signal light. The fingerprint signal light is transmitted through the first surface of the cover plate 14 again, and then incident onto the fingerprint recognition unit 211 corresponding to the organic light-emitting unit 120. The fingerprint recognition unit 211 that receives the fingerprint signal light generates an induction signal, according to which the fingerprint recognition circuit of the display panel performs the fingerprint recognition.

Figure 29:
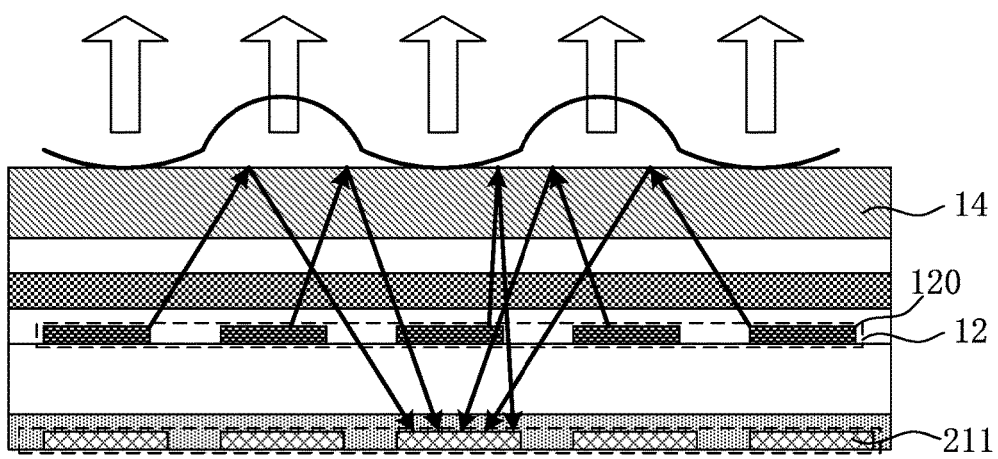
FIG. 29 illustrates a crosstalk in an existing display panel.

FIG. 29 illustrates a crosstalk in an existing display panel. As shown in FIG. 29, when all the organic light-emitting units 120 emit light at the same time for fingerprint recognition, because the light emitted by the organic light-emitting unit 120 has a wide range of angular distribution, each fingerprint recognition unit 211 receives not only fingerprint signal light from the corresponding organic light-emitting units 120, but also interference signals from other organic light-emitting units 120, degrading the accuracy of the fingerprint recognition.

As a comparison, as shown in FIGS. 28a-28c, to improve the accuracy of the fingerprint recognition, at the fingerprint recognition stage, the plurality of organic light-emitting units 120 may emit light in accordance with a first light-emitting unit array 124, and the distance J of any two adjacent organic light-emitting units 120 in the first light-emitting unit array 124 may be greater than or equal to the minimum crosstalk distance L.

Referring to FIGS. 28a-28b, the light emitted from the organic light-emitting unit 120 may be angularly distributed. The light emitted from the organic light-emitting unit 120 may be reflected by the first surface of the cover glass 14 to form the coverage region 132 on the fingerprint recognition layer 21. That is, any fingerprint signal light emitted from the organic light-emitting unit 120 may be reflected by the first surface of the cover glass 14 and incident onto the coverage region 132 on the fingerprint recognition layer 21. The maximum radius of the coverage region 132 may be the minimum crosstalk distance L.

The distance J of any two adjacent organic light-emitting units 120 in the first light-emitting unit array 124 may be configured to be greater than or equal to the minimum crosstalk distance L, such that in a plurality of turned-on organic light-emitting units 120 in the first light-emitting unit array 124, the fingerprint signal light emitted from any one of the plurality of turned-on organic light-emitting units 120 may be prevented from being incident onto the fingerprint recognition unit 211 corresponding to other turned-on organic light-emitting units 120. That is, the fingerprint recognition unit 211, which is corresponding to any one of the plurality of turned-on organic light-emitting units 120 in the first light-emitting unit array 124, may only receive the fingerprint signal light emitted from the corresponding turned-on organic light-emitting unit 120.

Thus, in the display panel, the fingerprint recognition unit 211, which is corresponding to any one of the plurality of turned-on organic light-emitting units 120 in the first light-emitting unit array 124, may not receive any interference signals from other turned-on organic light-emitting units 120. Accordingly, when the fingerprint recognition circuit of the display panel performs the fingerprint recognition based on the induction signal generated by the fingerprint recognition unit 211, the accuracy the fingerprint recognition may be improved.

In the disclosed embodiments, the fingerprint signal light is defined as the reflected light formed by reflecting the light emitted from the organic light-emitting unit 120 by the fingerprint of the user finger, which is pressing the first surface of the cover plate 14. As compared to the thickness of the display panel, the distance between the first surface of the cover plate 14 and the fingerprint of the user finger may be substantially small and, thus, the influence on the range of the coverage region 132 may be substantially small. Thus, the minimum crosstalk distance L is determined without taking the distance between the first surface of the cover plate 14 and the fingerprint of the user finger into account.

In addition, the radius L of the coverage region 132 is calculated based on the fact that the origin is the center point of the organic light-emitting unit 120. However, the number of the organic light-emitting units 120 in the display panel is often substantially large and, accordingly, the size of the organic light-emitting unit 120 is substantially small. Thus, in the disclosed embodiments, the entire organic light-emitting unit 120 may be considered as the origin of the coverage region 132 and, accordingly, the radius L of the coverage region 132 may be calculated as the length from the edge of the organic light-emitting unit 120 to the edge of the coverage region 132. That is, the size of the organic light-emitting unit 120 may not be taken into account when calculating the minimum crosstalk distance L.

It should be noted that, the minimum crosstalk distance L may be related to the thickness of the display panel, and the light emission angle of the organic light-emitting unit, etc., such that different display panels may have different values of the minimum crosstalk distance L. In another embodiment, when calculating the minimum crosstalk distance L, the size of the organic light-emitting unit 120 may have to be taken into account.

As described above, the light emitted from the organic light-emitting unit 120 may have an angular distribution. The minimum crosstalk distance L is the maximum radius of a coverage region 132 at the fingerprint recognition layer 21, in which the coverage region 132 is formed by the light emitted from any one of the plurality of organic light-emitting units 120 and then reflected to the fingerprint recognition layer 21 by the first surface of the cover plate 14. That is, the coverage region 132 on the fingerprint recognition layer 21 may be confined by the reflected light, which is formed by reflecting the light emitted from the edge of the organic light-emitting unit 120 and with the maximum emission angle onto the fingerprint recognition layer 21. Then the light emitted from the organic light-emitting unit 120 and with any emission angle may be reflected to be within coverage region 132.

Figure 28D:
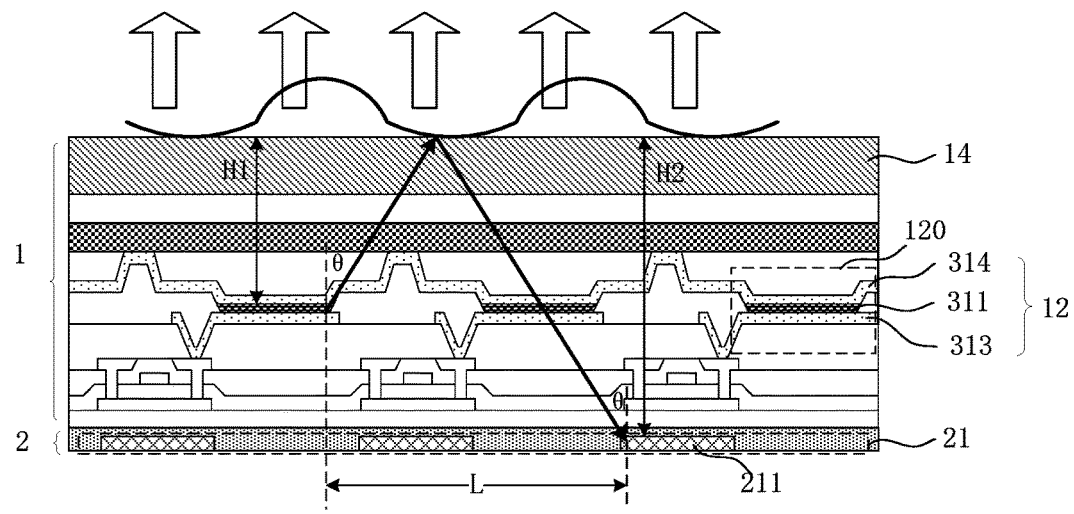
FIG. 28d illustrates a detailed schematic view of another exemplary display panel in FIG. 28a consistent with disclosed embodiments.

FIG. 28d illustrates a detailed schematic view of another exemplary display panel in FIG. 28a consistent with disclosed embodiments.

As shown in FIG. 28d, each organic light-emitting unit 120 may have an inner side far away from the first substrate 10 and an opposite outer side facing the first substrate 10. A first electrode 313, a light-emitting function layer 311, and a second electrode 314 may be sequentially disposed on the inner side of the organic light-emitting unit 120. One first electrode 313, and the corresponding light-emitting function layer 311 and second electrode 314 together may form one organic light-emitting unit 120.

In one embodiment, the organic light-emitting layer 12 may include organic light-emitting units of three different colors and, accordingly, one organic light-emitting unit 120 may include three organic light-emitting sub-units of different colors. When a signal is applied to the first electrode 313 and second electrode 314, the light-emitting function layer 311 may emit light having an angular distribution. The fingerprint signal light may be substantially formed by specular reflection of the light emitted from the light-emitting function layer 311, i.e., angle of reflection=angle of incidence.

Thus, L=tan θ*H1+tan θ*H2, where L is the minimum crosstalk distance and θ is the angle between the direction with a preset luminance and the direction perpendicular to the organic light-emitting unit 120, H1 is the distance between the first surface of the cover plate 14 and the light-emitting function layer 311 in the direction perpendicular to the display panel, and H2 is the distance between the first surface of the cover plate 14 and the fingerprint recognition layer 21 in the direction perpendicular to the display panel. The preset luminance may be configured to be less than or equal to approximately 10% of the luminance in the direction perpendicular to the organic light-emitting layer 311.

In the disclosed embodiments, the light emission angle (the angle with respect to the direction perpendicular to the organic light-emitting layer 311) of the light emitted from the organic light-emitting unit 120 may be related to the luminance of the organic light-emitting unit 120. The luminance is the subjective feeling of the light intensity, and the luminance in the direction perpendicular to the organic light-emitting layer 311 is defined as 100%. The lower the luminance is, the larger the light emission angle is.

When the luminance (unit: $cd/m^2$) of the organic light-emitting unit 120 is less than or equal to 10%, the light intensity of the light emitted from the organic light-emitting unit 120 may be substantially low, and the light reflected by the first surface of the cover plate 14 may not cause a crosstalk in the fingerprint recognition unit 211. Thus, in one embodiment, the light emission angle of the organic light-emitting unit 120 may be determined based on the critical luminance value of 10%.

The angle θ may be determined by measuring the luminance of the light emitted from the organic light-emitting unit 120 in the direction perpendicular to the organic light-emitting unit 120 (i.e., the light emission angle is zero), determining the light emission direction in which the emitted light has 10% luminance of the light having the zero light emission angle, and determining the angle θ according to an angel between the determined light emission direction and the direction perpendicular to the organic light-emitting unit 120.

It should be noted that, organic light-emitting units in different display panels may have different light intensity and, accordingly, the preset luminance may also be different. In another embodiment, the preset luminance may be configured to approximately 12% or 9% of the luminance in the direction perpendicular to the organic light-emitting layer 311. That is, in practical applications, the preset luminance may be determined according to various application scenarios, which is not limited by the present disclosure.

FIG. 28c illustrates a scanning diagram at a fingerprint recognition stage of another exemplary display panel in FIG. 28a consistent with disclosed embodiments.

As shown in FIG. 28c, at the fingerprint recognition stage, the display panel may scan the display screen for fingerprint recognition. For example, in a first image frame, a plurality of organic light-emitting units 120 may be simultaneously turned on in accordance with the first light-emitting unit array 124 shown in the most left sub-figure in FIG. 28c, and the induction signal generated by the fingerprint recognition unit 211 corresponding to the organic light-emitting unit 120 may be recorded.

In a second image frame, the plurality of organic light-emitting units 120 simultaneously turned on in accordance with the first light-emitting unit array 124 shown in the most left sub-figure in FIG. 28*c* may be displaced, i.e., a plurality of organic light-emitting units 120 may be simultaneously turned on in accordance with the first light-emitting unit array 124 shown in the middle sub-figure in FIG. 28*c*, and the corresponding induction signals may be recorded.

In a third image frame, the plurality of organic light-emitting units 120 simultaneously turned on in accordance with the first light-emitting unit array 124 shown in the middle sub-figure in FIG. 28*c* may be displaced, i.e., a plurality of organic light-emitting units 120 may be simultaneously turned on in accordance with the first light-emitting unit array 124 shown in the most right sub-figure in FIG. 28*c*, and the corresponding induction signals may be recorded.

The organic light-emitting units 120 simultaneously turned on in accordance with the first light-emitting unit array 124 may keep being displaced, until all the organic light-emitting units 120 may be sequentially turned-on, and the fingerprint recognition is performed based on the corresponding induction signals received by the fingerprint recognition units 211. Because the fingerprint recognition unit 211 does not receive any crosstalk signals, the fingerprint recognition accuracy of the display panel may be substantially high.

The first light-emitting unit array may be a smallest repeating unit composed of a plurality of organic light-emitting units that simultaneously emit light, and is not limited to a matrix formed by a plurality of organic light-emitting units that simultaneously emit light.

In the disclosed embodiments, at the fingerprint recognition stage, a plurality of organic light-emitting units 120 may be simultaneously turned on in accordance with the first light-emitting unit array 124. The distance J of any two adjacent organic light-emitting units 120 in the first light-emitting unit array 124 may be configured to be greater than or equal to the minimum crosstalk distance L. The minimum crosstalk distance L may be defined as the maximum radius of the coverage region 132 at the fingerprint recognition layer 21, in which the coverage region 132 is formed by the light emitted from any one of the plurality of organic light-emitting units 120 and then reflected to the fingerprint recognition layer 21 by the first surface of the cover plate 14.

Thus, in a plurality of turned-on organic light-emitting units 120 in the first light-emitting unit array 124, the fingerprint signal light emitted from any one of the plurality of turned-on organic light-emitting units 120 may be prevented from being incident onto the fingerprint recognition unit 211 corresponding to other turned-on organic light-emitting units 120. That is, the fingerprint recognition unit 211, which is corresponding to any one of the plurality of turned-on organic light-emitting units 120 in the first light-emitting unit array 124, may only receive the fingerprint signal light emitted from the corresponding turned-on organic light-emitting unit 120.

Thus, in the display panel, the fingerprint recognition unit 211, which is corresponding to any one of the plurality of turned-on organic light-emitting units 120 in the first light-emitting unit array 124, may not receive any interference signals from other turned-on organic light-emitting units 120. Accordingly, when the fingerprint recognition circuit of the display panel performs the fingerprint recognition based on the induction signal generated by the fingerprint recognition unit 211, the accuracy the fingerprint recognition may be improved.

It should be noted that the display panel shown in FIG. 28*a* is only one of the display panels provided by the present disclosure, and a variety of display panels having different configurations are provided in other embodiments of the present disclosure.

Figure 30:
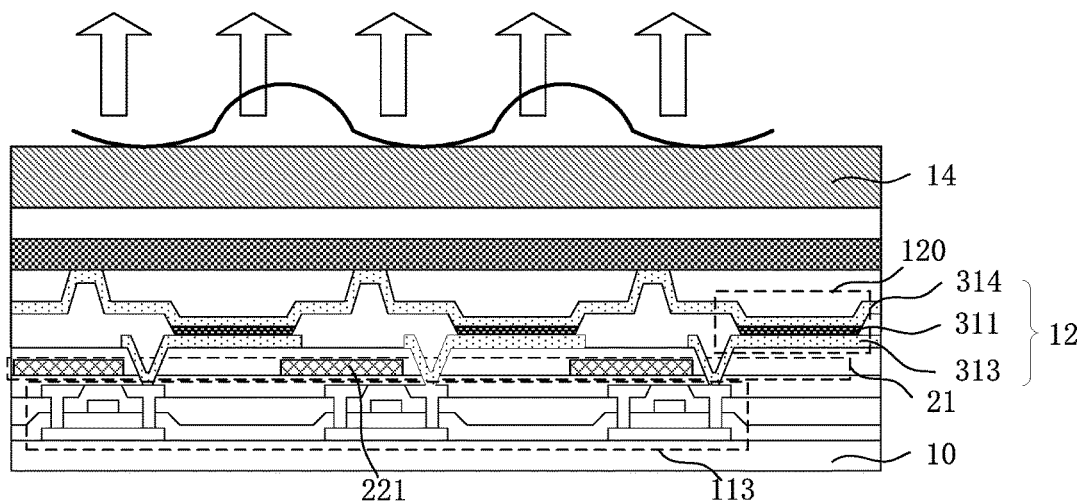
FIG. 30 illustrates a schematic cross-sectional view of another exemplary display panel consistent with disclosed embodiments.

FIG. 30 illustrates a schematic cross-sectional view of another exemplary display panel consistent with disclosed embodiments. The similarities between FIG. 30 and FIG. 28*a* may not be repeated here, while certain difference may be explained.

As shown in FIG. 30, the first substrate 10 may have an inner side facing the cover glass 14 and an opposite outer side. A TFT array 113, a fingerprint recognition layer 21, and an organic light-emitting layer 12 may be disposed on the inner side of the first substrate 10. The fingerprint recognition layer 21 may be disposed between the TFT array 113 and the organic light-emitting layer 12. The fingerprint recognition layer 21 may be electrically insulated from the TFT array 113 and the organic light-emitting layer 12, respectively.

The fingerprint recognition process of the display panel shown in FIG. 30 may be similar to the fingerprint recognition process of the display panel shown in FIG. 28*a*, which is not repeated here. In particular, in the display panel shown in FIG. 30, through disposing the fingerprint recognition layer 21 between the TFT array 113 and the organic light-emitting layer 12, the aperture ratio of the first electrode 313 in the organic light-emitting unit 120 in the organic light-emitting layer 12 may not be degraded. The arrangement of the fingerprint recognition units 211 may be determined according to various application scenarios, which is not limited by the present disclosure.

Figure 31A:
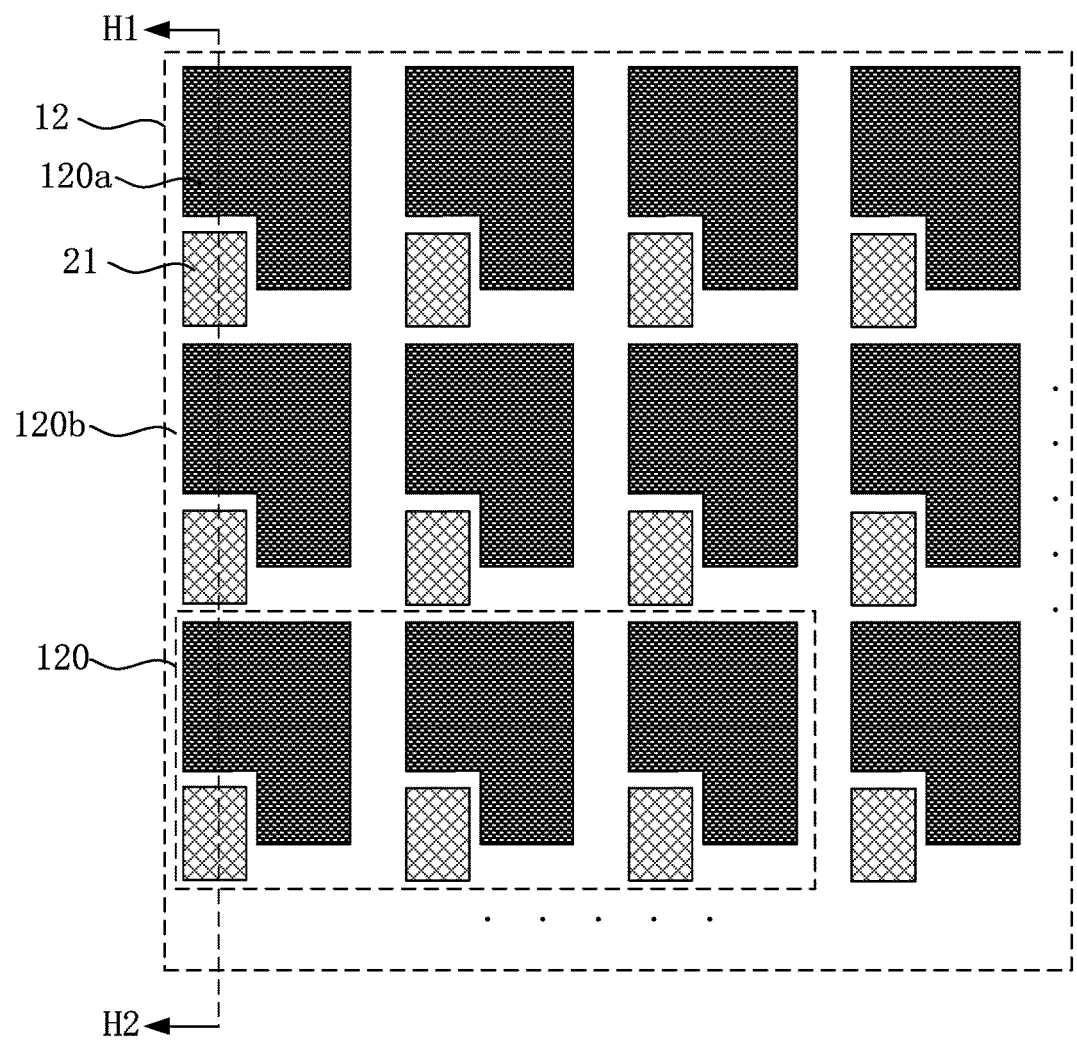
FIG. 31a illustrates a schematic cross-sectional view of another exemplary display panel consistent with disclosed embodiments.
Figure 31B:
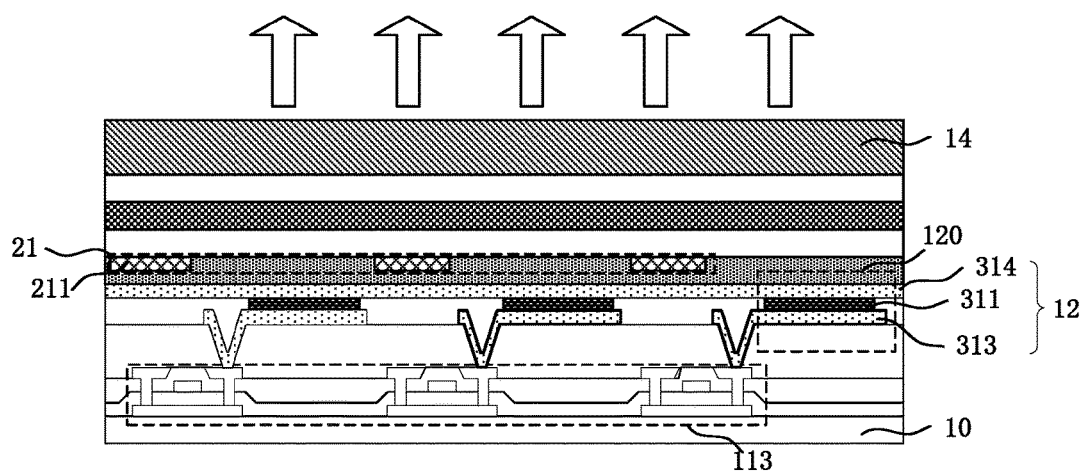
FIG. 31b illustrates a schematic H1-H2 sectional view of another exemplary display panel in FIG. 31a consistent with disclosed embodiments.

FIG. 31*a* illustrates a schematic cross-sectional view of another exemplary display panel consistent with disclosed embodiments. FIG. 31*b* illustrates a schematic H1-H2 sectional view of another exemplary display panel in FIG. 31*a* consistent with disclosed embodiments. The similarities between FIGS. 31*a*-31*b* and FIG. 28*a* may not be repeated here, while certain difference may be explained.

As shown in FIGS. 31*a*-31*b*, the first substrate 10 may have an inner side facing the cover glass 14 and an opposite outer side. A TFT array 113, a fingerprint recognition layer 21, and an organic light-emitting layer 12 may be disposed on the inner side of the first substrate 10. The organic light-emitting layer 12 may include a plurality of light-emitting regions 120*a* and a plurality of non-light-emitting region 120*b*, and the orthogonal projection of the fingerprint recognition layer 21 onto the display panel may be disposed in the non-light-emitting regions 120*b* of the organic light-emitting layer 12. The fingerprint recognition layer 21 may be disposed on the inner side of the first substrate 10, and the fingerprint recognition layer 21 may be electrically insulated from the organic light-emitting layer 12.

The fingerprint recognition process of the display panel shown in FIGS. 31*a*-31*b* may be similar to the fingerprint recognition process of the display panel shown in FIG. 28*a*, which is not repeated here. In particular, in the display panel shown in FIGS. 31*a*-31*b*, the fingerprint recognition layer 21 may be disposed on the inner side of the first substrate 10, through configuring the orthogonal projection of the fingerprint recognition layer 21 onto the display panel to be disposed in the non-light-emitting regions 120*b* of the organic light-emitting layer 12, the aperture ratio of the first electrode 313 in the organic light-emitting unit 120 in the organic light-emitting layer 12 may not be degraded.

Figure 32A:
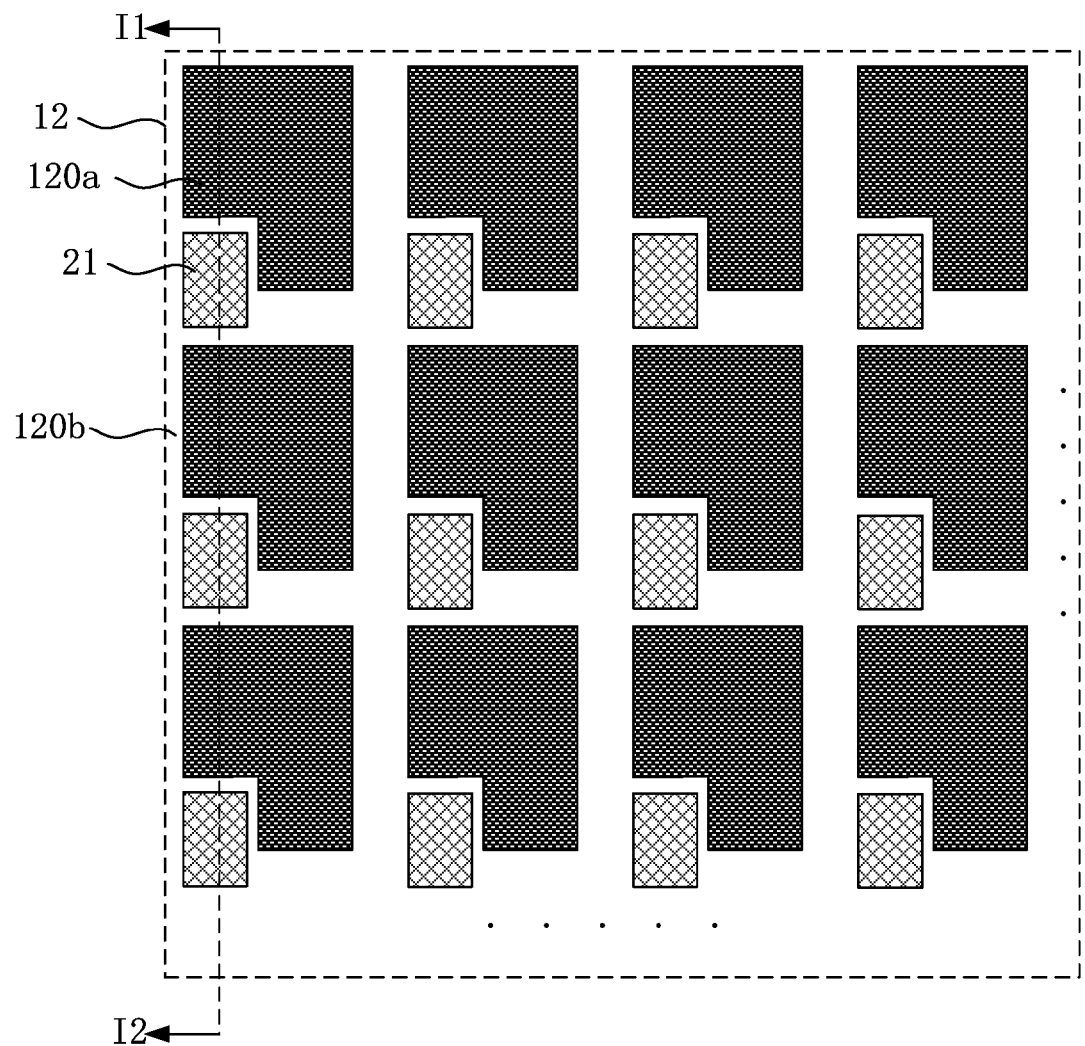
FIG. 32a illustrates a schematic cross-sectional view of another exemplary display panel consistent with disclosed embodiments.
Figure 32B:
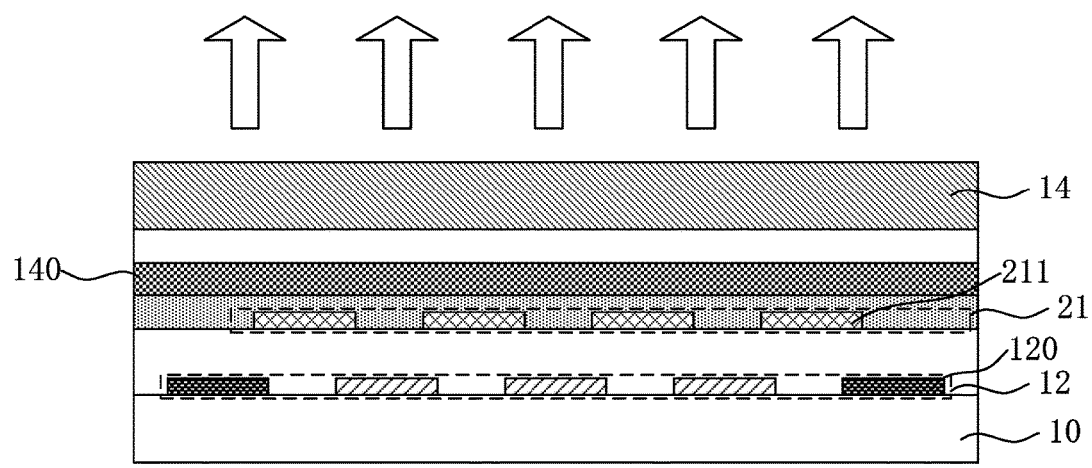
FIG. 32b illustrates a schematic 11-12 sectional view of another exemplary display panel in FIG. 32a consistent with disclosed embodiments.

FIG. 32*a* illustrates a schematic cross-sectional view of another exemplary display panel consistent with disclosed embodiments. FIG. 32*b* illustrates a schematic I1-I2 sectional view of another exemplary display panel in FIG. 32*a* consistent with disclosed embodiments. The similarities between FIGS. 32a-32b and FIG. 28a may not be repeated here, while certain difference may be explained.

As shown in FIGS. 32a-32b, the display module 1 may further include an encapsulation glass 140. The first substrate 10 may have an inner side facing the cover glass 14 and an opposite outer side, and the encapsulation glass 140 may be disposed on the inner side of the first substrate 10. The encapsulation glass 140 may have an inner side facing the first substrate 10 and an opposite outer side, and the fingerprint recognition layer 21 may disposed on the inner side of the encapsulation glass 140. The organic light-emitting layer 12 may be disposed between the first substrate 10 and the fingerprint recognition layer 21. The organic light-emitting layer 12 may include a plurality of light-emitting regions 120a and a plurality of non-light-emitting region 120b, and the orthogonal projection of the fingerprint recognition layer 21 onto the display panel may be disposed in the non-light-emitting regions 120b of the organic light-emitting layer 12.

The fingerprint recognition process of the display panel shown in FIGS. 32a-32b may be similar to the fingerprint recognition process of the display panel shown in FIG. 28a, which is not repeated here.

In particular, in the display panel shown in FIGS. 32a-32b, the display panel may be encapsulated by the encapsulation glass 140, and the fingerprint recognition layer 21 may disposed on the inner side of the encapsulation glass 140. Through configuring the orthogonal projection of the fingerprint recognition layer 21 onto the display panel to be disposed in the non-light-emitting regions 120b of the organic light-emitting layer 12, the aperture ratio of the display panel may not be degraded.

Figure 33A:
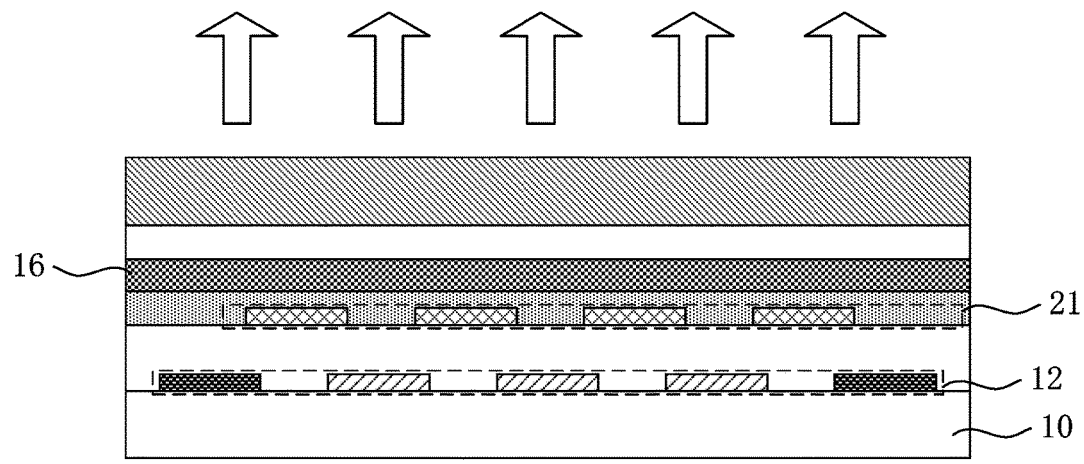
FIG. 33a illustrates a schematic cross-sectional view of another exemplary display panel consistent with disclosed embodiments.
Figure 33B:
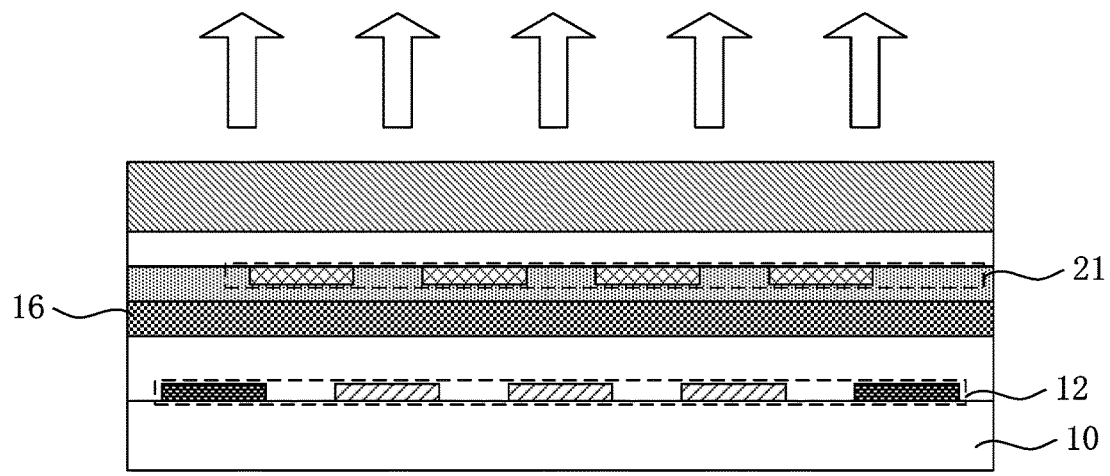
FIG. 33b illustrates a schematic cross-sectional view of another exemplary display panel consistent with disclosed embodiments.

FIG. 33a illustrates a schematic cross-sectional view of another exemplary display panel consistent with disclosed embodiments. FIG. 33b illustrates a schematic cross-sectional view of another exemplary display panel consistent with disclosed embodiments. The similarities between FIGS. 33a-33b and FIG. 28a may not be repeated here, while certain difference may be explained.

As shown in FIGS. 33a-33b, the display module 1 may further include an encapsulation layer 16. The first substrate 10 may have an inner side facing the cover glass 14 and an opposite outer side, and the encapsulation layer 16 may be disposed on the inner side of the first substrate 10. The organic light-emitting layer 12 may also be disposed on the inner side of the first substrate 10.

The encapsulation layer 16 may have an inner side facing the first substrate 10 and an opposite outer side. In one embodiment, the fingerprint recognition layer 21 may disposed on the inner side of the encapsulation layer 16, as shown in FIG. 33a. In another embodiment, the fingerprint recognition layer 21 may disposed on the outer side of the encapsulation layer 16, as shown in FIG. 32b.

Figure 33C:
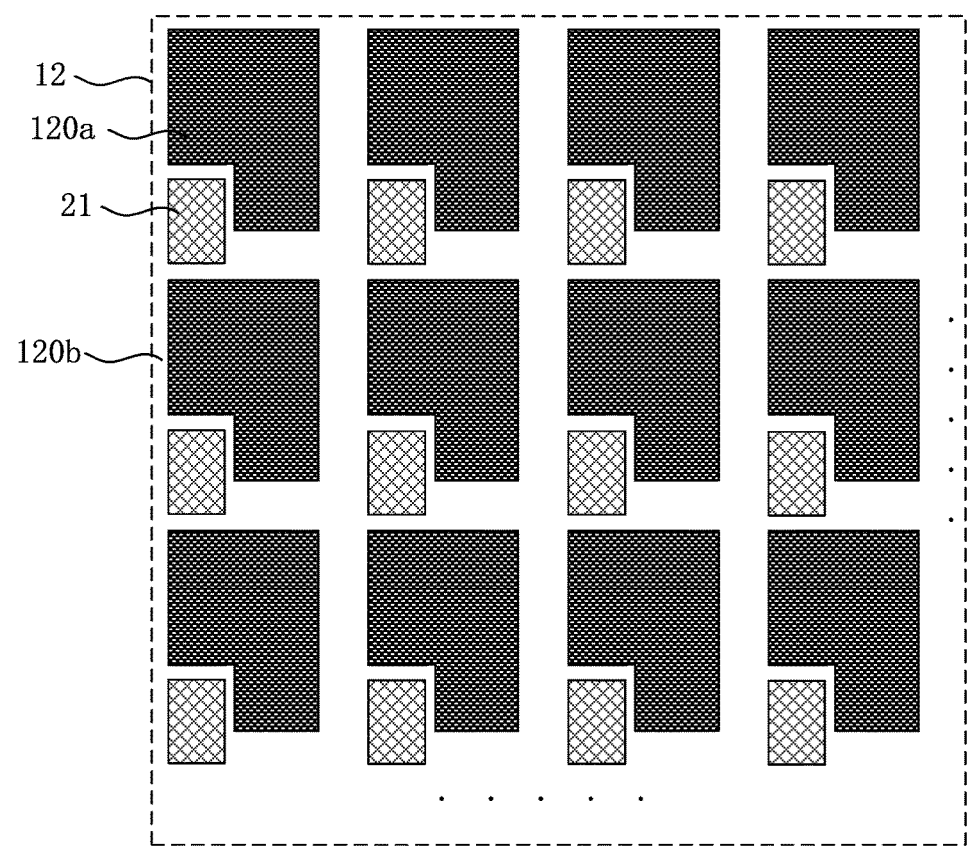
FIG. 33c illustrates a schematic top view of exemplary display panels in FIG. 33a and FIG. 33b consistent with disclosed embodiments.

FIG. 33c illustrates a schematic top view of exemplary display panels in FIG. 33a and FIG. 33b consistent with disclosed embodiments. As shown in FIG. 33c, the organic light-emitting layer 12 may include a plurality of light-emitting regions 120a and a plurality of non-light-emitting region 120b, and the orthogonal projection of the fingerprint recognition layer 21 onto the display panel may be disposed in the non-light-emitting regions 120b of the organic light-emitting layer 12.

The fingerprint recognition process of the display panel shown in FIGS. 33a-33c may be similar to the fingerprint recognition process of the display panel shown in FIG. 28a, which is not repeated here.

In particular, in the display panel shown in FIGS. 33a-33b, the display panel may be encapsulated by the encapsulation layer 16, and the fingerprint recognition layer 21 may disposed on the inner side or the outer side of the encapsulation layer 16. Through configuring the orthogonal projection of the fingerprint recognition layer 21 onto the display panel to be disposed in the non-light-emitting regions 120b of the organic light-emitting layer 12, the aperture ratio of the display panel may not be degraded.

It should be noted that, the display panel may read the fingerprint information by an image scanning method. When scanning a first image frame, a certain number of the organic light-emitting units 120 in the organic light-emitting layer 12 may emit light in accordance with the first light-emitting array 124, and the fingerprint information detected by the fingerprint recognition units corresponding to the turned-on organic light-emitting units 120. When scanning a second image frame, the certain number of the organic light-emitting units 120 emitting light may be shifted. The certain number of the organic light-emitting units 120 emitting light may be sequentially shifted until all the organic light-emitting units 120 in the organic light-emitting layer 12 are turned on through scanning a plurality of image frames.

The display panel performs the fingerprint information by scanning a plurality of image frames, when the number of the organic light-emitting units 120 which are turned-on in one image frame is smaller, the number of the image frames for completely reading the fingerprint information may be larger, and the time for completely reading the fingerprint information may be longer.

Figure 34A:
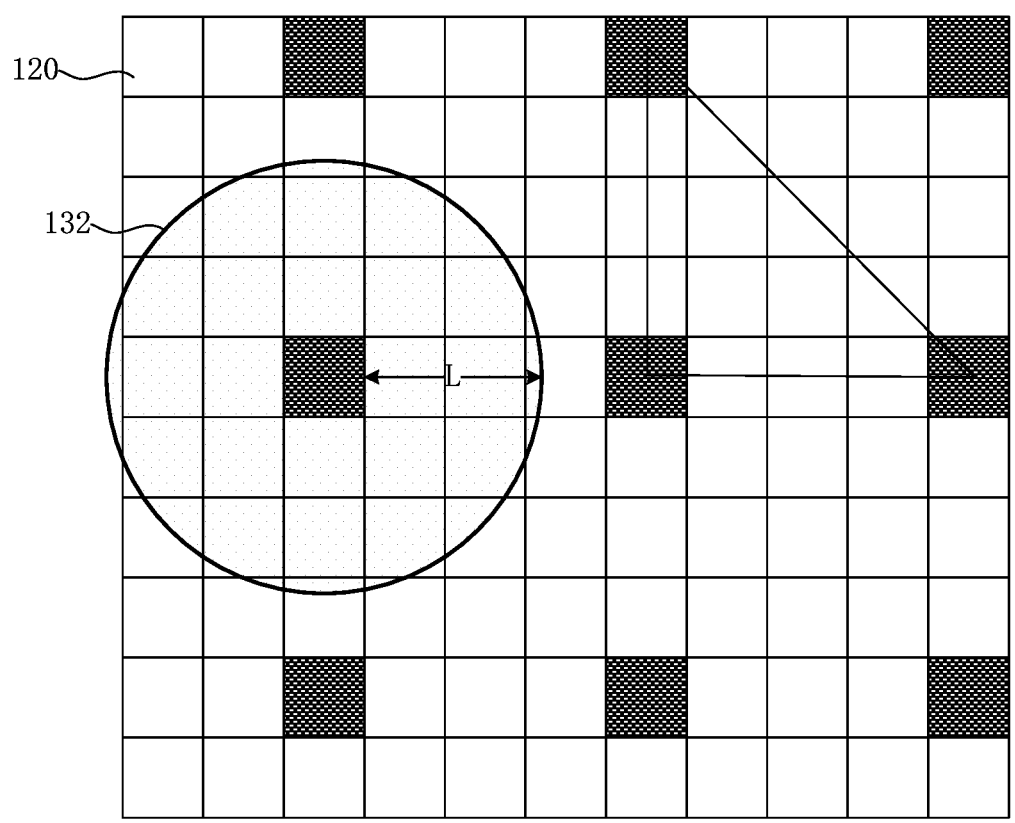
FIG. 34a illustrates a scanning diagram at a fingerprint recognition stage of another exemplary display panel consistent with disclosed embodiments.

For example, when the display panel reads the fingerprint information using the image scanning method shown in FIG. 34a, and the number of the organic light-emitting units 120 emitting light at the same time in each image frame (11*10 organic light-emitting units) is nine, then at least 12 image frames (11*10/9=12.3) may have to be scanned to completely read the fingerprint information detected by the fingerprint recognition units 211 of all the organic light-emitting units 120, given that the reading time of the fingerprint information for each image frame is fixed.

Figure 34B:
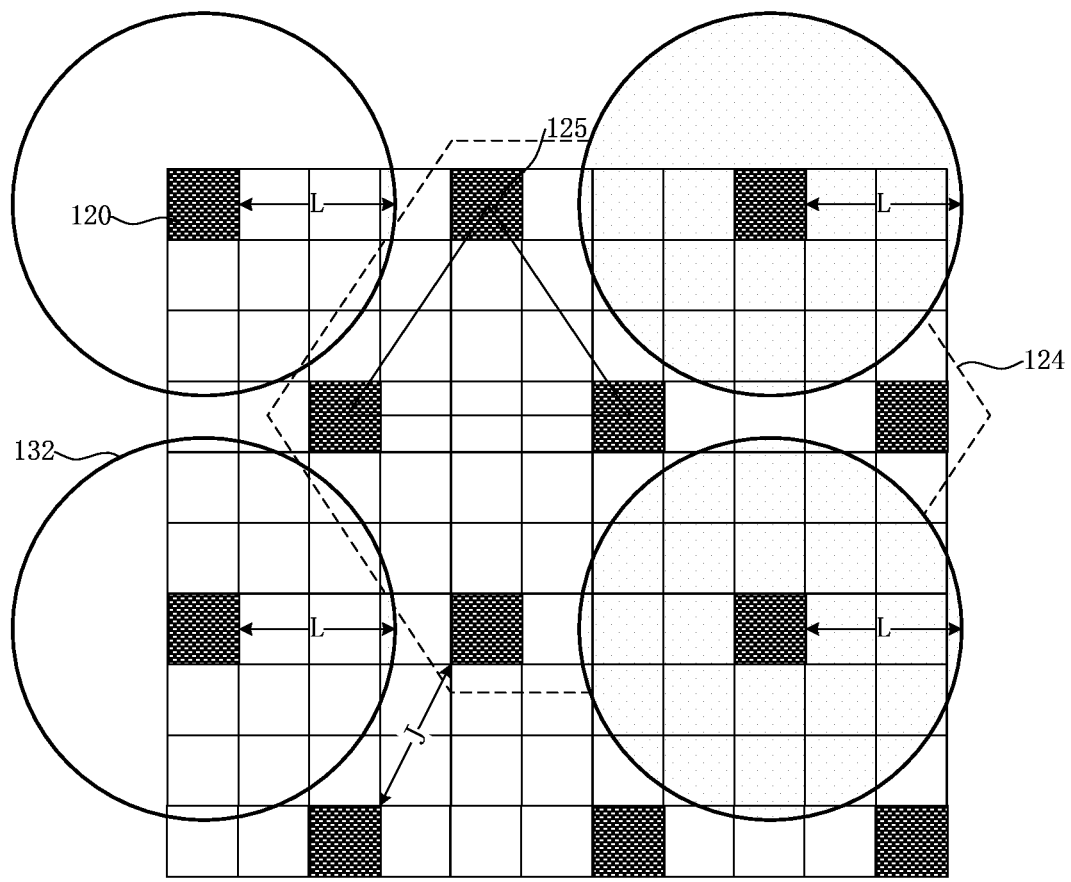
FIG. 34b illustrates a scanning diagram at a fingerprint recognition stage of another exemplary display panel consistent with disclosed embodiments.

To reduce the time required to read the fingerprint information, in one embodiment, a plurality of organic light-emitting units 120 in the first light-emitting array 124 as shown in FIG. 34b may form a plurality of patterns, in which the pattern 125 with the smallest area may have each angle unequal to 90°.

As compared to FIG. 34a, the distance J between any two adjacent light-emitting organic units 120 in the first light-emitting array 124 shown in FIG. 34b may be reduced and, thus, the number of the turned-on organic light-emitting units 120 in each image frame may be increased. For example, the number of the organic light-emitting units 120 emitting light at the same time in each image frame (11*10 organic light-emitting units) may become twelve, then at most 10 image frames (11*10/12=10) may have to be scanned to completely read the fingerprint information detected by the fingerprint recognition units 211 of all the organic light-emitting units 120, given that the reading time of the fingerprint information for each image frame is fixed.

Through configuring a plurality of organic light-emitting units 120 in the first light-emitting array 124 to form a plurality of patterns and configuring the pattern 125 with the smallest area to have each angle unequal to 90°, the number of the turned-on organic light-emitting units 120 in each image frame may be increased without introducing any crosstalk. Accordingly, the time for completely reading the fingerprint information may be significantly reduced.

Figure 35A:
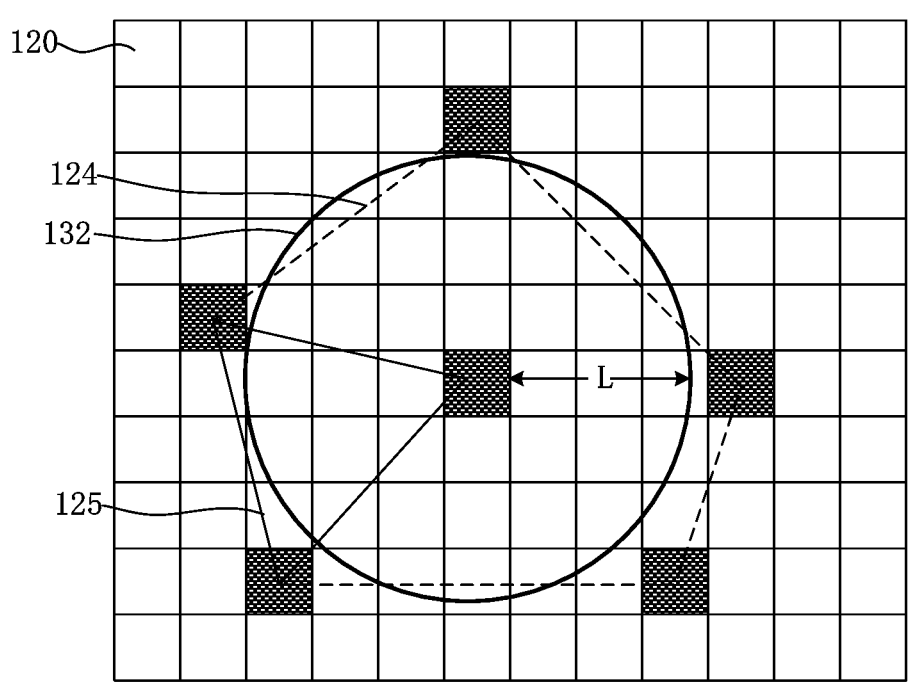
FIG. 35a illustrates a schematic top view of an exemplary first light-emitting unit array consistent with disclosed embodiments.

For example, in one embodiment, as shown in FIG. 35a, the first light-emitting unit array 124 may be a pentagonal light-emitting unit array 124, which may include an organic light-emitting unit 120 disposed in the center of the pentagonal light-emitting unit array 124 (called as a central organic light-emitting unit) and five edge organic light-emitting units 120 disposed at the edge of the pentagonal light-emitting unit array 124 (called as edge organic light-emitting units). A plurality of organic light-emitting units 120 in the first light-emitting array 124 may form a plurality of patterns, in which the pattern 125 with the smallest area may have each angle unequal to 90°. The pentagonal light-emitting unit array 124 may increase the number of the turned-on organic light-emitting units 120 in each image frame without introducing any crosstalk. Accordingly, the time for completely reading the fingerprint information may be significantly reduced.

Figure 35B:
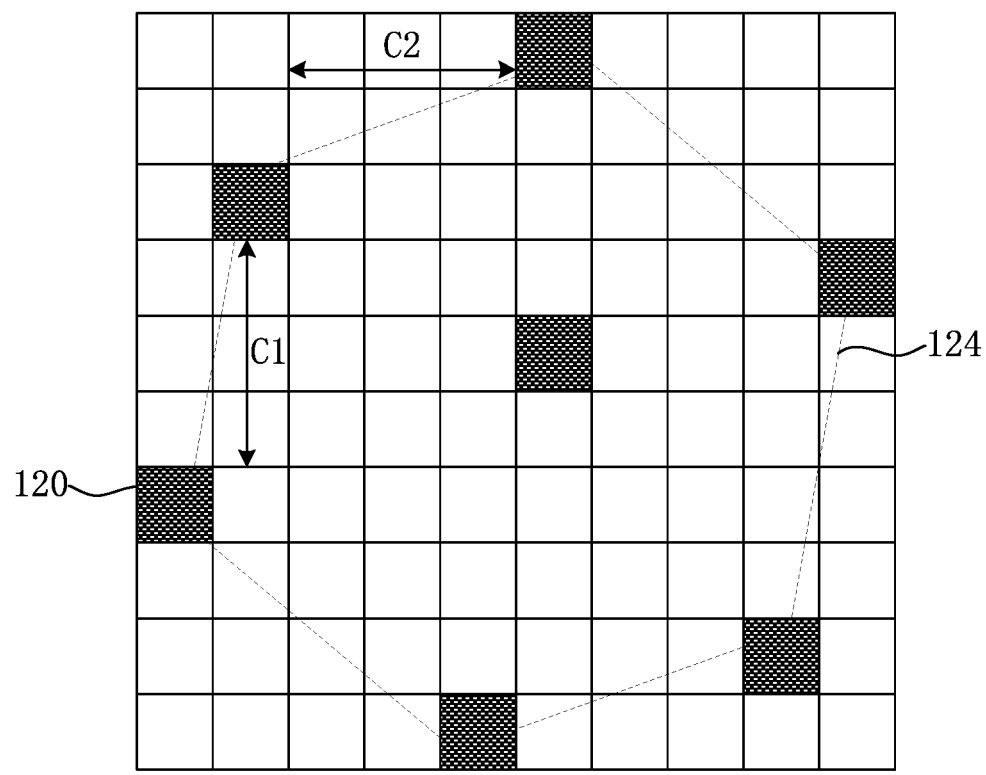
FIG. 35b illustrates a schematic top view of another exemplary first light-emitting unit array consistent with disclosed embodiments.

In another embodiment, as shown in FIG. 35b, the first light-emitting unit array 124 may be a hexagonal light-emitting unit array 124, which may include a central organic light-emitting unit 120 and six edge organic light-emitting units 120. Similarly, the hexagonal light-emitting unit array 124 may increase the number of the turned-on organic light-emitting units 120 in each image frame without introducing any crosstalk. Accordingly, the time for completely reading the fingerprint information may be significantly reduced.

Figure 35C:
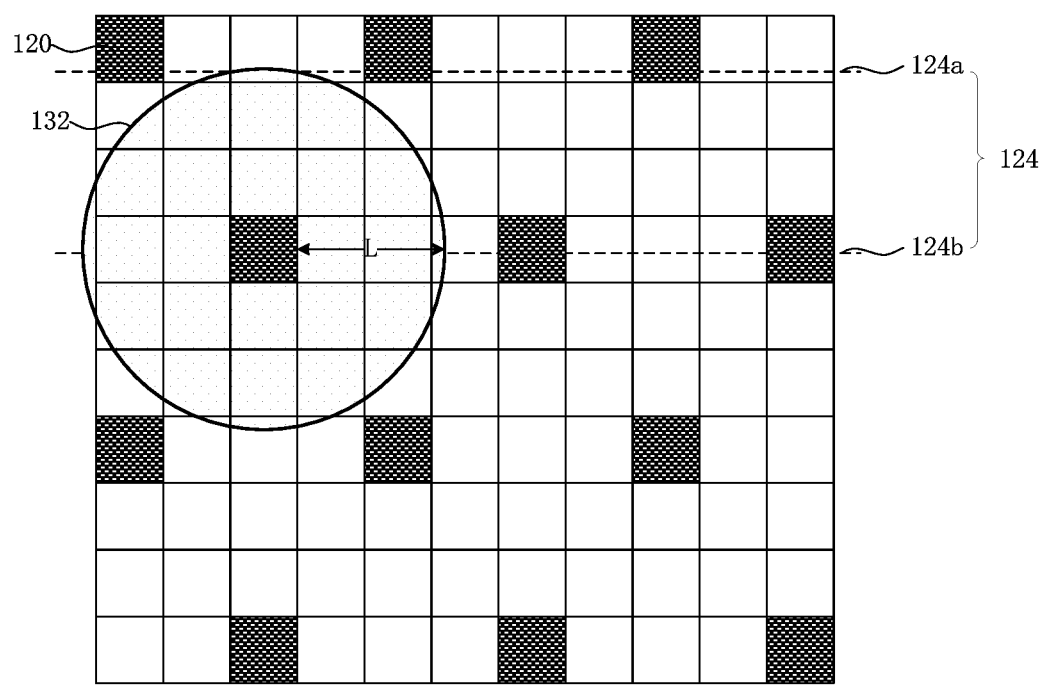
FIG. 35c illustrates a schematic top view of another exemplary first light-emitting unit array consistent with disclosed embodiments.

In another embodiment, as shown in FIG. 35c, the first light-emitting unit array 124 may include a first light-emitting unit row 124a and a second light-emitting unit row 124b disposed with an interval. In particular, any organic light-emitting units 124 in the first light-emitting unit row 124a and any organic light-emitting units 124 in the second light-emitting unit row 124b may not be disposed in a same column.

Through configuring any organic light-emitting units 124 in the first light-emitting unit row 124a and any organic light-emitting units 124 in the second light-emitting unit row 124b to be not disposed in a same column, the number of the turned-on organic light-emitting units 120 in each image frame may be increased without introducing any crosstalk. Accordingly, the time for completely reading the fingerprint information may be significantly reduced. For example, the number of the organic light-emitting units 120 emitting light at the same time in each image frame (11*10 organic light-emitting units) may be twelve, then at most 10 image frames (11*10/12=10) may have to be scanned to completely read the fingerprint information detected by the fingerprint recognition units 211 of all the organic light-emitting units 120. Thus, the time for completely reading the fingerprint information may be significantly reduced.

For any of the first light-emitting unit array 124 provided in any of the disclosed embodiments, the distance J of any two adjacent organic light-emitting units 120 in the first light-emitting unit array 124 may be configured to be greater than or equal to the minimum crosstalk distance L. Thus, on one hand, in the display panel, the fingerprint recognition unit 211, which is corresponding to any one of the plurality of turned-on organic light-emitting units 120 in the first light-emitting unit array 124, may not receive any interference signals from other turned-on organic light-emitting units 120. Accordingly, the accuracy the fingerprint recognition may be improved. On the other hand, the number of the turned-on organic light-emitting units 120 in each image frame may be increased and, thus, the time for completely reading the fingerprint information may be significantly reduced, and the reading efficiency of the fingerprint information may be improved.

For any of the first light-emitting unit array 124 provided in any of the disclosed embodiments, in one embodiment, as shown in FIG. 35b, a vertical distance between any two adjacent organic light-emitting units 120 may be configured to satisfy at least one of the following conditions: (1) a vertical distance C1 between any two adjacent organic light-emitting units 120 which are not disposed in the same row may be configured to be greater than or equal to the minimum crosstalk distance L; and (2) a vertical distance C2 between any two adjacent organic light-emitting units 120 which are not disposed in the same column may be configured to be greater than or equal to the minimum crosstalk distance L.

Through configuring the first light-emitting unit array 124, on one hand, in the display panel, the fingerprint recognition unit 211, which is corresponding to any one of the plurality of turned-on organic light-emitting units 120 in the first light-emitting unit array 124, may not receive any interference signals from other turned-on organic light-emitting units 120. Accordingly, the accuracy the fingerprint recognition may be improved. On the other hand, the number of the turned-on organic light-emitting units 120 in each image frame may be increased and, thus, the time for completely reading the fingerprint information may be significantly reduced, and the reading efficiency of the fingerprint information may be improved.

The fingerprint reading efficiency of the display panel is further explained by taking a square array scanning method and a hexagonal array scanning method as an example.

The distance between the two adjacent turned-on organic light-emitting units 120 is configured to be greater than or equal to the distance between at least 20 organic light-emitting units 120 (the distance between the centers of two organic light-emitting units 120), and the distance between 20 organic light-emitting units 120 is defined as 20P.

Figure 36A:
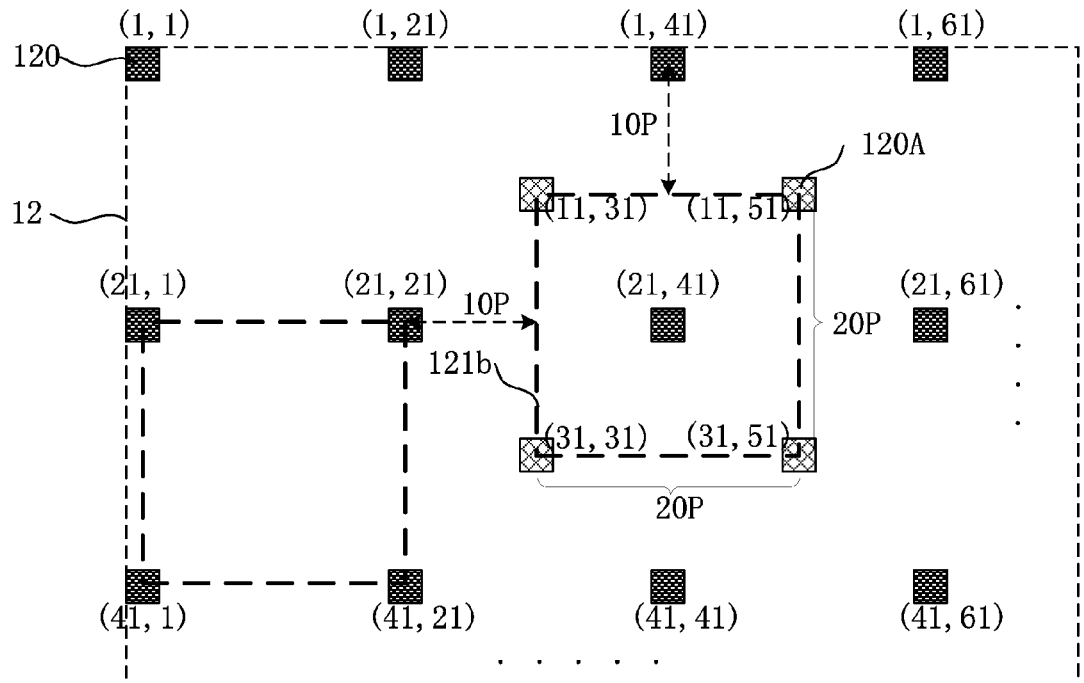
FIG. 36a illustrates an exemplary square array scanning method of an exemplary display panel consistent with disclosed embodiments.

FIG. 36a illustrates an exemplary square array scanning method of an exemplary display panel consistent with disclosed embodiments. As shown in FIG. 36a, the coordinates of the tuned-on organic light-emitting unit is defined as (row, column), and the coordinates of the first organic light-emitting unit 120 in the upper left corner in FIG. 36a is defined as (1,1). Then the coordinates of the turned-on organic light-emitting units 120 in the first row are respectively (1,1), (1,21), (1,41), . . . , and the coordinates of the turned-on organic light-emitting units 120 in the second row are respectively (21,1), (21,21), (21,41), . . . , and the coordinates of the turned-on organic light-emitting units 120 in the third row are respectively (41,1), (41,21), (41,41), . . . , and so on. That is, (1,1), (1,21), (1,41), . . . , (21,1), (21,21), (21,41), . . . , and (41, 1), (41, 21) (41,41), . . . , and so on, are the coordinates of all the organic light-emitting units 120 which are simultaneously turned-on in one image frame.

Provided that each of the turned-on organic light-emitting units 120 is a center point, the organic light-emitting layer 12 of the display panel may be vertically and horizontally divided into a plurality of identical bright regions 121B each having a same size. Each bright region 121B may include a turned-on organic light-emitting unit 120 and a plurality of turned-off organic light-emitting units 120A surrounding the turned-on organic light-emitting unit 120. It should be noted that, the turned-on organic light-emitting unit 120, which is disposed at the edge of the organic light-emitting layer 12, may correspond to a region of the organic light-emitting layer 12 which is only a part of the bright region corresponding to the turned-on organic light-emitting unit 120.

For example, the turned-on organic light-emitting unit 120 (21,41) may correspond to a bright region 121B including four turned-off organic light-emitting units 120A, and the coordinates of the four turned-off organic light-emitting units 120A are (11,31), (11, 51), (31,31) and (31,51), respectively. The bright region 121B may have a length of 20P and a width of 20P, i.e., the number of the organic light-emitting units forming the bright spot region 121B may be 20*20=400. However, the bright region 121B may only have one turned-on organic light-emitting unit 120 (21,41), i.e., every 400 organic light-emitting units 120 may only have one turned-on organic light-emitting unit 120. Thus, the density of the turned-on organic light-emitting unit 120 in the bright region 121B may be 1/400.

Because the organic light-emitting layer 12 of the display panel is divided into a plurality of identical bright regions 121B, the density of the turned-on organic light-emitting unit 120 in each image frame may be 1/400. Thus, to sequentially turn on all the organic light-emitting units 120 in the display panel, 400 (20*20) image frames may have to be scanned. FIG. 36a only shows some of the organic light-emitting units 120 which are simultaneously turned on and their coordinates, and four turned-off organic light-emitting units 120A in the bright region 121B and their coordinates.

Figure 36B:
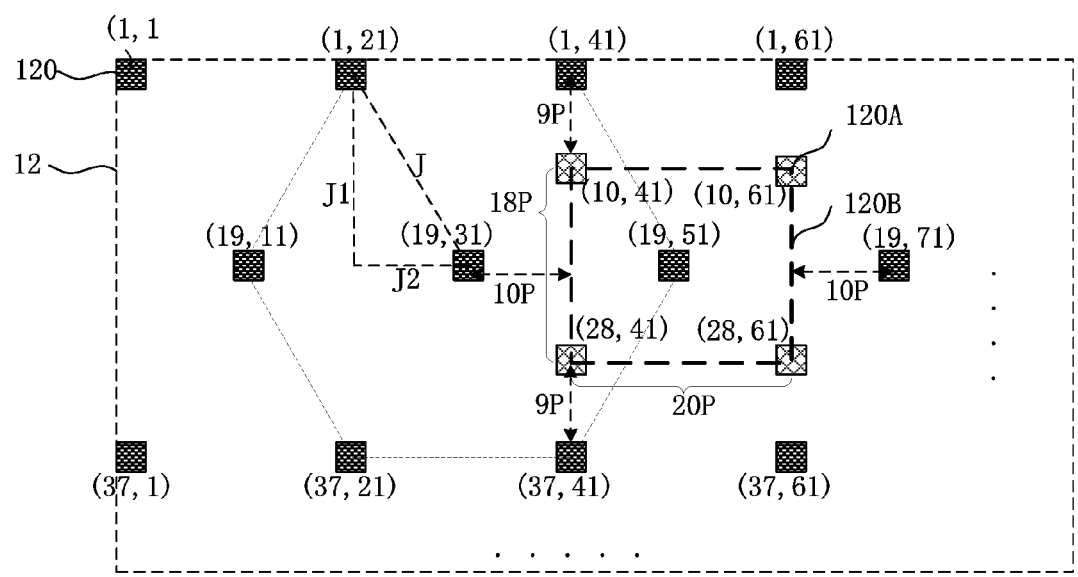
FIG. 36b illustrates an exemplary hexagonal array scanning method of an exemplary display panel consistent with disclosed embodiments.

FIG. 36b illustrates a schematic view of a hexagonal array scanning method of an exemplary display panel consistent with disclosed embodiments. The similarities between FIG. 36a and FIG. 36b are not repeated here, while certain difference may be explained.

As shown in FIG. 36b, the coordinates of the tuned-on organic light-emitting unit is defined as (row, column), and the coordinates of the first organic light-emitting unit 120 in the upper left corner in FIG. 36b is defined as (1,1). The distance J between any two adjacent turned-on organic light-emitting units 120 is configured to be the distance between 20 organic light-emitting units 120 (i.e., 20P). The distance J1 from a row including the central organic light-emitting unit 120 to the edge organic light-emitting unit 120 disposed in a row different from the central organic light-emitting unit 120 is $10P\sqrt{3}\approx 18P$. The distance J2 from a column including the central organic light-emitting unit 120 to the edge organic light-emitting unit 120 disposed in a row different from the central organic light-emitting unit 120 is 10P.

Then the coordinates of the turned-on organic light-emitting units 120 in the first row are respectively (1,1), (1,21), (1,41), . . . , and the coordinates of the turned-on organic light-emitting units 120 in the second row are respectively (19,11), (19,31), (19,51), . . . , and the coordinates of the turned-on organic light-emitting units 120 in the third row are respectively (37,1), (37,21), (37,41), . . . , and so on. That is, (1,1), (1,21), (1,41), . . . , (19,11), (19,31), (19,51), . . . , and (37,1), (37,21) (37,41), . . . , and so on, are the coordinates of all the organic light-emitting units 120 which are simultaneously turned-on in one image frame.

When some organic light-emitting units 120 are turned on and the distance between two adjacent turned-on organic light-emitting units 120 in the same row is 20P, the row spacing of the turned-on organic light-emitting units 120 disposed in different rows may be reduced from 20P to 18P. Thus, the distance from the central organic light-emitting unit 120 to the edge organic light-emitting unit 120 disposed in a row different from the central organic light-emitting unit 120 may be $\sqrt{(10P)^2+(18P)^2}\approx 20.59P>20P$, meeting the requirements to avoid a crosstalk.

Provided that each of the turned-on organic light-emitting units 120 is a center point, the organic light-emitting layer 12 of the display panel may be vertically and horizontally divided into a plurality of identical bright regions 121B each having a same size. Each bright region 121B may include a turned-on organic light-emitting unit 120 and a plurality of turned-off organic light-emitting units 120A surrounding the turned-on organic light-emitting unit 120. It should be noted that, the turned-on organic light-emitting unit 120, which is disposed at the edge of the organic light-emitting layer 12, may correspond to a region of the organic light-emitting layer 12 which is only a part of the bright region corresponding to the turned-on organic light-emitting unit 120.

For example, the turned-on organic light-emitting unit 120 (19,51) may correspond to a bright region 121B including four turned-off organic light-emitting units 120A, and the coordinates of the four turned-off organic light-emitting units 120A are (10,41), (10,61), (28,41) and (28,61), respectively. The bright region 121B may have a length of 20P in the row direction and a width of 18P in the column direction, i.e., the number of the organic light-emitting units forming the bright spot region 121B may be 20*18=360. However, the bright region 121B may only have one turned-on organic light-emitting unit 120 (19,51), i.e., every 360 organic light-emitting units 120 may only have one turned-on organic light-emitting unit 120. Thus, the density of the turned-on organic light-emitting unit 120 in the bright region 121B may be 1/360.

Because the organic light-emitting layer 12 of the display panel are divided into a plurality of identical bright regions 121B, the density of the turned-on organic light-emitting unit 120 in each image frame may be 1/360. Thus, to sequentially turn on all the organic light-emitting units 120 in the display panel, 360 (20*18) image frames may have to be scanned. FIG. 36b only shows some of the organic light-emitting units 120 which are simultaneously turned on and their coordinates, and four turned-off organic light-emitting units 120A in the bright region 121B and their coordinates.

According to the above discussion of the scanning methods shown in FIGS. 36a-36b, the hexagonal array scanning method of the display panel FIG. 36b may outperform the square array scanning method of the display panel FIG. 36a, in terms of the number of the image frames to be scanned for sequentially turning on all the organic light-emitting units 120 in the display panel.

Further, the present disclosure also provides a fingerprint recognition method for exemplary display panels shown in FIGS. 28a to 28d and FIGS. 30 to 35c. As shown in FIGS. 28a to 28d and FIGS. 30 to 35c, the display panel may comprise a display module 1 and a fingerprint recognition module 2. The display module 1 may comprise a first substrate 10, an organic light-emitting layer 12 disposed on the first substrate 10, and a cover glass 14. The organic light-emitting layer 12 may have an inner side far away from the first substrate 10 and an opposite outer side facing the first substrate 10. The cover glass 14 may be disposed on the inner side of the organic light-emitting layer 12.

The organic light-emitting layer 12 may include a plurality of organic light-emitting units 120. The fingerprint recognition module 2 may include a fingerprint recognition layer 21. The cover glass 14 may have a first surface far away from the first substrate 10 and an opposite second surface facing the first substrate 10. The light-exiting surface of the display panel may be defined as the first surface of the cover glass 14.

Figure 37:
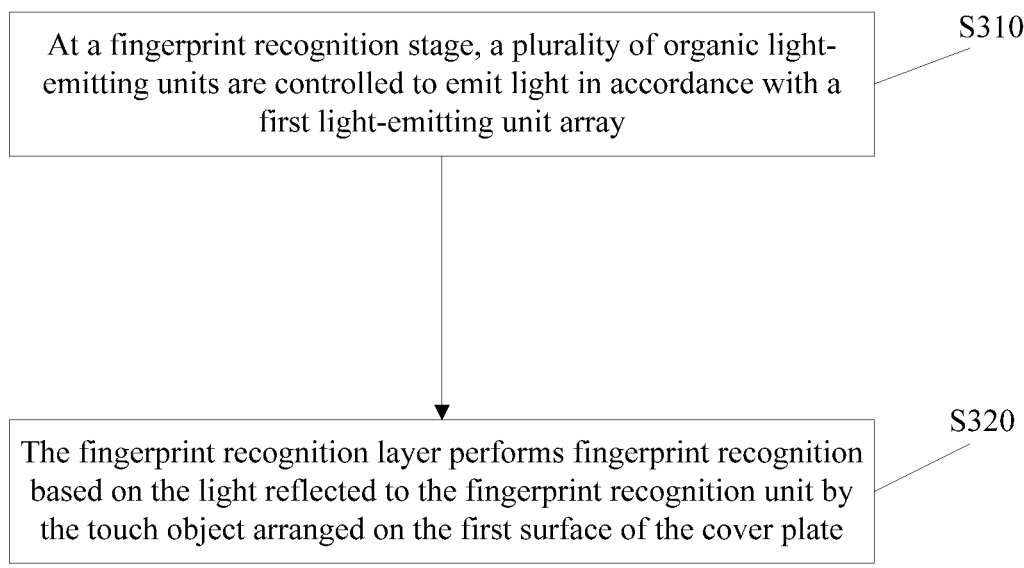
FIG. 37 illustrates a flowchart of an exemplary display panel fingerprint recognition method consistent with disclosed embodiments.

FIG. 37 illustrates a flowchart of an exemplary display panel fingerprint recognition method consistent with disclosed embodiments. As shown in FIG. 37, the fingerprint recognition method for the display panel may comprise the following steps.

At the fingerprint recognition stage, a plurality of organic light-emitting units are controlled to emit light in accordance with a first light-emitting unit array (S310). The distance of any two adjacent organic light-emitting units in the first light-emitting unit array may be greater than or equal to the minimum crosstalk distance. The minimum crosstalk distance is the maximum radius of a coverage region at the fingerprint recognition layer, in which the coverage region is formed by the light emitted from any one of the plurality of organic light-emitting units and then reflected to the fingerprint recognition layer by the first surface of the cover plate.

The fingerprint recognition layer performs fingerprint recognition based on the light reflected to the fingerprint recognition unit by the touch object, which is arranged on the first surface of the cover plate (S320). In the disclosed embodiment, the touch object may be selected as a user finger.

In the disclosed embodiments, the display panel may perform the fingerprint recognition by an image scanning method, and in each image frame, each organic light-emitting unit may emit light in accordance with the first light-emitting unit array. In particular, the distance of any adjacent organic light-emitting units in the first light-emitting unit array may be configured to be greater than or equal to the minimum crosstalk distance, Thus, in a plurality of turned-on organic light-emitting units in the first light-emitting unit array, the fingerprint signal light emitted from any one of the plurality of turned-on organic light-emitting units may be prevented from being incident onto the fingerprint recognition unit corresponding to other turned-on organic light-emitting units.

That is, the fingerprint recognition unit, which is corresponding to any one of the plurality of turned-on organic light-emitting units in the first light-emitting unit array, may only receive the fingerprint signal light emitted from the corresponding turned-on organic light-emitting unit, i.e., may not receive any interference signals from other turned-on organic light-emitting units 120. Accordingly, the induction signal generated by the fingerprint recognition unit may accurately indicate the light reflection of the outgoing light of the corresponding organic light-emitting unit at the fingerprint of the user finger. Thus, the accuracy of the fingerprint recognition may be improved.

Figure 38:
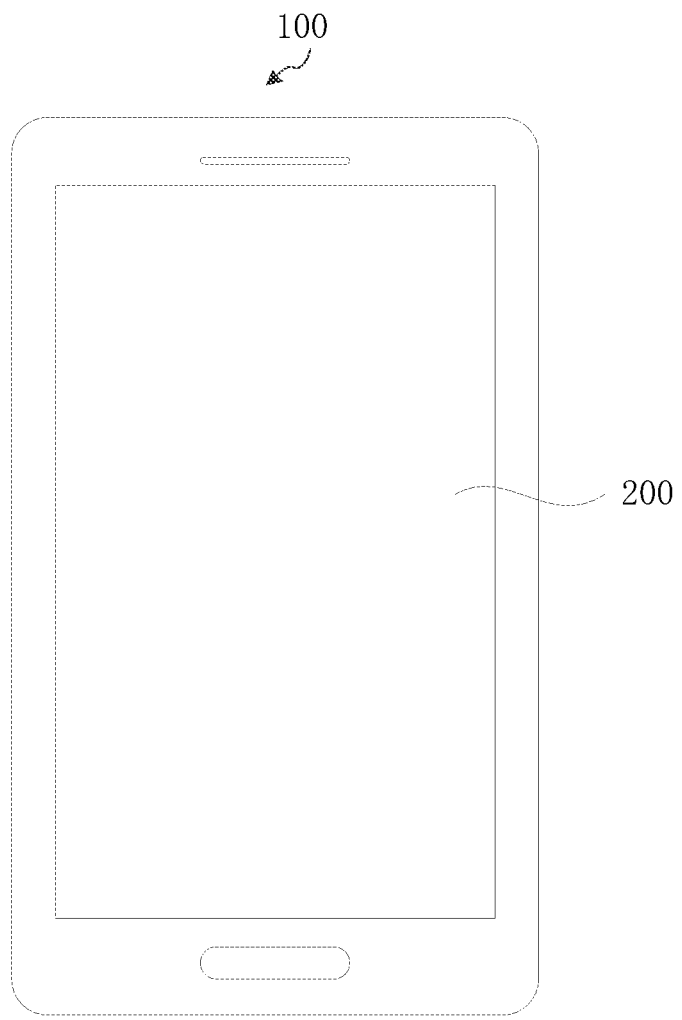
FIG. 38 illustrates an exemplary display device consistent with disclosed embodiments.

The present disclosure also provides a display device comprising any one of the disclosed display panels. FIG. 38 illustrates an exemplary display device consistent with disclosed embodiments. As shown in FIG. 38, the display device may comprise a display panel 200, which may include any one of the disclosed display panels. The display device 100 may be a mobile phone, a computer, a television, and a smart wearable display device, which is not limited by the present disclosure.

In the disclosed embodiments, the light-exiting surface of the display module is disposed on the outer side of the first polarizer, the fingerprint recognition module is disposed on the outer side of the first substrate. The fingerprint recognition module comprises the fingerprint recognition layer and the second polarizer disposed on the inner side of the fingerprint recognition layer. At the fingerprint recognition stage, the light emitted from the inner side of the first polarizer is reflected by the touch object (such as a user finger) to form the fingerprint signa light, during which the first polarizer is engaged with the second polarizer, such that the fingerprint signal light may be transmitted through the first polarizer and the second polarizer without a light intensity loss.

Meanwhile, before the light (i.e., the fingerprint noise light) which is not reflected by the touch object is incident onto the fingerprint recognition layer, the second polarizer at least reduces the light intensity of the fingerprint noise light. Thus, the crosstalk caused by the fingerprint noise may be suppressed, the signal-to-noise ratio may be improved, and the accuracy of the fingerprint recognition module may be improved.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:
1. A display panel, comprising:
a display module comprising a first substrate and a first polarizer disposed on the first substrate, wherein the first substrate has an inner side facing the first polarizer and an opposite outer side, the first polarizer has an inner side facing the first substrate and an opposite outer side, and a light-exiting surface of the display module is arranged on the outer side of the first polarizer;
a fingerprint recognition module disposed on the outer side of the first substrate and comprising a fingerprint recognition layer and a second polarizer, wherein the fingerprint recognition layer has an inner side facing the display module and an opposite outer side, and the second polarizer is disposed on the inner side of the fingerprint recognition layer; and
a light source disposed on the inner side of the first polarizer,
wherein the fingerprint recognition layer is configured to recognize fingerprint based on fingerprint signal light, the fingerprint signal light being light emitted from the light source and then reflected to the fingerprint recognition layer by a touch object,
the first polarizer is engaged with the second polarizer, such that the fingerprint signal light is transmitted through the first polarizer and the second polarizer without a light intensity loss, and
the second polarizer is configured to reduce the light intensity of fingerprint noise light, the fingerprint noise light being light other than the fingerprint signal light.
2. The display panel according to claim 1, wherein:
the display module further comprises an organic light-emitting layer disposed between the first substrate and the first polarizer,
wherein the organic light-emitting layer is configured to generate light for displaying an image.

3. The display panel according to claim 2, wherein:
the organic light-emitting layer comprises a plurality of organic light-emitting units; and
the fingerprint recognition layer comprises a plurality of fingerprint recognition units.

4. The display panel according to claim 3, wherein:
the organic light-emitting layer is multiplexed as the light source.

5. The display panel according to claim 4, wherein:
the display module further comprises a first display driving circuit,
wherein the first display driving circuit is configured to, at a fingerprint recognition stage, output a driving signal for driving at least one of the plurality of organic light-emitting units to emit light.

6. The display panel according to claim 4, wherein:
the first polarizer comprises a first linear polarizer having a first polarization direction; and
the second polarizer comprises a second linear polarizer having a second polarization direction,
wherein the first polarization direction and the second polarization direction are the same.

7. The display panel according to claim 3, further including:
a backlight source,
wherein the fingerprint recognition module has an inner side facing the display module and an opposite outer side, and
the backlight source is disposed on the outer side of the fingerprint recognition module, and configured as the light source.

8. The display panel according to claim 7, wherein:
the display panel further comprises a second display driving circuit,
wherein the second display driving circuit is configured to not output a display driving signal for driving the organic light-emitting layer to emit light at a fingerprint recognition stage, and not output a detection driving signal for driving the backlight source to emit light at a display stage.

9. The display panel according to claim 7, wherein:
the fingerprint recognition module further comprises a second substrate having an inner side facing the display module and an opposite outer side;
the fingerprint recognition layer is disposed on the inner side of the second substrate; and
the backlight source is disposed on the outer side of the second substrate.

10. The display panel according to claim 4, wherein:
the first polarizer comprises a first quarter-wave plate and a third linear polarizer stacked together, wherein the third linear polarizer has an inner side facing the organic light-emitting layer and an opposite outer side, and the first quarter-wave plate is disposed on the inner side of the third linear polarizer; and
the second polarizer comprises a second quarter-wave plate and a fourth linear polarizer stacked together, wherein the fourth linear polarizer has an inner side facing the organic light-emitting layer and an opposite outer side, and the second quarter-wave plate is disposed on the inner side of the fourth linear polarizer,
wherein:
the first quarter-wave plate and the second quarter-wave plate have the same material and the same thickness, and
when facing a propagation direction of the fingerprint signal light, counterclockwise is defined as the positive direction, an angle from an optical axis of the first quarter-wave plate to a polarization direction of the third linear polarizer is configured to be approximately 45°, and an angle from an optical axis of the second quarter-wave plate to a polarization direction of the fourth linear polarizer is configured to be approximately −45°, or
an angle from the optical axis of the first quarter-wave plate to a polarization direction of the third linear polarizer is configured to be approximately −45°, and an angle from an optical axis of the second quarter-wave plate to a polarization direction of the fourth linear polarizer is configured to be approximately 45°.

11. The display panel according to claim 7, wherein:
the first polarizer comprises a first quarter-wave plate and a third linear polarizer stacked together, wherein the third linear polarizer has an inner side facing the organic light-emitting layer and an opposite outer side, and the first quarter-wave plate is disposed on the inner side of the third linear polarizer; and
the second polarizer comprises a second quarter-wave plate and a fourth linear polarizer stacked together, wherein the fourth linear polarizer has an inner side facing the organic light-emitting layer and an opposite outer side, and the second quarter-wave plate is disposed on the inner side of the fourth linear polarizer,
wherein:
the first quarter-wave plate and the second quarter-wave plate have the same material and the same thickness, and
when facing a propagation direction of the fingerprint signal light, counterclockwise is defined as the positive direction, an angle from an optical axis of the first quarter-wave plate to a polarization direction of the third linear polarizer is configured to be approximately 45°, and an angle from an optical axis of the second quarter-wave plate to a polarization direction of the fourth linear polarizer is configured to be approximately −45°, or
an angle from the optical axis of the first quarter-wave plate to a polarization direction of the third linear polarizer is configured to be approximately −45°, and an angle from an optical axis of the second quarter-wave plate to a polarization direction of the fourth linear polarizer is configured to be approximately 45°.

12. The display panel according to claim 3, wherein:
the display panel comprises a display region; and
the plurality of organic light-emitting units and the plurality of fingerprint recognition units are disposed at the display region of the display panel.

13. The display panel according to claim 3, wherein:
a fingerprint recognition unit comprises a fingerprint recognition sensor.

14. The display panel according to claim 13, wherein the fingerprint recognition sensor comprises:
a photodiode configured to convert the fingerprint signal light into a current signal;
a storage capacitor; and
a thin-film-transistor (TFT) configured to be turned on at a fingerprint recognition stage, and the current signal is transmitted to a signal detection line by the TFT, and the fingerprint is recognized according to the current signal,
wherein the photodiode has a positive electrode electrically connected to a first electrode of the storage capacitor, and a negative electrode electrically connected to a second electrode of the storage capacitor and a source electrode of the TFT, and the TFT has a gate electrode electrically connected to a switch control line, and a drain electrode be electrically connected to the signal detection line.

15. The display panel according to claim 2, wherein:

the first substrate is a first glass substrate, and the display module further comprises a second glass substrate, wherein the organic light-emitting layer is disposed between the first glass substrate and the second glass substrate.

16. The display panel according to claim 12, wherein:

the first substrate is a first glass substrate, and the display module further comprises a second glass substrate, wherein the organic light-emitting layer is disposed between the first glass substrate and the second glass substrate.

17. The display panel according to claim 2, wherein:

the first substrate is a flexible substrate, and the display module further comprises a thin film encapsulation layer covering the organic light-emitting layer.

18. The display panel according to claim 12, wherein:

the first substrate is a flexible substrate, and the display module further comprises a thin film encapsulation layer covering the organic light-emitting layer.

19. The display panel according to claim 1, wherein:

the second polarizer is attached to the first substrate by a liquid optical clear adhesive (LOCA).

20. A display device, comprising:

a display panel, comprising:

a display module comprising a first substrate and a first polarizer disposed on the first substrate, wherein the first substrate has an inner side facing the first polarizer and an opposite outer side, the first polarizer has an inner side facing the first substrate and an opposite outer side, and a light-exiting surface of the display module is arranged on the outer side of the first polarizer;

a fingerprint recognition module disposed on the outer side of the first substrate and comprising a fingerprint recognition layer and a second polarizer, wherein the fingerprint recognition layer has an inner side facing the display module and an opposite outer side, and the second polarizer is disposed on the inner side of the fingerprint recognition layer; and a light source disposed on the inner side of the first polarizer, wherein the fingerprint recognition layer is configured to recognize fingerprint based on fingerprint signal light, the fingerprint signal light being light emitted from the light source and then reflected to the fingerprint recognition layer by a touch object, the first polarizer is engaged with the second polarizer, such that the fingerprint signal light is transmitted through the first polarizer and the second polarizer without a light intensity loss, and the second polarizer is configured to reduce the light intensity of fingerprint noise light, the fingerprint noise light being light other than the fingerprint signal light.

* * * * *